US012231090B2

(12) United States Patent
Chen et al.

(10) Patent No.: US 12,231,090 B2
(45) Date of Patent: Feb. 18, 2025

(54) RECONFIGURABLE ASYMMETRICAL LOAD-MODULATED BALANCED AMPLIFIERS

(71) Applicant: University of Central Florida Research Foundation, Inc., Orlando, FL (US)

(72) Inventors: Kenle Chen, Oviedo, FL (US); Yuchen Cao, Orlando, FL (US); Haifeng Lyu, Orlando, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 581 days.

(21) Appl. No.: 17/545,164

(22) Filed: Dec. 8, 2021

(65) Prior Publication Data

US 2022/0255506 A1 Aug. 11, 2022

Related U.S. Application Data

(60) Provisional application No. 63/146,869, filed on Feb. 8, 2021.

(51) Int. Cl.
*H03F 1/02* (2006.01)
*H03F 1/42* (2006.01)
*H03F 3/24* (2006.01)

(52) U.S. Cl.
CPC ............ *H03F 1/0288* (2013.01); *H03F 1/42* (2013.01); *H03F 3/245* (2013.01); *H03F 2200/451* (2013.01)

(58) Field of Classification Search
CPC .......... H03F 1/0288; H03F 1/42; H03F 3/245; H03F 2200/451
See application file for complete search history.

(56) References Cited

U.S. PATENT DOCUMENTS 10,404,224 B2 9/2019 Barton et al.
2012/0294387 A1* 11/2012 Ghannouchi ......... H03F 1/0288 375/295
2015/0097623 A1* 4/2015 Staudinger .............. H03F 3/245 330/295
2018/0254748 A1* 9/2018 Grebennikov ............ H03F 3/24
2020/0112287 A1* 4/2020 Pham ...................... H03F 3/195
2021/0218375 A1* 7/2021 Sharma ................... H03F 3/195
(Continued)

OTHER PUBLICATIONS

Afaqui, M.S, et al., "IEEE 802.11ax: Challenges and requirements for future high efficiency Wi-Fi," IEEE Wireless Commun., vol. 24, No. 3, pp. 130-137, Jun. 2017.
(Continued)

*Primary Examiner* — Patricia T Nguyen
(74) *Attorney, Agent, or Firm* — Meunier Carlin & Curfman LLC

(57) ABSTRACT

Described herein is a reconfigurable asymmetrical load-modulated balanced amplifier. The reconfigurable asymmetrical load-modulated balanced amplifier can include a radio frequency (RF) input port, an RF output port, a peaking amplifier circuit operably coupled between the RF input and RF output ports, where the peaking amplifier circuit is a balanced amplifier that comprises a pair of asymmetrical power amplifiers, and a carrier amplifier circuit operably coupled to the RF input port.

20 Claims, 70 Drawing Sheets

(56) References Cited

U.S. PATENT DOCUMENTS

2022/0077825 A1* 3/2022 Ghannouchi ........... H03F 3/245
2022/0360230 A1* 11/2022 Marbell ............ H01L 23/49838

OTHER PUBLICATIONS

Andersson C.M., et al., "Theory and design of class-J power amplifiers with dynamic load modulation," IEEE Trans. Microw. Theory Techn., vol. 60, No. 12, pp. 3778-3786, Dec. 2012.
Banerjee, "High efficiency multi-mode outphasing RF power amplifier in 45nm CMOS," in Proc. ESSCIRC Conf. 41st Eur. Solid-State Circuits Conf. (ESSCIRC), Sep. 2015, pp. 168-171.
Barakat, A., et al., "Toward a more generalized Doherty power amplifier design for broadband operation," IEEE Trans. Microw. Theory Techn., vol. 65, No. 3, pp. 846-859, Mar. 2017.
Barthwal, A., et al., "A design strategy for bandwidth enhancement in three-stage Doherty power amplifier with extended dynamic range," IEEE Trans. Microw. Theory Techn., vol. 66, No. 2, pp. 1024-1033, Feb. 2018.
Barthwal, A., et al., "Wideband tri-stage Doherty power amplifier with asymmetric current ratios," in Proc. IEEE MTT-S Int. Microw. RF Conf. (IMaRC), Dec. 2016, pp. 1-4.
Beltran, R.A. "Broadband outphasing transmitter using Class-E power amplifiers," in IEEE MTT-S Int. Microw. Symp. Dig., Jun. 2019, pp. 67-70.
Camarchia, V., et al., "The Doherty power amplifier: Review of recent solutions and trends," IEEE Trans. Microw. Theory Techn., vol. 63, No. 2, pp. 559-571, Feb. 2015.
Cao, Y, et al., "Wideband Doherty power amplifier in quasi-balanced configuration," in Proc. IEEE 20th Wireless Microw. Technol. Conf. (WAMICON), Apr. 2019, pp. 1-4.
Cao, Y, et al., H. Lyu, and K. Chen, "Load modulated balanced amplifier with reconfigurable phase control for extended dynamic range," in IEEE MTTS Int. Microw. Symp. Dig., Jun. 2019, pp. 1335-1338.
Cao, Yuchen, and Kenle Chen. " Dual-Octave-Bandwidth RF-Input Pseudo-Doherty Load Modulated Balanced Amplifier with ≥10-dB Power Back-off Range." 2020 IEEE/MTT-S International Microwave Symposium (IMS). IEEE, 2020, 703-706.
Cao, Yuchen, and Kenle Chen. "Pseudo-Doherty load-modulated balanced amplifier with wide bandwidth and extended power back-off range." IEEE Transactions on Microwave Theory and Techniques 68.7 (2020): 3172-3183.
Cao, Yuchen, and Kenle Chen. Hybrid Asymmetrical Load Modulated Balanced Amplifier with Wide Bandwidth and Three-Way-Doherty Efficiency Enhancement. IEEE Microwave and Wireless Components Letters, Jun. 2021, 721-724.
Cao, Yuchen, and Lyu H., "Asymmetrical Load Modulated Balanced Amplifier With Continuum of Modulation Ratio and Dual-Octave Bandwidth." IEEE Transactions on Microwave Theory and Techniques. 69(1), 2021, 682-696.
Cao, Yuchen, and Lyu H., "Continuous-Mode Hybrid Asymmetrical Load-Modulated Balanced Amplifier with Three-Way Modulation and Multi-Band Reconfigurability", IEEE Trans. Circuits and Systems I: Regular Papers, Nov. 30, 2021, 13 pages.
Cappello, T., et al., "Supply- and load-modulated balanced amplifier for efficient broadband 5G base stations," IEEE Trans. Microw. Theory Techn., vol. 67, No. 7, pp. 3122-3133, Jul. 2019.
Cappello, T., et al., "Supply modulation of a broadband load modulated balanced amplifier," in IEEE MTT-S Int. Microw. Symp. Dig., Jun. 2018, pp. 304-307.
Chen, k., et al., "Design of adaptive highly efficient GaN power amplifier for octave-bandwidth application and dynamic load modulation," IEEE Trans. Microw. Theory Techn., vol. 60, No. 6, pp. 1829-1839, Jun. 2012.
Chen, K., et al., "Design of broadband highly efficient harmonic-tuned power amplifier using in-band continuous class-F—1/F mode transferring," IEEE Trans. Microw. Theory Techn., vol. 60, No. 12, pp. 4107-4116, Dec. 2012.
Chen, K., et al., "Design of highly efficient broadband class-E power amplifier using synthesized low-pass matching networks," IEEE Trans. Microw. Theory Techn., vol. 59, No. 12, pp. 3162-3173, Dec. 2011.
Chen, S. et la., "A reactance compensated three-device Doherty power amplifier for bandwidth and back-off range extension," Wireless Commun. Mobile Comput., vol. 2018, pp. 1-10, May 2018.
Chung, S., et al., "Asymmetric multilevel outphasing transmitter using class-E PAs with discrete pulse width modulation," in IEEE MTT-S Int. Microw. Symp. Dig., May 2010, pp. 264-267.
Collins, D., et al., Experimental characterization of a load modulated balanced amplifier with simplified input power splitter, in Proc. Asia-Pacific Microw. Conf. (APMC), Nov. 2018, pp. 461-463.
Darraji, R., et al., "Generalized theory and design methodology of wideband Doherty amplifiers applied to the realization of an octavebandwidth prototype," IEEE Trans. Microw. Theory Techn., vol. 65, No. 8, pp. 3014-3023, Aug. 2017.
Doherty, W.H., "A new high efficiency power amplifier for modulated waves," Proc. IRE, vol. 24, No. 9, pp. 1163-1182, Sep. 1936.
Hur J. et al., "A multilevel Class-D CMOS power amplifier for an outphasing transmitter with a nonisolated power combiner," IEEE Trans. Circuits Syst. II, Exp. Briefs, vol. 63, No. 7, pp. 618-622, Jul. 2016.
Innovative Power Products, NY, USA. 90 Degree Hybrid Couplers. Accessed: Sep. 15, 2019. [Online]. Available: https://innovativepp.com/product/ipp-7109/.
Jang, H, et al., "Asymmetric Doherty power amplifier designed using model-based nonlinear embedding," IEEE Trans. Microw. Theory Techn., vol. 62, No. 12, pp. 3436-3451, Dec. 2014.
Jeon H., et al., "A triple-mode balanced linear CMOS power amplifier using a switched-quadrature coupler," IEEE J. Solid-State Circuits, vol. 47, No. 9, pp. 2019-2032, Sep. 2012.
Kim, J., et al., B "Power efficiency and linearity enhancement using optimized asymmetrical Doherty power amplifiers," IEEE Trans. Microw. Theory Techn., vol. 59, No. 2, pp. 425-434, Feb. 2011.
Liu, B., et al., "A fully integrated class-J GaN MMIC power amplifier for 5-GHz WLAN 802.11ax application," IEEE Microw. Wireless Compon. Lett., vol. 28, No. 5, pp. 434-436, May 2018.
Lyu, H., et al., "Hybrid Load-Modulated Balanced Amplifier With High Linearity and Extended Dynamic Range", IEEE Microwave and Wireless Components Letters, vol. 31, No. 9, Sep. 2021, 1067-1070.
Merrick, B., et al., "A wideband sequential power amplifier," in IEEE MTT-S Int. Microw. Symp. Dig., Jun. 2014, pp. 1-3.
Muraguchi, M., et al., "Optimum design of 3-Db branch-line couplers using microstrip lines," IEEE Trans. Microw. Theory Techn., vol. MTT-31, No. 8, pp. 674-678, Aug. 1983.
Nemati, H. M., et al., "Design of highly efficient load modulation transmitter for wideband cellular applications," IEEE Trans. Microw. Theory Techn., vol. 58, No. 11, pp. 2820-2828, Nov. 2010.
Nemati, H. M., et al., "Design of varactor-based tunable matching networks for dynamic load modulation of high power amplifiers," IEEE Trans. Microw. Theory Techn., vol. 57, No. 5, pp. 1110-1118, May 2009.
Nghiem, X. A., et al., "Broadband sequential power amplifier with Doherty-type active load modulation," IEEE Trans. Microw. Theory Techn., vol. 63, No. 9, pp. 2821-2832, Sep. 2015.
Niclas, K.B., et al., "Application of the two-way balanced amplifier concept to wide-band power amplification using GaAs MESFET's," IEEE Trans. Microw. Theory Techn., vol. 28, No. 3, pp. 172-179, Mar. 1980.
Oh H., et al., "Doherty power amplifier based on the fundamental current ratio for asymmetric cells," IEEE Trans. Microw. Theory Techn., vol. 65, No. 11, pp. 4190-4197, Nov. 2017.
Pang, J., et al., "Analysis and Design of Highly Efficient Wideband RF-Input Sequential Load Modulated Balanced Power Amplifier", IEEE Transactions on Microwave Theory and Techniques, vol. 68, No. 5, May 2020, 1741-1753.
Pang, J., et al., "Broadband RF-Input Continuous-Mode Load-Modulated Balanced Power Amplifier with Input Phase Adjustment", IEEE Transactions on Microwave Theory and Techniques, vol. 68, No. 10, Oct. 2020, 4466-4478.

(56) References Cited

OTHER PUBLICATIONS

Pednekar, P.H, et al., "Analysis and design of a Doherty-like RF-input load modulated balanced amplifier," IEEE Trans. Microw. Theory Techn., vol. 66, No. 12, pp. 5322-5335, Dec. 2018.
Pednekar, P.H., et al., "RF-input load modulated balanced amplifier," in IEEE MTT-S Int. Microw. Symp., Jun. 2017, pp. 1730-1733.
Pednekar, P.H., et al., "RF-input load modulated balanced amplifier with octave bandwidth," IEEE Trans. Microw. Theory Techn., vol. 65, No. 12, pp. 5181-5191, Dec. 2017.
Quaglia R., et al., "A load modulated balanced amplifier for telecom applications," IEEE Trans. Microw. Theory Techn., vol. 66, No. 3, pp. 1328-1338, Mar. 2018.
Rubio, M. J. et al., "Design of an 87% fractional bandwidth Doherty power amplifier supported by a simplified bandwidth estimation method," IEEE Trans. Microw. Theory Techn., vol. 66, No. 3, pp. 1319-1327, Mar. 2018.
Saad, P., et al "Design of a highly efficient 2-4-GHz octave bandwidth GaN-HEMT power amplifier," IEEE Trans. Microw. Theory Techn., vol. 58, No. 7, pp. 1677-1685, Jul. 2010.
Saad, P., et al., "A 1.8-3.8-GHz power amplifier with 40% efficiency at 8-dB power back-off," IEEE Trans. Microw. Theory Techn., vol. 66, No. 11, pp. 4870-4882, Nov. 2018.
Saad, P., et al., "The continuum of load modulation ratio from Doherty to traveling-wave amplifiers," IEEE Trans. Microw. Theory Techn., vol. 67, No. 12, pp. 5101-5113, Dec. 2019.
Sanchez-Perez, C., et al., "Optimized design of a dual-band power amplifier with SiC varactor-based dynamic load modulation," IEEE Trans. Microw. Theory Techn., vol. 63, No. 8, pp. 2579-2588, Aug. 2015.
Shepphard, D. J., et al., "An efficient broadband reconfigurable power amplifier using active load modulation," IEEE Microw. Wireless Compon. Lett., vol. 26, No. 6, pp. 443-445, Jun. 2016.
Shepphard, D.J., et al., "A broadband reconfigurable load modulated balanced amplifier (LMBA)," in IEEE MTT-S Int. Microw. Symp. Dig., Jun. 2017, pp. 947-949.
Weitzel, C.E. "RF power amplifiers for wireless communications," in 24th Annu. Tech. Dig. Gallium Arsenide Integr. Circuit (GaAs IC) Symposiu, 2002, 4 pages.
Wu, R., et al., "High efficiency silicon-based envelope-tracking power amplifier design with envelope shaping for broadband wireless applications," IEEE J. Solid-State Circuits, vol. 48, No. 9, pp. 2030-2040, Sep. 2013.
Xia, J, et al., "High-efficiency GaN Doherty power amplifier for 100-MHz LTE-advanced application based on modified load modulation network," IEEE Trans. Microw. Theory Techn., vol. 61, No. 8, pp. 2911-2921, Aug. 2013.
Xia, J., et al., "Improved Doherty amplifier design with minimum phase delay in output matching network for wideband application," IEEE Microw. Wireless Compon. Lett., vol. 26, No. 11, pp. 915-917, Nov. 2016.
Xia, J., et al., "Improved threestage Doherty amplifier design with impedance compensation in load combiner for broadband applications," IEEE Trans. Microw. Theory Techn., vol. 67, No. 2, pp. 778-786, Feb. 2019.
Xu, Y., et al., "Three-Stage Load Modulated Power Amplifier With Efficiency Enhancement at Power Back-Off", IEEE Transactions on Microwave Theory and Techniques, vol. 69, No. 6, Jun. 2021, 3107-3119.

* cited by examiner

TABLE I

STATE-OF-THE-ART OF WIDEBAND LOAD-MODULATED PAS

| Ref. / Year | Architecture | Freq. (GHz) | FBW (%) | $P_{Max}$ (dBm) | DE @ $P_{Max}$ (%) | DE @ HBO (%) | DE @ LBO (%) |
|---|---|---|---|---|---|---|---|
| [18] 2018 | 3-Way DPA | 0.6-0.9 | 40 | 46.1-46.9 | 51.1-78 | 51.9-66.2@6 dB | 42-64@9.5 dB* |
| [39] 2018 | 3-Way DPA | 2.0-2.6 | 26 | 43.6-45.4 | 53-76 | 45-55@6 dB | 41-48@8 dB |
| [40] 2019 | 3-Way DPA | 1.6-2.6 | 48 | 45.5-46 | 53-66 | 52-66@6 dB | 50-53@9.5 dB |
| [19] 2016 | DPA | 1.6-2.2 | 31.6 | 46-47 | 60-71 | 50-55@6 dB* | 51-55@10 dB |
| [41] 2018 | DPA | 1.5-3.8 | 86.8 | 42.3-43.4 | 42-63 | 33-55@6 dB | 22-40@10 dB* |
| [17] 2019 | DEPA | 2.55-3.8 | 40 | 48.8-49.8 | 54-67 | 42-53@6 dB* | 47-60@8 dB |
| [42] 2017 | Dual-Input LMBA | 4.5-7.5 | 50 | 39 | 47-77* | 28-60@6 dB* | 40-72@10 dB*‡ |
| [43] 2018 | Dual-Input LMBA | 1.7-2.5 | 38 | 48-48.9 | 48-58* | 43-53@6 dB* | 33-45@10 dB*† |
| [22] 2017 | RF-Input LMBA | 0.7-0.85 | 19 | 42 | 57-70 | 34-48@6 dB | 30-35@10 dB*† |
| [27] 2017 | RF-Input LMBA | 1.8-3.8 | 71 | 44 | 46-70 | 33-59@6 dB | 20-25@10 dB*† |
| [20] 2020 | Dual-Mode DPA *¶ | 1.52-4.68 | 102 | 41.5 | 54-71 | 42-57@6 dB | 37-50@10 dB*† |
| [29] 2020 | PD-LMBA | 1.5-2.7 | 57 | 43 | 58-72 | 47-61@6 dB | 47-58@10 dB |
| This Work | PD-ALMBA | 0.55-2.2 | 120 | 41-43 | 49-82 | 40-60@6 dB | 39-64@10 dB |

* Graphically estimated, † PAE, ‡ with reduced $V_{DD}$, *¶ with reciprocal gate bias.

FIG. 30

TABLE I
STATE-OF-THE-ART OF WIDEBAND LOAD-MODULATED POWER AMPLIFIERS

| Ref. / Year | Architecture | Freq. (GHz) | FBW (%) | $P_{Max}$ (dBm) | DE @ $P_{Max}$ (%) | DE @ HBO (%) | DE @ LBO (%) |
|---|---|---|---|---|---|---|---|
| [4] 2018 | 3-Way DPA | 2.0-2.6 | 26 | 43.6-45.4 | 53-76 | 46-58@5 dB* | 41-48@8 dB |
| [5] 2019 | 3-Way DPA | 1.6-2.6 | 48 | 45.5-46 | 53-66 | 47-57@5 dB* | 50-53@9.5 dB |
| [35] 2018 | 3-Way DPA | 0.6-0.9 | 40 | 46.1-46.9 | 51.1-78 | 54-65@5 dB* | 42-64@9.5 dB* |
| [36] 2016 | DPA | 1.6-2.2 | 31.6 | 46-47 | 60-71 | - | 51-55@10 dB |
| [37] 2018 | DPA | 1.5-3.8 | 86.8 | 42.3-43.4 | 42-63 | 40-55@5 dB* | 22-40@10 dB* |
| [38] 2019 | DEPA | 2.55-3.8 | 40 | 48.8-49.8 | 54-67 | 38-46@5 dB* | 47-60@8 dB |
| [39] 2020 | DPA | 2.8-3.55 | 23.62 | 43-45 | 66-78 | 55-65@5 dB* | 50-60.6@10 dB |
| [40] 2020 | Dual-Mode DPA | 1.52-4.68 | 102 | 41.5 | 54-71 | 45-60@5 dB* | 37-50@10 dB*† |
| [14] 2017 | RF-Input LMBA | 0.7-0.85 | 19 | 42 | 57-70 | - | 30-35@10 dB*† |
| [34] 2017 | RF-Input LMBA | 1.8-3.8 | 71 | 44 | 46-70 | 30-51@5 dB* | 20-25@10 dB*† |
| [41] 2018 | Dual-Input LMBA | 1.7-2.5 | 38 | 48-48.9 | 48-58* | 38-46@5 dB* | 33-45@10 dB*† |
| [24] 2020 | PD-LMBA | 1.5-2.7 | 57 | 43 | 58-72 | 48-60@5 dB | 47-58@10 dB |
| [30] 2020 | CM-LMBA | 1.45-2.45 | 52 | 45.6-46.7 | 67.1-77.9 | 46-55@5 dB* | 37-43@10 dB |
| [19] 2021 | ALMBA | 0.55-2.2 | 120 | 41-43 | 49-82 | 44-60@5 dB | 39-64@10 dB |
| [20] 2021 | H-ALMBA | 0.55-2.2 | 120 | 42 | 55-82 | 51-69@5 dB | 40-61@10 dB |
| This Work | H-ALMBA | 1.7-3.0 | 55 | 42-43 | 63-81 | 51-62@5 dB | 50-66@10 dB |

Graphically estimated, † PAE.

FIG. 55

TABLE I
STATE-OF-THE-ART OF WIDEBAND LOAD-MODULATED POWER AMPLIFIERS

| Ref. / Year | Architecture | Freq. (GHz) | FBW (%) | $P_{Max}$ (dBm) | DE @ $P_{Max}$ (%) | DE @ HBO (%) | DE @ LBO (%) |
|---|---|---|---|---|---|---|---|
| [13] 2017 | RF-Input LMBA | 1.8-3.8 | 71 | 44 | 46-70 | 30-53@5 dB* | 20-25@10 dB*† |
| [14] 2018 | Dual-Input LMBA | 1.7-2.5 | 38 | 48-48.9 | 48-58* | 38-46@5 dB* | 33-45@10 dB*† |
| [15] 2019 | 3-Way DPA | 1.6-2.6 | 48 | 45.5-46 | 53-66 | 47-57@5 dB* | 50-53@9.5 dB |
| [16] 2019 | DEPA | 2.55-3.8 | 40 | 48.8-49.8 | 54-67 | 42.5-57.5@5 dB* | 47-60@8 dB |
| [17] 2020 | CM-LMBA | 1.45-2.45 | 52 | 45.6-46.7 | 67.1-77.9 | 46-55@5 dB* | 37-43@10 dB* |
| This Work | H-ALMBA | 0.55-2.2 | 120 | 41-43 | 55-82 | 51-69@5 dB | 40-61@10 dB |

FIG. 62

RECONFIGURABLE ASYMMETRICAL LOAD-MODULATED BALANCED AMPLIFIERS

CROSS-REFERENCE TO RELATED APPLICATIONS

This application claims the benefit of U.S. provisional patent application No. 63/146,869, filed on Feb. 8, 2021, and titled "RECONFIGURABLE ASYMMETRICAL LOAD-MODULATED BALANCED AMPLIFIERS," the disclosure of which is expressly incorporated herein by reference in its entirety.

STATEMENT REGARDING FEDERALLY FUNDED RESEARCH

This invention was made with government support under Grant no. 1914875 awarded by the National Science Foundation. The government has certain rights in the invention.

BACKGROUND

The formation of the fifth-generation (5G) wireless communication ecosystem has resulted in ever-growing demands for higher data rates. Due to the scarcity of spectrum resources, low-latency and high-capacity wireless connectivity requires vast enhancement of spectral efficiency realized using advanced modulation schemes, such as 1024 quadrature amplitude modulation (QAM) and orthogonal frequency division multiplexing (OFDM). However, those complexly modulated radio waves have a high peak-to-average power ratio (PAPR), leading to substantially reduced efficiency of traditional power amplifiers (PAs). On the other hand, the proliferation of communication bands has been largely expanding the wireless spectrum toward higher frequencies. This ever-increasing number of allocated frequency bands is strongly calling for bandwidth extension technologies of PAs. In the current and next-generation radio systems, the operational bandwidth of a single PA is desired to be as wide as possible, to minimize the number of PAs on a wireless platform for reducing the cost, space, and system complexity. These emerging requirements have brought up unprecedented challenges for the realization of PAs.

To improve the PA efficiency for amplification of high-PAPR signals, there are currently at least two main technical solutions, envelope tracking (ET) and load modulation (LM). Due to the fact that ET suffers from the complexity of system implementation, limited dynamic range, and undesirable modulation-bandwidth up-scalability, LM technique exhibits promising potential for accommodating the fast-evolving communication standards, for example 5G and Wi-Fi 6. Until now, a variety of LM architectures have been proposed, developed, and implemented in practical systems, including Doherty PA (DPA), out-phasing PA, and varactor-based dynamic LM. Among various LM techniques, DPA has already been widely deployed in cellular base stations as a representative implementation of LM. However, toward the applications in the emerging wireless systems, DPA faces two major challenges as follows. First, the limited output power back-off (OBO) range is not sufficient to support the large PAPR of the latest modulation schemes (>10 dB). Second, the RF bandwidth is strongly limited by the quarter-wave inverter embedded in the DPA circuitry. Despite recent advances in broadband DPAs, maintaining consistently optimal load-modulation behavior and efficient DPA performance over a wide RF bandwidth still remains a major challenge.

SUMMARY

The present disclosure pertains to reconfigurable asymmetrical load-modulated balanced amplifiers. An example asymmetrical load-modulated balanced amplifier is described herein. The asymmetrical load-modulated balanced amplifier can include a radio frequency (RF) input port, a RF output port, a peaking amplifier circuit operably coupled between the RF input and RF output ports, where the peaking amplifier circuit is a balanced amplifier that includes a pair of asymmetrical power amplifiers, and a carrier amplifier circuit operably coupled to the RF input port.

In some implementations the pair of asymmetrical power amplifiers have asymmetric current and/or power scaling characteristics.

In some implementations, each of the pair of asymmetrical power amplifiers of the peaking amplifier circuit has a different physical size.

In some implementations, each of the pair of asymmetrical power amplifiers of the peaking amplifier circuit has a different drain or collector bias voltage. Additionally, an asymmetry of the different drain or collector bias voltages is optionally swapped in dependence on a frequency of a signal received at the RF input port.

In some implementations, each of the pair of asymmetrical power amplifiers of the peaking amplifier circuit has a different gate or base bias voltage. Additionally, an asymmetry of the different gate or base bias voltages is optionally swapped in dependence on a frequency of a signal received at the RF input port.

In some implementations the carrier amplifier circuit is configured to provide gain at any power level of an input RF signal.

In some implementations the peaking amplifier circuit is configured to provide gain only at power levels beyond a predetermined level of an input RF signal.

In some implementations, the asymmetrical load-modulated balanced amplifier is configured for load modulation from peak power to a predefined output power back-off. Optionally, the predefined output power back-off is about −10 dB.

In some implementations, the pair of asymmetrical power amplifiers of the peaking amplifier circuit are coupled through first and second quadrature couplers. Optionally, the pair of asymmetrical power amplifiers of the peaking amplifier circuit are coupled 90° out-of-phase through the first and second quadrature couplers. Alternatively or additionally, an input port of the first quadrature coupler is configured to receive an input RF signal. Alternatively or additionally, the carrier amplifier circuit is operably coupled between the RF input port and an isolation port of the second quadrature coupler. Optionally, each of the first and second quadrature couplers is a branch-line coupler, coupled-line coupler, Lange coupler, transformer-based coupler, or lumped coupler with inductors and capacitors.

In some implementations, the asymmetrical load-modulated balanced amplifier further includes a phase shifter, wherein the peaking amplifier circuit is operably coupled to the RF input through the phase shifter. Optionally, the phase shifter is a fixed phase shifter or a tunable phase shifter. For example, the phase shifter includes at least one of a transmission line, a bandpass filter, a low-pass filter, a high-pass filter, or a network with inductors, capacitors, and/or resistors. Optionally, the phase shifter is a transmission line that is configured to provide an optimal frequency-dependent phase offset between the carrier and peaking amplifier circuits over an operational frequency range. Additionally, a relative phase difference between the carrier and peaking amplifier circuits is offset by a given length of the transmission line.

In some implementations, the asymmetrical load-modulated balanced amplifier further includes a power divider, where the power divider is configured to split an input RF signal between the carrier and peaking amplifier circuits.

In some implementations, the carrier amplifier circuit includes a Class AB power amplifier.

In some implementations, the carrier amplifier circuit includes a Class A power amplifier or a Class B power amplifier.

In some implementations, each of the pair of asymmetrical power amplifiers of the peaking amplifier circuit is a Class C power amplifier.

Some implementation of the present disclosure relate to an asymmetrical load-modulated balanced amplifier system. According to one implementation, the system includes an asymmetrical load-modulated balanced amplifier and a controller, where the controller is configured to apply a first biasing scheme to the pair of asymmetrical power amplifiers for a first frequency range of a signal received at the RF input port, and apply a second biasing scheme to the pair of asymmetrical power amplifiers for a second frequency range of the signal received at the RF input port.

In some implementations, the first and second biasing schemes swap an asymmetry of respective drain or collector bias voltages of the pair of asymmetrical power amplifiers.

In some implementations, the first and second biasing schemes swap an asymmetry of respective gate or base bias voltages of the pair of asymmetrical power amplifiers.

Other systems, methods, features and/or advantages will be or may become apparent to one with skill in the art upon examination of the following drawings and detailed description. It is intended that all such additional systems, methods, features and/or advantages be included within this description and be protected by the accompanying claims.

BRIEF DESCRIPTION OF THE DRAWINGS

The components in the drawings are not necessarily to scale relative to each other. Like reference numerals designate corresponding parts throughout the several views.

FIG. 6A illustrates the case where POUT<Pmax/OBO and FIG. 6B illustrates the case where POUT≥Pmax/OBO.

FIG. 9A illustrates when α is set to 1; FIG. 9B when α is set to 1.5; and FIG. 9C when a is set to 2.

FIG. 11A illustrates α=1; FIG. 11B illustrates α=1.5; and FIG. 11C illustrates α=2.

FIG. 20A illustrates Drain efficiency and FIG. 20B illustrates PAE.

FIG. 22A illustrates when BA1 and BA2 α are set to 1 and 1.5 and FIG. 22B illustrates when CA α are set to 1. and 1.5.

FIG. 24A illustrates measured drain efficiency at various OBO levels from 0.55 to 2.2 GHz and FIG. 24B illustrates measured PAE at various OBO levels from 0.55 to 2.2 GHz.

FIG. 30 is a table comparing an implementation of a present disclosure and other active-load-modulation power amplifiers.

FIGS. 37A-37B illustrate carrier and peaking efficiency performances for implementations described herein, wherein FIG. 37A illustrates the performance of an PD-LMBA and FIG. 37-B illustrates the performance of an H-ALMBA.

FIG. 41A illustrates a schematic diagram, and FIG. 41B illustrates an ideal peak efficiency comparison with the same power loss.

FIG. 42A illustrates a schematic of the designed CA-OMN with continue-mode, and FIG. 42B illustrates simulated matching results of the designed CA-OMN from 1.7 to 3.0 GHz on the Smith chart with reference impedance.

FIG. 45A illustrates performance at 2.3 GHz, and FIG. 45B illustrates 2.5 GHz.

FIG. 47A illustrates fundamental current, FIG. 47B illustrates fundamental voltage, and FIG. 47C illustrates drain plane load trajectory.

FIG. 48A illustrates the drain efficiency, and FIG. 48B illustrates the power-added efficiency (PAE).

FIG. 51A illustrates the measured drain efficiency (DE) at various OBO levels, and FIG. 51B illustrates the measured gain.

FIG. 52A illustrates the performance from 1.7 to 2.3 GHz and FIG. 52B illustrates the performance from 2.4 to 3.0 GHz.

FIG. 55 is a table comparing an implementation described herein to other power amplifiers.

FIG. 62 is a table comparing an implementation of the present disclosure to other power amplifiers.

DETAILED DESCRIPTION

Figure 1:
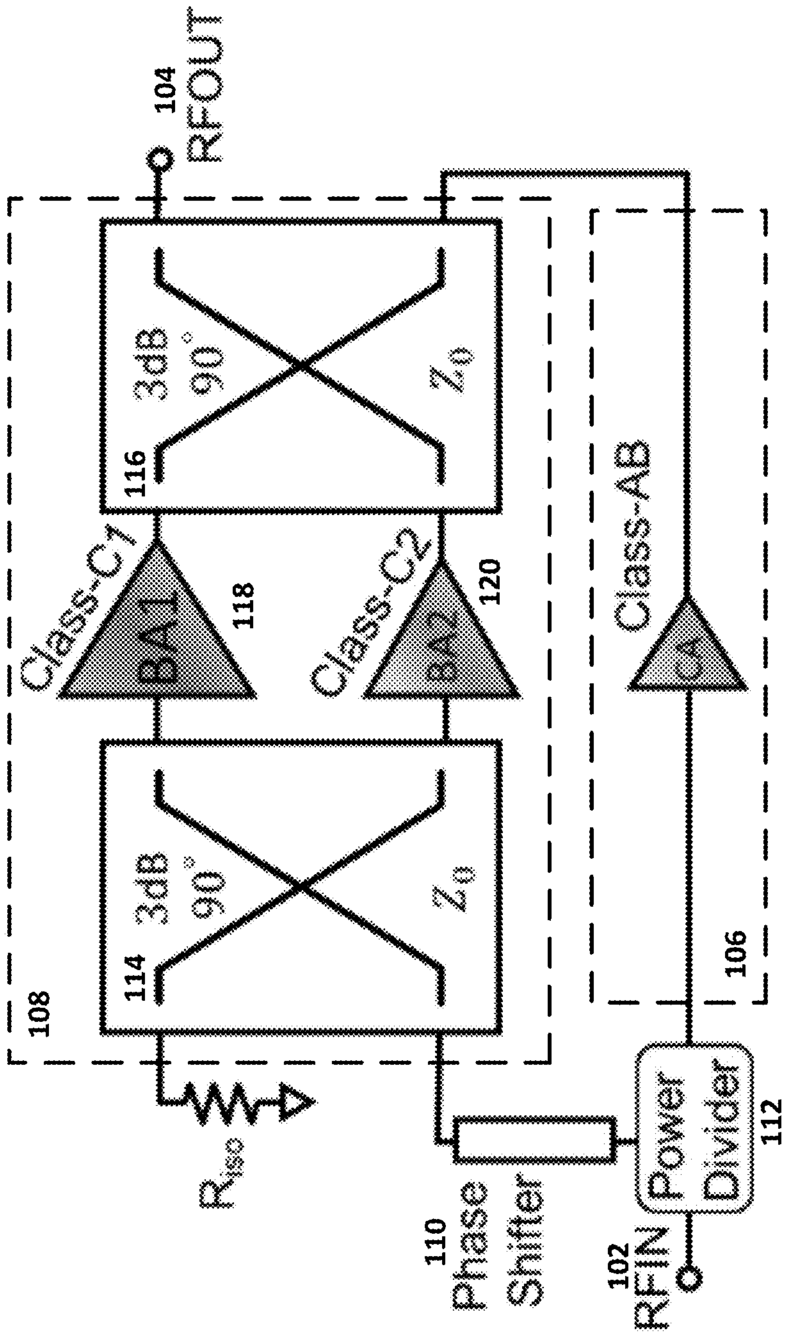
FIG. 1 illustrates a schematic view of an asymmetrical load-modulated balanced amplifier (ALBMA) according to an implementation described herein.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Described herein is a load-modulation power amplifier (PA) architecture—asymmetrical load-modulated balanced amplifier (ALMBA). The control amplifier (CA) of LMBA can be designed with arbitrary load modulation (LM) ratio by offsetting the symmetry of two sub-amplifiers (BA1 and BA2) in the balanced topology. The rigorous analytical derivation reveals a unification of the quadrature-coupler-based LM PA theory, which inclusively covers the recently reported LMBA within this generalized framework. Through pseudo-Doherty (PD) biasing of the asymmetric BA1 & BA2 (peaking) and the CA (carrier) combined with proper amplitude and phase controls, the optimal LM behaviors of three amplifiers can be achieved independently overextended power back-off range and ultrawide RF bandwidth. The LM of CA effectively mitigates the over-driving issue imposed on symmetrical PD-LMBA, leading to enhanced overall reliability and linearity. An RF-input PD-ALMBA (Pseudo-Doherty asymmetrical load-modulated balanced amplifier) is described herein. As a non-limiting example, the RF-input PD-ALMBA can be implemented using commercial GaN transistors. The developed prototype experimentally demonstrates dual-octave bandwidth from 0.55 to 2.2 GHz, which is the widest bandwidth ever reported for load-modulation PAs. The measurement exhibits an efficiency of 49-82% for peak output power and 40-64% for 10-dB OBO within the design bandwidth. When stimulated by a 20-MHz long-term evolution (LTE) signal with 10.5-dB peak to average power ratio (PAPR), an average efficiency of 47-63% is measured over the entire bandwidth at an average output power around 33 dBm.

An active load-modulation platform for high-efficiency power amplification, named asymmetrical load modulated balanced amplifier (ALMBA), in which two asymmetrical amplifiers coupled quadratically are load modulated by a control amplifier (CA) is described herein. With proper setting of phase, amplitude, and turn-on sequence of three sub-amplifiers, a hybrid load modulation of the overall power amplifier (PA) can be achieved, leading to maximally enhanced efficiency over extended dynamic power range. Moreover, with the disclosed phase control method and reconfigurable biasing scheme, unlimited bandwidth of this load modulation amplifier can be maintained from regular LMBA. This architecture exhibits a desirable solution for the current and future energy-efficiency, multi-band, and multi-mode radio transmitters. A quadrature-coupler-based load modulation power amplifier according to implementations described herein can include three individual amplifiers, e.g. BA1, BA2, and control amplifier (CA), with dedicated size (power), phase offset, and turning on point, and these three sub-amplifiers are combined into a quadrature coupler.

Features of such power amplifier can include, but are not limited to: 1) BA1 and BA2 can be asymmetrical in terms of size and bias voltages; 2) the turn-on thresholds of three amplifiers can be properly aligned (in multiple combinations) leading to a load modulation behavior like a three-way Doherty PA; 3) unlimited bandwidth can be achieved with proper phase offset between three amplifier, and 4) wideband performance can be optimized through reciprocal biasing of BA1 and BA2, which effectively compensates the imperfections of wideband quadrature couplers. Additionally, such power amplifier can have benefits including, but not limited to: achieving enhanced efficiency from peak power to back-off power, which is highly demanded for amplification of emerging communication signals, and wideband performance.

With reference to FIG. 1, the ALMBA includes an RF input port 102, an RF output port 104, a carrier amplifier circuit 106, and a peaking amplifier circuit 108. The carrier amplifier circuit 106 is configured to provide gain at any power level of an input RF signal, while the peaking amplifier circuit 108 is configured to provide gain only at peak power levels of an input RF signal.

In FIG. 1, the peaking amplifier circuit 108 is operably coupled between the RF input 102 and RF output 104 ports. The peaking amplifier circuit 108 is a balanced amplifier that includes a pair of asymmetrical power amplifiers BA1 118 and BA2 120. The pair of asymmetrical power amplifiers BA1 118 and BA2 120 are coupled through first and second quadrature couplers QC1 114 and QC1 116. QC1 114 is the input quadrature coupler and QC1 116 is the output quadrature coupler. Each of the first and second quadrature couplers 114 and 116 can be a branch-line coupler, a coupled-line coupler, a Lange coupler, a transformer-based coupler, or a lumped coupler with inductors and capacitors. It should be understood that the couplers provided above are only examples. This disclosure contemplates that the first and second quadrature couplers 114 and 116 can be, include, and/or be made from other circuit components. As shown in FIG. 1, the pair of asymmetrical power amplifiers BA1 118 and BA2 120 are coupled 90° out-of-phase through the quadrature couplers QC1 114 and QC1 116. As described herein, the pair of asymmetrical power amplifiers BA1 118 and BA2 120 can have asymmetric current and/or power scaling characteristics. Alternatively or additionally, each of the pair of asymmetrical power amplifiers BA1 118 and BA2 120 can have a different physical size. Alternatively or additionally, each of the pair of asymmetrical power amplifiers BA1 118 and BA2 120 can have a different drain or collector bias voltage. Alternatively or additionally, each of the pair of asymmetrical power amplifiers BA1 118 and BA2 120 can have a different gate or base bias voltage. As one example, in FIG. 1, power amplifier BA1 118 is a Class C1 power amplifier, and power amplifier BA2 120 is a Class C2 power amplifier. It should be understood that the asymmetrical power amplifiers described above are provided only as examples.

Additionally, in FIG. 1, the carrier amplifier circuit 106 includes a Class AB power amplifier. In other implementations, this disclosure contemplates that the carrier amplifier circuit 106 can include a Class A power amplifier or a Class B power amplifier. Additionally, the carrier amplifier circuit 106 is operably coupled to the input port 102. In particular, the carrier amplifier circuit 106 is operably coupled between the input port 102 and an isolation port of the second quadrature coupler QC1 116.

The input port 102 can be configured to accept a radiofrequency (RF) signal. The input port 102 can optionally be operably connected to a power divider 112, which is configured to split the input RF signal between the carrier and peaking amplifier circuits 106 and 108. The power divider 112 can be a dedicated power divider 112, and the power dividing ratio can be adapted to control the amplitude of the signal that is passed through the power divider 112 to the carrier amplifier circuit 106 and to the peaking amplifier circuit 108, e.g., via an input port of the first quadrature coupler QC1.

The ALMBA can also include a phase shifter 110. Optionally, the power divider 112 can be operably connected to the phase shifter 110. In some implementations, the phase shifter 110 is a transmission line. The phase shifter 110 can be configured to provide an optimal frequency-dependent phase offset between the carrier amplifier circuit 106 and peaking amplifier circuit 108 over an operational frequency range (e.g., about 0.55 to 2.2 Gigahertz (GHz)). As described in the examples below, the length and/or width of the transmission line can be tuned to achieve the desired frequency-dependent phase offset between power amplifier BA1 118 and the power amplifier CA. Although a transmission line is provided as an example phase shifter 110, this disclosure contemplates that the phase shifter 110 can be another equivalent component configured to provide an optimal frequency-dependent phase offset. For example, this disclosure contemplates that the phase shifter 110 can be, include, and/or be made from at least one of a transmission line, a bandpass filter, a low-pass filter, a high-pass filter, or a network comprising inductors, capacitors, and/or resistors.

It should be understood that the ALMBA shown in FIG. 1 and described above is provided only as an example. This disclosure contemplates that an ALMBA can have other configurations in accordance with this disclosure. Example ALMBAs with alternative configurations are shown in FIGS. 2-5.

Figure 2:
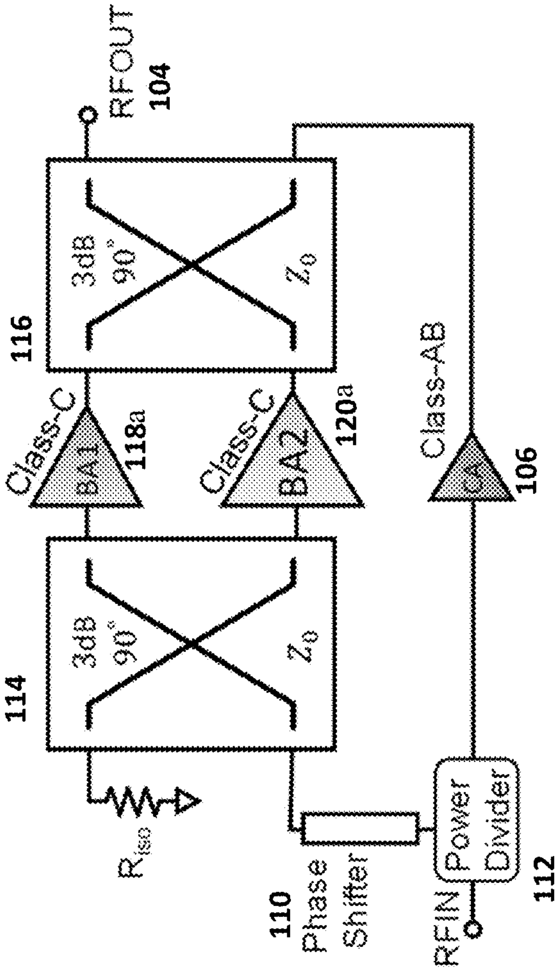
FIG. 2 illustrates a schematic view of an ALBMA according to another implementation described herein.

FIG. 2 illustrates a schematic of an implementation of an ALMBA according to another implementation described herein. As described below, the ALMBA of FIG. 2 differs from the ALMBA of FIG. 1 by changing the physical sizes of BA1 118*a* and BA2 120*a*. It should be understood that this changes the size ratio between BA1 118*a* and BA2 120*a*. In FIG. 2, BA2 120*a* has a physically larger size than BA1 118*a*. It should be understood that this is only provided as an example and that BA1 118*a* may be physically larger in size than BA2 120*a* in other implementations. The ALMBA of FIG. 2, its components, and functionality are otherwise the same as the ALMBA of FIG. 1.

With reference to FIG. 2, the ALMBA includes an RF input port 102, an RF output port 104, a carrier amplifier circuit 106, and a peaking amplifier circuit 108. As described above, the carrier amplifier circuit 106 is configured to provide gain at any power level of an input RF signal, while the peaking amplifier circuit 108 is configured to provide gain only at peak power levels of an input RF signal.

In FIG. 2, the peaking amplifier circuit 108 is operably coupled between the RF input and RF output ports 102 and 104. The peaking amplifier circuit 108 is a balanced amplifier that includes a pair of asymmetrical power amplifiers BA1 118*a* and BA2 120*a*. The pair of asymmetrical power amplifiers BA1 118*a* and BA2 120*a* are coupled 90° out-of-phase through first and second quadrature couplers QC1 114 and QC2 116. QC1 114 is the input quadrature coupler and QC2 116 is the output quadrature coupler.

Additionally, in FIG. 2, the carrier amplifier circuit 106 is operably coupled to the input port 102. In particular, the carrier amplifier circuit 106 is operably coupled between the input port 102 and an isolation port of the second quadrature coupler QC2 116 as shown in FIG. 2. The input port 102 can be configured to accept a radiofrequency (RF) signal. The input port 102 can optionally be operably connected to a power divider 112, which is configured to split the input RF signal between the carrier and peaking amplifier circuits 106 and 108. The power divider 112 can be a dedicated power divider 112, and the power dividing ratio can be adapted to control the amplitude of the signal that is passed through the power divider 112 to the carrier amplifier circuit 106 and to the peaking amplifier circuit 108, e.g., via an input port of the first quadrature coupler QC1 114. The ALMBA of FIG. 2 can also include a phase shifter 110. Optionally, the power divider 112 can be operably connected to the phase shifter 110.

Figure 3:
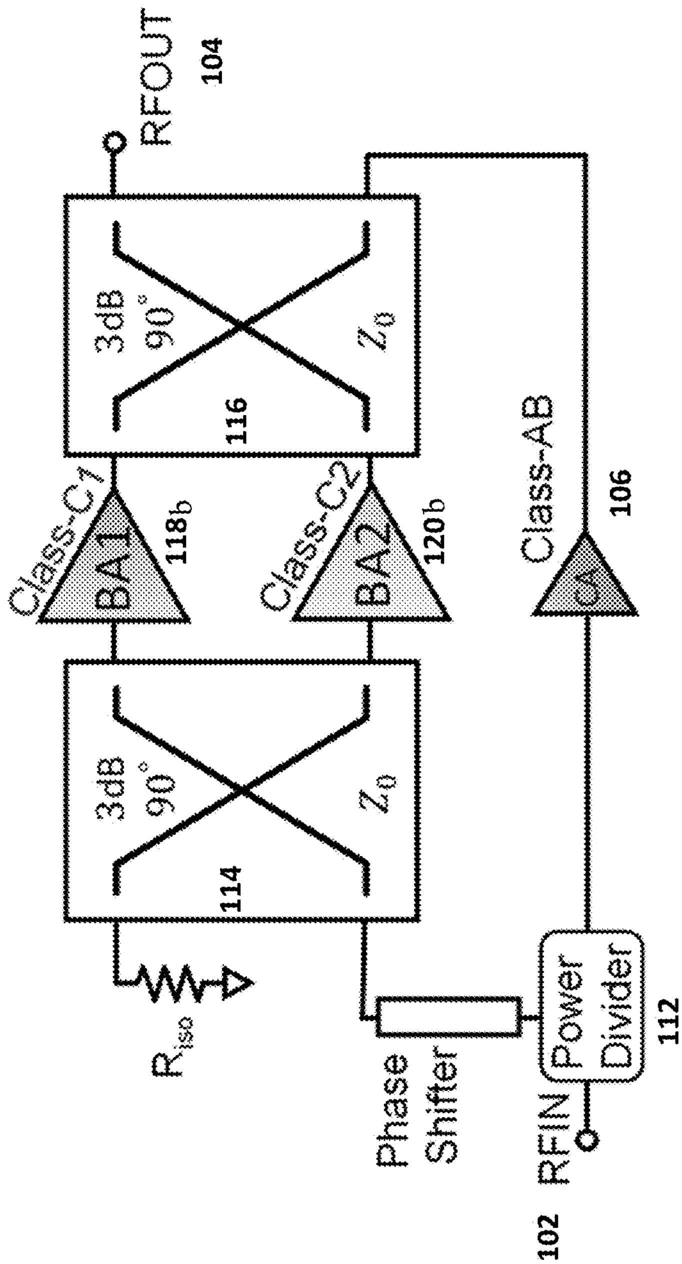
FIG. 3 illustrates a schematic view of an ALBMA according to another implementation described herein.

FIG. 3 illustrates a schematic of an implementation of an ALMBA according to another implementation described herein. As described below, the ALMBA of FIG. 3 differs from the ALMBA of FIG. 1 by providing BA1 118*b* and BA2 120*b* having different turn-on thresholds. This can be accomplished by requiring different drain or collector bias voltages for BA1 118*b* and BA2 120*b* to turn-on the amplifiers. Alternatively or additionally, can be accomplished by requiring different gate or base bias voltages for BA1 118*b* and BA2 120*b* to turn-on the amplifiers. This disclosure contemplates that BA1 118*b* and BA2 120*b* have the same or different physical sizes. ALMBA of FIG. 3, its components, and functionality are otherwise the same as the ALMBA of FIG. 1.

With reference to FIG. 3, the ALMBA includes an RF input port 102, an RF output port 104, a carrier amplifier circuit 106, and a peaking amplifier circuit 108. As described above, the carrier amplifier circuit 106 is configured to provide gain at any power level of an input RF signal, while the peaking amplifier circuit 108 is configured to provide gain only at peak power levels of an input RF signal.

In FIG. 3, the peaking amplifier circuit 108 is operably coupled between the RF input and RF output ports 102 and 104. The peaking amplifier circuit 108 is a balanced amplifier that includes a pair of asymmetrical power amplifiers BA1 118*b* and BA2 120*b*. The pair of asymmetrical power amplifiers BA1 118*b* and BA2 120*b* are coupled 90° out-of-phase through first and second quadrature couplers QC1 114 and QC2 116. QC1 114 is the input quadrature coupler and QC2 116 is the output quadrature coupler.

Additionally, in FIG. 3, the carrier amplifier circuit 106 is operably coupled to the input port 102. In particular, the carrier amplifier circuit 106 is operably coupled between the input port 102 and an isolation port of the second quadrature coupler QC2 116 as shown in FIG. 3. The input port 102 can be configured to accept a radiofrequency (RF) signal. The input port 102 can optionally be operably connected to a power divider 112, which is configured to split the input RF signal between the carrier and peaking amplifier circuits 106 and 108. The power divider 112 can be a dedicated power divider 112, and the power dividing ratio can be adapted to control the amplitude of the signal that is passed through the power divider 112 to the carrier amplifier circuit 106 and to the peaking amplifier circuit 108, e.g., via an input port of the first quadrature coupler QC1 114. The ALMBA of FIG. 3 can also include a phase shifter 110. Optionally, the power divider 112 can be operably connected to the phase shifter 110.

Figure 4:
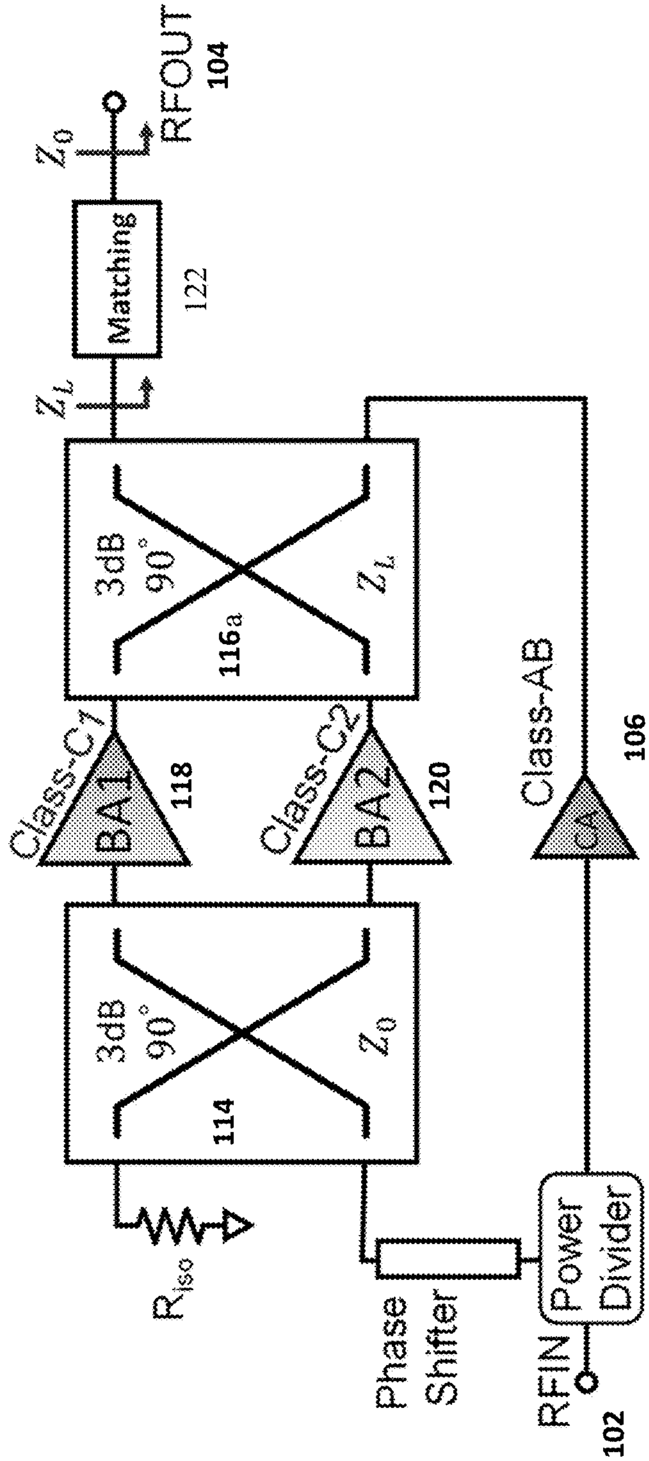
FIG. 4 illustrates a schematic view of an ALBMA according to another implementation described herein.

FIG. 4 illustrates a schematic of an implementation of an ALMBA according to another implementation described herein. As described below, the ALMBA of FIG. 4 differs from the ALMBA of FIG. 1 by including a non-ZO quadrature coupler (i.e., the output quadrature coupler) and an impedance matching network. The ALMBA of FIG. 4, its components, and functionality are otherwise the same as the ALMBA of FIG. 1. The present disclosure also contemplates that the same coupler configuration as shown in FIG. 1 (e.g., coupler 114) can be applied to the input 102.

With reference to FIG. 4, the ALMBA includes an RF input port 102, an RF output port 104, a carrier amplifier circuit 106, and a peaking amplifier circuit 108. As described above, the carrier amplifier circuit 106 is configured to provide gain at any power level of an input RF signal, while the peaking amplifier circuit 108 is configured to provide gain only at peak power levels of an input RF signal.

In FIG. 4, the peaking amplifier circuit 108 is operably coupled between the RF input and RF output ports 102 and 104. The peaking amplifier circuit 108 is a balanced amplifier that includes a pair of asymmetrical power amplifiers BA1 118 and BA2 120. Each of BA1 118 and BA2 120 can optionally have different physical sizes (see e.g., FIG. 2) and/or can optionally have different turn-on thresholds (see e.g., FIG. 3). The pair of asymmetrical power amplifiers BA1 118 and BA2 120 are coupled 90° out-of-phase through first and second quadrature couplers QC1 114 and QC2 116*a*. QC1 114 is the input quadrature coupler and QC2 116*a* is the output quadrature coupler. Unlike the output quadrature coupler of ALMBA of FIG. 1, QC2 116*a* is a non-ZO quadrature coupler. An impedance matching network 122 is also provided in the ALMBA of FIG. 4, for example, at the RF output 104. The impedance matching network 122 can include one or more inductors, capacitors, resistors, transformers, or other electrical components that provide for impedance matching.

Additionally, in FIG. 4, the carrier amplifier circuit 106 is operably coupled to the input port 102. In particular, the carrier amplifier circuit 106 is operably coupled between the input port 102 and an isolation port of the second quadrature coupler QC2 116*a* as shown in FIG. 4. The input port 102 can be configured to accept a radiofrequency (RF) signal. The input port 102 can optionally be operably connected to a power divider 112, which is configured to split the input RF signal between the carrier and peaking amplifier circuits 106 and 108. The power divider 112 can be a dedicated power divider 112, and the power dividing ratio can be adapted to control the amplitude of the signal that is passed through the power divider 112 to the carrier amplifier circuit 106 and to the peaking amplifier circuit 108, e.g., via an input port of the first quadrature coupler QC1 114. The ALMBA of FIG. 4 can also include a phase shifter 110. Optionally, the power divider 112 can be operably connected to the phase shifter 110.

Figure 5:
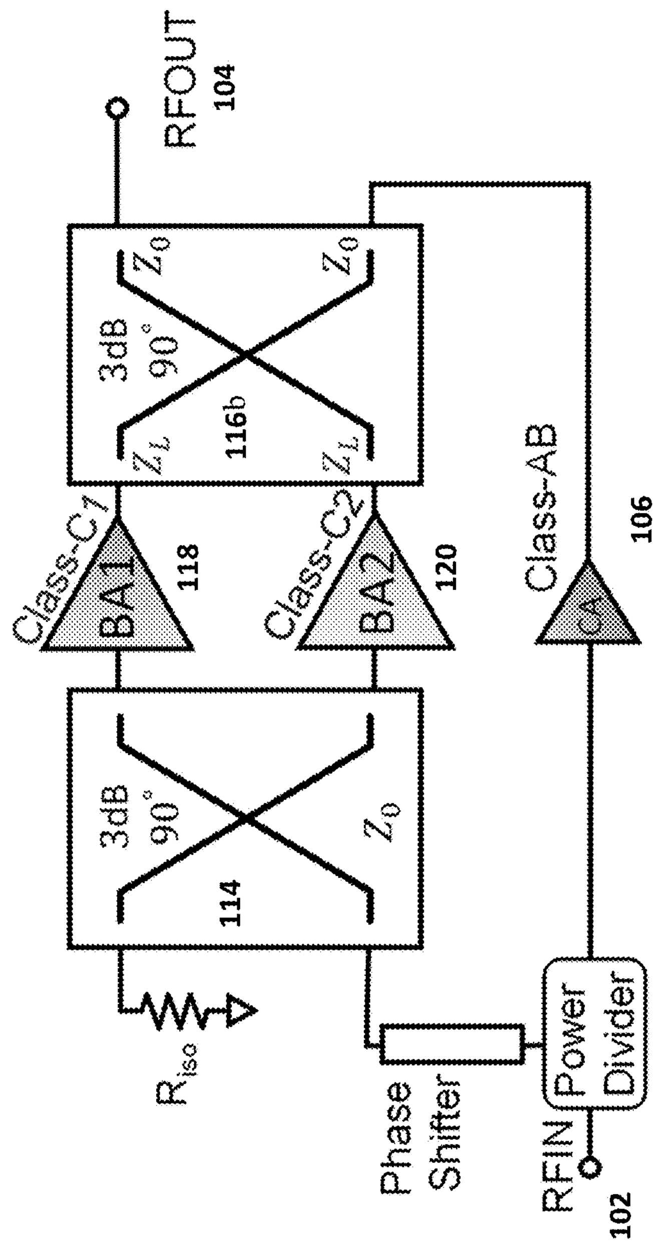
FIG. 5 illustrates a schematic view of an ALBMA according to another implementation described herein.

FIG. 5 illustrates a schematic of an implementation of an ALMBA according to yet another implementation described herein. As described below, the ALMBA of FIG. 5 differs from the ALMBA of FIG. 1 by including an impedance matching quadrature coupler (i.e., the output quadrature coupler). The ALMBA of FIG. 5, its components, and functionality are otherwise the same as the ALMBA of FIG. 1. Again, the present disclosure also contemplates that the same coupler configuration (e.g., coupler 114) can be applied to the input 102.

With reference to FIG. 5, the ALMBA includes an RF input port 102, an RF output port 104, a carrier amplifier circuit 106, and a peaking amplifier circuit 108. As described above, the carrier amplifier circuit 106 is configured to provide gain at any power level of an input RF signal, while the peaking amplifier circuit 108 is configured to provide gain only at peak power levels of an input RF signal.

In FIG. 5, the peaking amplifier circuit 108 is operably coupled between the RF input and RF output ports 102 and 104. The peaking amplifier circuit 108 is a balanced amplifier that includes a pair of asymmetrical power amplifiers BA1 118 and BA2 120. Each of BA1 118 and BA2 120 can optionally have different physical sizes (see e.g., FIG. 2) and/or can optionally have different turn-on thresholds (see e.g., FIG. 3). The pair of asymmetrical power amplifiers BA1 118 and BA2 120 are coupled 90° out-of-phase through first and second quadrature couplers QC1 114 and QC2 116*b*. QC1 114 is the input quadrature coupler and QC2 116*b* is the output quadrature coupler. Unlike the output quadrature coupler of ALMBA of FIG. 1, QC2 116*b* is an impedance matching coupler, which provides for impedance matching.

Additionally, in FIG. 5, the carrier amplifier circuit 106 is operably coupled to the input port 102. In particular, the carrier amplifier circuit 106 is operably coupled between the input port 102 and an isolation port of the second quadrature coupler QC2 116*b* as shown in FIG. 5. The input port 102 can be configured to accept a radiofrequency (RF) signal. The input port 102 can optionally be operably connected to a power divider 112, which is configured to split the input RF signal between the carrier and peaking amplifier circuits 106 and 108. The power divider 112 can be a dedicated power divider 112, and the power dividing ratio can be adapted to control the amplitude of the signal that is passed through the power divider 112 to the carrier amplifier circuit 106 and to the peaking amplifier circuit 108, e.g., via an input port of the first quadrature coupler QC1 114. The ALMBA of FIG. 5 can also include a phase shifter 110. Optionally, the power divider 112 can be operably connected to the phase shifter 110.

According to some implementations of the present disclosure, the pair of asymmetrical power amplifiers of the peaking amplifier circuit can have different drain or collector bias voltages, or different gate or base bias voltages.

According to some implementations of the present disclosure where the asymmetrical power amplifiers are configured for operation with different drain or collector bias voltages, or different gate or base bias voltages, the asymmetrical the pair of asymmetrical power amplifiers of the peaking amplifier circuit can be configured so that each of the pair of asymmetrical power amplifiers has a different efficiency profile. This is described in detail, for example, in Examples 4-7 below (also referred to as hybrid ALMBA). For example, the asymmetrical load-modulated balanced amplifier can be configured to turn on the asymmetrical power amplifier of the pair of asymmetrical power amplifiers with the highest efficiency for a frequency input at the RF input port 102. In other words, the turning-on sequence of each of the power amplifiers in the pair is frequency dependent. At one frequency or range of frequencies a first power amplifier (e.g., BA1) is configured to turn on before a second power amplifier (e.g., BA2). And at a different frequency or range of frequencies the second power amplifier (e.g., BA2) is configured to turn on before the first power amplifier (e.g., BA1).

In some implementations of the present disclosure, biasing scheme (e.g. the bias voltages) can be controlled by a controller. Non-limiting examples of the controller that can be used include a power management unit, DC-DC converter (drain/collector), or power management unit or controller (gate/base).The controller can be configured to adjust the biasing scheme based on the efficiency profile of the asymmetrical power amplifiers. This is described in detail, for example, in Examples 4-7 below (also referred to as hybrid ALMBA). The efficiency profile of the power amplifier can represent the efficiency of the power amplifier at different frequencies. As a non-limiting example, one of the asymmetrical power amplifiers can have a maximum efficiency at 2.5 GHz, and another of the asymmetrical power amplifiers can have a maximum efficiency at 2.3 GHz. Based on the input frequency to the asymmetrical power amplifier and the efficiency profiles of the two asymmetrical power amplifiers, the controller can change the biasing scheme to activate the more efficient of the two power amplifiers. In other words, the turning-on sequence of each of the power amplifiers in the pair is frequency dependent. At one frequency or range of frequencies a first power amplifier (e.g., BA1) is configured to turn on before a second power amplifier (e.g., BA2). And at a different frequency or range of frequencies the second power amplifier (e.g., BA2) is configured to turn on before the first power amplifier (e.g., BA1).

EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

Example 1

An asymmetrical LMBA according to one implementation of the present disclosure, can be designed using a generalized ALMBA framework.

Figure 6A:
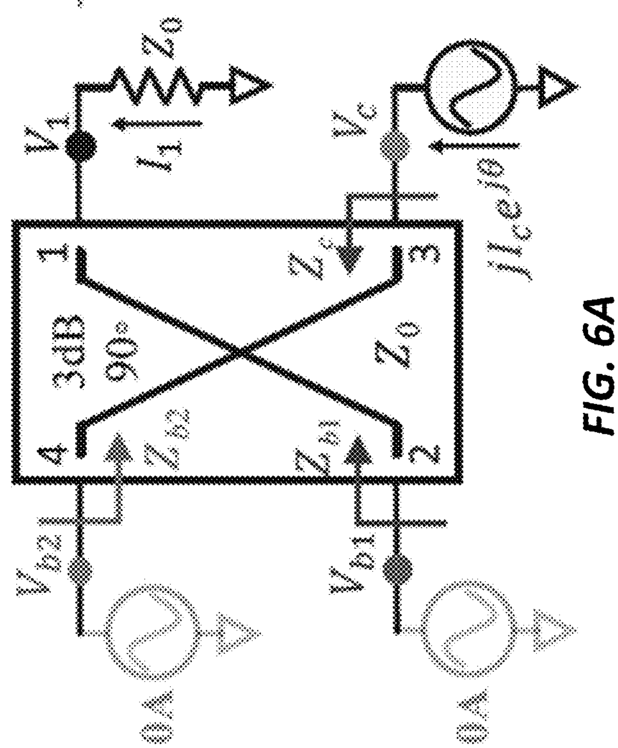
FIGS. 6A-6B illustrate an ideal generalized schematic of the output combining network for analyzing the proposed PD-ALMBA architecture according to another implementation described herein, where
Figure 6B:
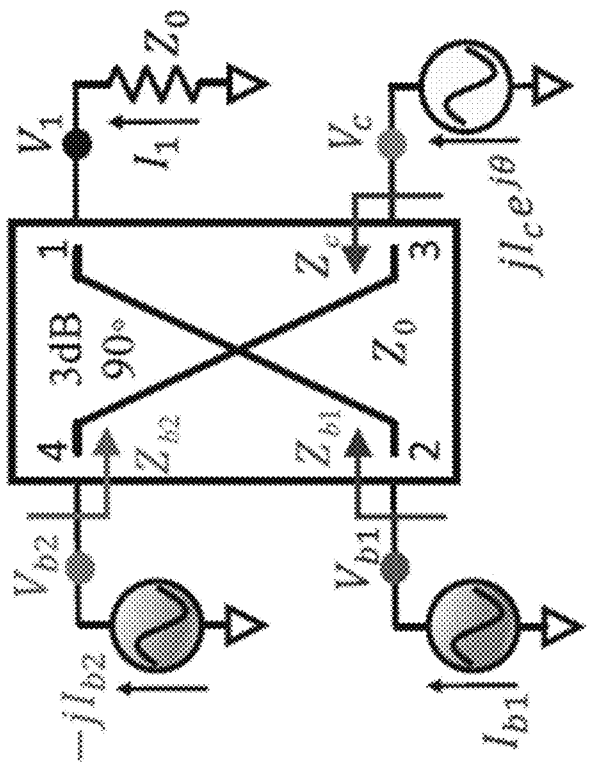

As shown in FIG. 1, an implementation of the present disclosure including an LMBA architecture can include a BA and a CA combined with a predetermined phase offset. The behavior of LMBA can be modeled as three excitation sources driving the output quadrature coupler, and it can be analytically described using impedance matrix given by:

$$\begin{bmatrix} V_1 \\ V_2 \\ V_3 \\ V_4 \end{bmatrix} = Z_0 \begin{bmatrix} 0 & 0 & +j & -j\sqrt{2} \\ 0 & 0 & -j\sqrt{2} & +j \\ +j & -j\sqrt{2} & 0 & 0 \\ -j\sqrt{2} & +j & 0 & 0 \end{bmatrix} \begin{bmatrix} I_1 \\ I_2 \\ I_3 \\ I_4 \end{bmatrix} \quad (1)$$

where $V_1=I_1Z_0$, $I_2=Ib_1$ and $I_4=-jIb_2$ representing the input RF currents from BA1 and BA2, while $I_3=-jI_ce^{j\theta}$ denotes the CA current that is phase-shifted from BA1 by π/2+θ, as shown in FIGS. 6A-6B. Using the matrix operation illustrated in (1), the impedances of BA1 and BA2 can be calculated as:

$$Z_{b1} = Z_0\left(\frac{I_{b2}}{I_{b1}} + \frac{\sqrt{2}\,I_c e^{j\theta}}{I_{b1}}\right) \quad (2)$$

$$Z_{b2} = Z_0\left(2 - \frac{I_{b1}}{I_{b2}} + \frac{\sqrt{2}\,I_c e^{j\theta}}{I_{b2}}\right).$$

The load impedance seen by the CA can also be calculated from (1), given by:

$$Z_c = Z_0\left(1 - \sqrt{2}\,\frac{I_{b1} - I_{b2}}{I_c e^{j\theta}}\right). \quad (3)$$

In some implementations, the ALMBA described in (2) and (3) can be fully converged to a generic LMBA by setting $Ib_1=Ib_2$, in which BA1 and BA2 are loaded with the same impedance ($Zb_1=Zb_2$). Meanwhile, the CA in symmetrical LMBA can be not load modulated regardless of the changes of currents. However, if BA1 and BA2 are not identical, the LM of CA can be achieved, while BA1 and BA2 are subject to different LM behaviors.

The present disclosure contemplates that by setting the phase and amplitude of all three amplifiers, the LM behaviors can be manipulated independently. This can lead to a generalization of the quadrature-coupler-based LM PA theory, and allowing for a wide range of implementations of the present disclosure including an LMBA.

Implementations of the present disclosure can include Pseudo-Doherty Biasing. By applying a Doherty-like biasing of CA and BA, a PD-LMBA can be constructed with CA as the carrier amplifier and BA as the peaking amplifier. As depicted in FIGS. 6A-6B, the PD-LMBA operation can be based on the following conditions:

1) The BA1 and BA2 are turned off at low-power region where only the CA operates, as shown in FIG. 6A;

2) When the CA reaches saturation ($I_c=I_{c,max}$), the BA turns on at the same time, illustrated in FIG. 6B.

Implementations of the present disclosure including a PD-LMBA architecture can have at least three advantages over LM technologies: (1) the power scaling between carrier and peaking amplifiers can be realized for achieving extended power back-off range—in some implementations this is possible because the BA with two PAs combined is stronger in power generation than a single branch of CA; (2) the optimal load modulation behavior of BA (purely resistive) can be achieved only with a static phase setting of CA which can minimize the complexity of phase control; and (3) under ideal phase and amplitude control, two efficiency peaks can be achieved at maximum power (PMAX) and predefined OBO with minimal efficiency degradation in between. However, the CA in PD-LMBA can reach full saturation at the target OBO level, and, thus, it is under constant over-driving from OBO to PMAX, resulting in linearity degradation and potential reliability issues of the entire PD-LMBA.

To alleviate the CA over-driving issue, a feasible solution is to enable LM on CA, which is similar to the carrier amplifier in distributed efficient PA (DEPA). To better analyze the load-modulation characteristics of PD-ALMBA, the currents of BA1, BA2, and CA are carefully modeled. As the carrier amplifier, the CA current, that is $i_{ca}$, is defined by $$i_{ca}(\beta) = \begin{cases} i_{ca,bo}(\beta), & 0 \leq \beta < \beta_{bo} \\ i_{ca,h}(\beta), & \beta_{bo} \leq \beta \leq 1 \end{cases} \tag{4}$$

where $i_{ca,bo}$ is the CA current at power back-off where the BA1 and BA2 are turned off, and $i_{ca,h}$ denotes the CA current in high-power region where the BA1 and BA2 are turned on.

β is the normalized variable to describe the magnitude of the input driving level, and $\beta_{bo}$ is the threshold between the low-power and high-power regions. $i_{ca,bo}$ can be simply expressed as the defined current of the ideal Class-B mode $$i_{ca,bo}(\beta) = \begin{cases} \frac{\beta}{\beta_{bo}} \frac{I_{Max,C}}{\alpha} \cdot \cos\theta, & -\frac{\pi}{2} \leq \theta < \frac{\pi}{2} \\ 0, & \text{otherwise} \end{cases} \tag{5}$$

where $I_{Max,C}$ represents the maximum current allowed to flow through the CA transistor, and α stands for the ratio between the maximum CA currents of low-power and high-power regions. It is interesting to note that a can also be considered as the LM ratio of CA. From (5), the dc and fundamental components of $i_{ca,bo}$ can be obtained as $$i_{ca,bo}[0] = \frac{2\beta}{\pi\alpha \cdot \beta_{bo}} I_{Max,C} \tag{6}$$

$$i_{ca,bo}[1] = \frac{\beta}{2\alpha \cdot \beta_{bo}} I_{Max,C}.$$

When the driving power increases to $\beta_{bo}$, the CA is saturated corresponding to the first efficiency peak at the target OBO level. For symmetrical PD-LMBA (α=1), $i_{ca,bo}$ grows to its maximum value, and this maximum CA current is maintained as the driving power continuing to increase toward the maximum input driving level (β=1). For PD-ALMBA (α>1), the CA is only voltage saturated at $\beta_{bo}$, which still leads to an efficiency peak, and the CA current is increased by a factor of α to the full saturation (both voltage and current) at β=1. Therefore, $i_{ca,h}$ of PD-ALMBA can be expressed as $$i_{ca,h}(\beta) = \begin{cases} I_{Max,C} \cdot \cos\theta, & -\frac{|\pi}{2} \leq \theta < \frac{\pi}{2} \\ 0, & \text{otherwise.} \end{cases} \tag{7}$$

Figure 7:
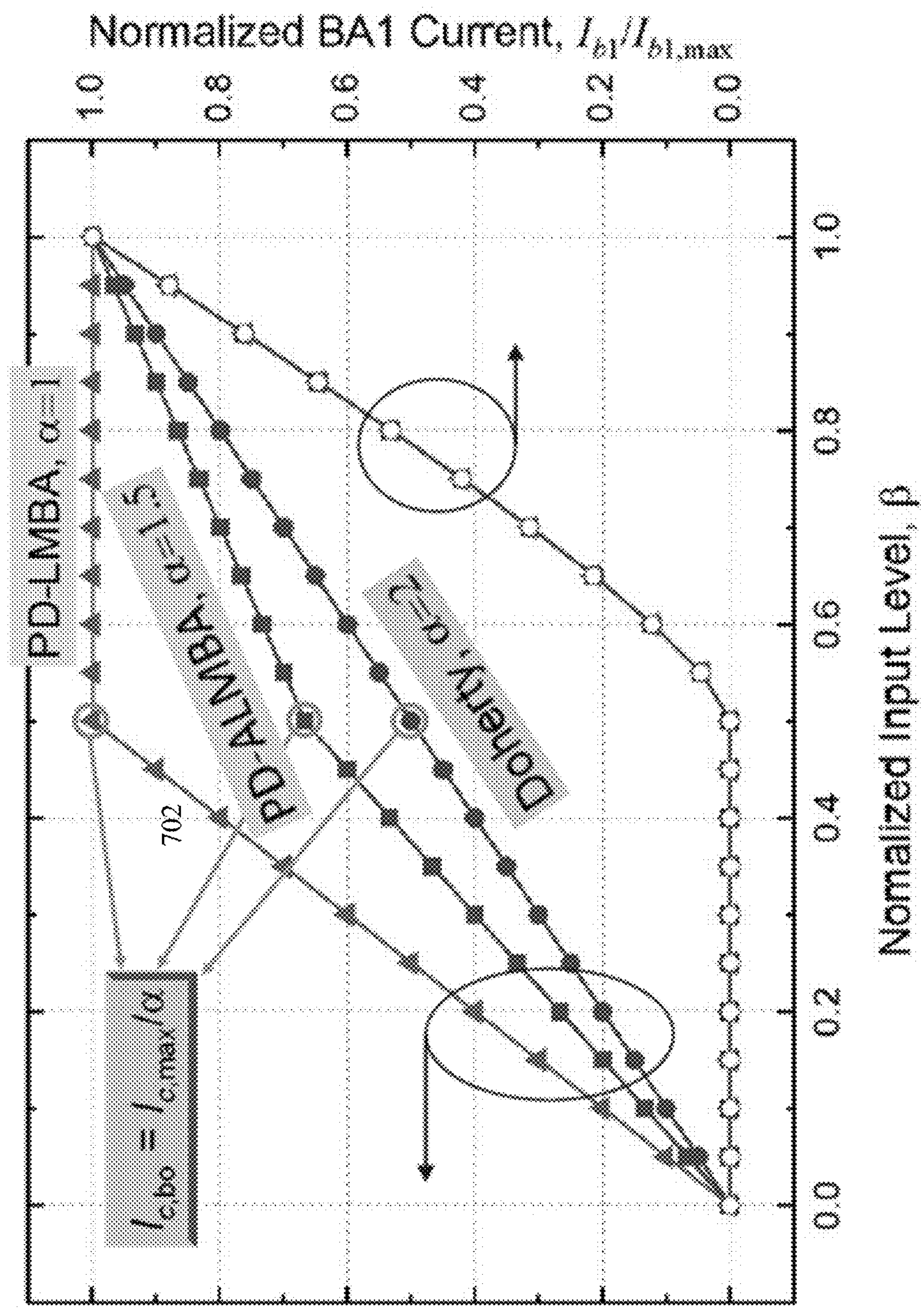
FIG. 7 illustrates normalized currents of Ic and Ib1 when βbo=0.5 for different PA modes, i.e., PD-LMBA, PD-ALMBA, and DPA according to another implementation described herein.

The fundamental component of CA current ($I_{ca}$) is plotted as the blue curve 702 in FIG. 7. With a variation of LM factor, i.e., α∈(1, 2), the CA LM falls within a continuum between symmetrical PD-LMBA and DPA.

The BAs can be biased identically at Class-C mode. Assuming that $i_{b1}$ and $i_{b2}$ are proportional, they can be derived as:

$$i_{ba1}(\beta) = \begin{cases} 0, & 0 \leq \beta < \beta_{bo} \\ i_{ba1,h}(\beta), & \beta_{bo} | \leq \beta \leq 1 \end{cases} \tag{8}$$

$$i_{ba2}(\beta) = \sigma \cdot i_{ba1}(\beta) \tag{9}$$

where σ represents the current scaling ratio between BA1 and BA2 (e.g., σ=1 for symmetrical BA). The BA1 current in high-power region can be expressed using Class-C current formula as:

$$i_{ba1,h}(\beta) = \begin{cases} \frac{\beta \cdot \cos\theta - \beta_{bo}}{1 - \beta_{bo}} I_{Max,B1}, & -\theta_b \leq \theta < \theta_b \\ 0, & \text{otherwise} \end{cases} \tag{10}$$

where (−θb, +θb) defines the turn-on phase range of BA1 and BA2. Thus, $\vartheta_b$ is obtained as:

$\theta_b = \arccos(\beta_{bo}/\beta)$.

By applying Fourier Transformation, the dc and fundamental currents of BA1 can be calculated as:

$$i_{ba1,h}[0] = \frac{I_{Max,B1}}{1 - \beta_{bo}} \cdot \frac{2\beta\sin\theta_b - 2\beta_{bo}\theta_b}{\pi} \tag{12}$$

$$i_{ba1,h}[1] = \frac{I_{Max,B1}}{1 - \beta_{bo}} \cdot \frac{\beta(2\theta_b + \sin 2\theta_b) - 4\beta_{bo}\sin\theta_b}{2\pi}.$$

The normalized current of the BA1 versus β is presented in FIG. 7. The BA current is only dependent on the driving level, β, regardless of CA LM factor, α.

For an implementation of the present disclosure including a PD-ALMBA, the CA is load modulated after the CA first reaches voltage saturation at the predefined OBO with a decreasing $Z_c$ and an increasing $I_c$, thus extending the linear range of CA. Realistically, this can be achieved by enforcing asymmetry between BA's two sub-amplifiers, that is the difference of current between BA1 and BA2, as indicated by (3). To theoretically analyze an implementation of a PD-ALMBA, its operation can be divided into the following three regions:

(1) Low-Power Region (POUT<PMAX/OBO): When operating at low-power level below the predefined target OBO power, the BA1 and BA2 are completely turned off, as depicted in FIG. 6A. The CA operates as a standalone Class-AB amplifier, and the output power is solely generated by CA. In this back-off region, the LM behaviors of BA1 and BA2 as well as the CA impedance are provided as follows:

$$\begin{aligned} Z_{b1,LP} &= Z_{b2,LP} \\ &= \infty \end{aligned} \tag{13}$$

$$Z_{c,LP} = Z_0.$$

The currents, $I_{b1}/I_{b2}$, and $I_c$, can be expressed as:

$$\begin{aligned} I_{b1} &= I_{b2}/\sigma \\ &= 0 \end{aligned} \tag{14}$$

-continued $$I_c = (I_{c,bo}/\beta_{bo}) \cdot \beta.$$

Since BAs are turned off, the efficiency of overall PDLMBA can be equal to the efficiency of the CA.

(2) LM Region (PMAX/OBO≤POUT<PMAX): When the power increases to the target OBO level, the BA1 and BA2 can turn on, and the CA can reach saturation at the same time. At PMAX/OBO, the CA can be designed to be only voltage-saturated (Zc>ZCA,Opt) corresponding to the first efficiency peak, while there can be headroom for further increase of CA current. In this region, BA1 and BA2 currents can increase proportionally given by $$I_{b1} = i_{ba1,h}[1]$$

$$I_{b2} = \sigma \cdot i_{ba1,h}[1], \tag{15}$$

By substituting this dependence into (2) and (3), the load modulation behaviors of BA1, BA2, and CA impedances can be derived as:

$$Z_{b1,LM} = Z_0\left(\sigma + \frac{\sqrt{2}\, I_c e^{j\theta}}{I_{b1}}\right) \tag{16}$$

$$Z_{b2,LM} = Z_0\left(\left(2 - \frac{1}{\sigma}\right) + \frac{\sqrt{2}\, I_c e^{j\theta}}{\sigma I_{b1}}\right)$$

$$Z_{c,LM} = Z_0\left(1 - \frac{\sqrt{2}\, I_{b1}(1-\sigma)}{I_c e^{j\theta}}\right).$$

The above equation clearly underlines that by setting $\sigma<1$ (larger BA1 sizing), $Z_c$ can be modulated below Z0 as the power increases beyond OBO. Such a decreasing $Z_c$ is achieved given the fact that BA1 current ($I_{b1}$) can rise much more sharply after turning on as compared to $I_c$ (i.e., $I_{b1}/I_c$ increases with power). Meanwhile, due to the CA LM, the CA current at the predefined OBO ($I_{c,bo}$) can be expected to gradually increase to the full current saturation, that is $I_{c,max}=\alpha I_{c,bo}$. Similar to the DEPA, this LM-induced CA current increase is assumed to be linearly dependent on the driving level, β, given by $$I_c = I_{c,bo}\left(\frac{\alpha-1}{1-\beta_{bo}}\beta + \frac{1-\alpha\beta_{bo}}{1-\beta_{bo}}\right). \tag{17}$$

The CA current with a reduced carrier LM ratio of $\alpha=1.5$ is plotted in FIG. 7. Compared to DPA with full LM ratio of $\alpha=2$, the CA current of PD-ALMBA increases with different slopes in different regions.

(3) Saturation Region ($P_{OUT}=P_{MAX}$): When the output power reaches the maximum, CA and BA are fully saturated at the same time. The currents of all amplifiers reach to their maximum value, which can be expressed as:

$$I_{b1} = I_{b1,max} \tag{18}$$

$$I_{b2} = \sigma \cdot I_{b1,max}$$

$$I_c = I_{c,max} = \alpha \cdot I_{c,bo}.$$

In this saturated region, $I_c$, will expand to $\alpha \cdot I_{c,max}$ due to CA-LM. Since CA bias voltage remains constant, $Z_c$ will decrease from $Z_0$ to $Z_{0/\alpha}$. The load impedances of BA1, BA2, and CA can be given by:

$$Z_{B1,SAT} = Z_0\left(\sigma + \frac{\sqrt{2}\, I_{c,max} e^{j\theta}}{I_{b1,max}}\right) \tag{19}$$

$$Z_{B2,SAT} = Z_0\left(\left(2 - \frac{1}{\sigma}\right) + \frac{\sqrt{2}\, I_{c,max} e^{j\theta}}{\sigma I_{b1,max}}\right)$$

$$Z_{c,SAT} = Z_0\left(1 - \frac{\sqrt{2}\, I_{b1,max}(1-\sigma)}{I_{c,max} e^{j\theta}}\right) = \frac{Z_0}{\alpha}.$$

The carrier LM of PD-ALMBA can be set as a continuum between PD-LMBA ($\alpha=1$) and DPA ($\alpha=2$), depending on the target need for over-driving reduction of CA and the overall PD-ALMBA performance. Based on the above theoretical analysis, the amplitude and phase control between three amplifiers BA1, BA2, and CA can govern their LM behaviors and the general operation of the PD-ALMBA, which will be analyzed in detail in the following Section II-D.

Different from the generic LMBA, the amplitude control of ALMBA involves not only the BA-CA scaling ($I_c/I_{b1}$) but also can involve the BA1-BA2 scaling (σ), as indicated by (16). In the PD-ALMBA operation, BA1 and BA2 can be turned on at a predetermined back-off power, where CA reaches its voltage saturation. After all amplifiers are fully saturated, the total saturation power in combination of BA1, BA2, and CA can be scaled proportionally, that is $OBO_{dB}$ dB higher than the back-off level. Based on the ideal model in FIGS. 6A-6B, the power scaling ratio between BA1, BA2, and CA can be determined by $$\frac{1}{2} OBO \cdot \left(\frac{I_{c,max}}{\alpha}\right)^2 \cdot Z_0 = \frac{1}{2} I_{c,max}^2 \cdot \frac{Z_0}{\alpha} + \frac{1}{2} I_{b1,max}^2 \cdot R_{b1,max} + \frac{1}{2} I_{b2,max}^2 \cdot R_{b2,max}. \tag{20}$$

Figure 8:
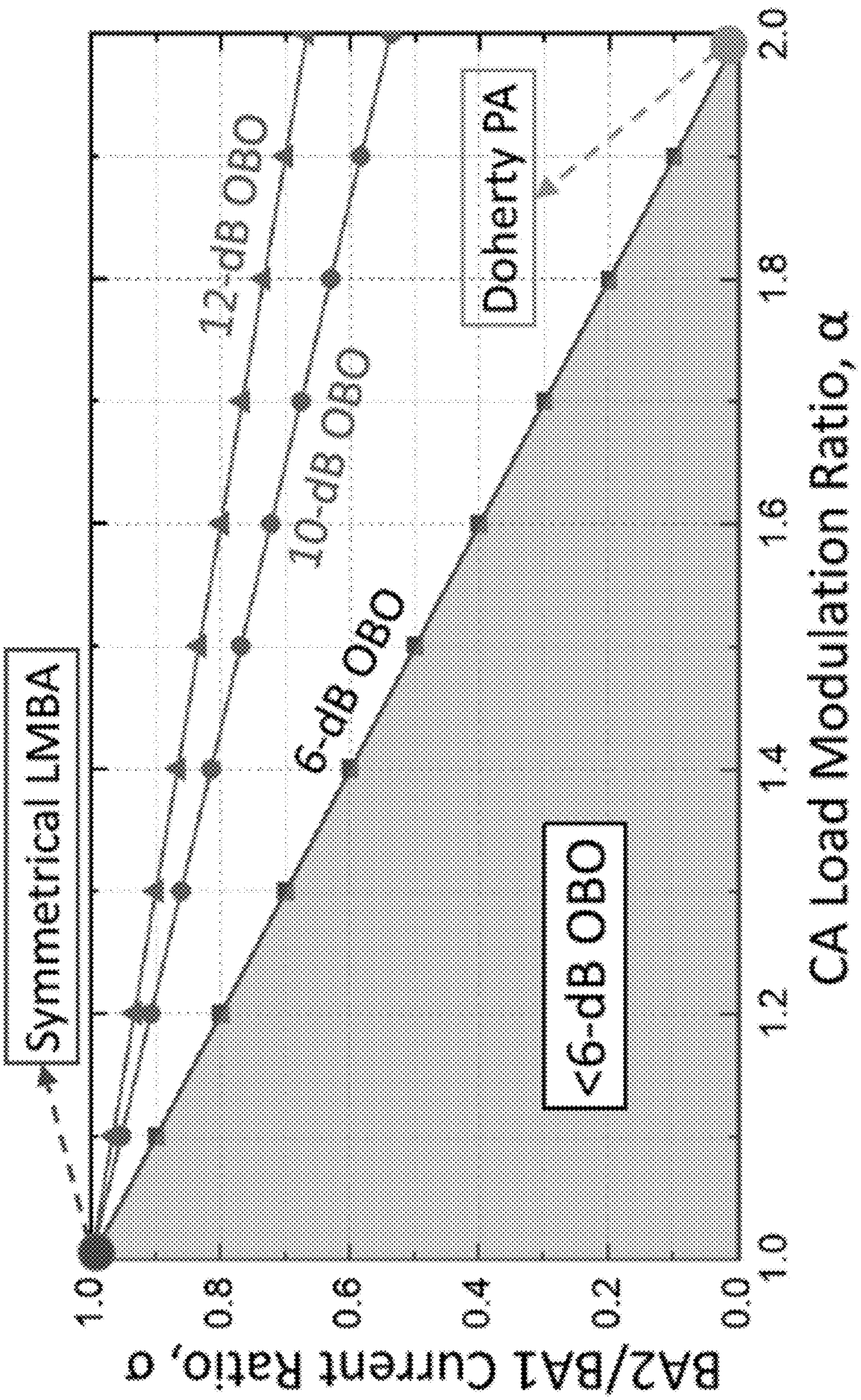
FIG. 8 illustrates dependence between a and a various given target OBO according to another implementation described herein.
Figure 9A:
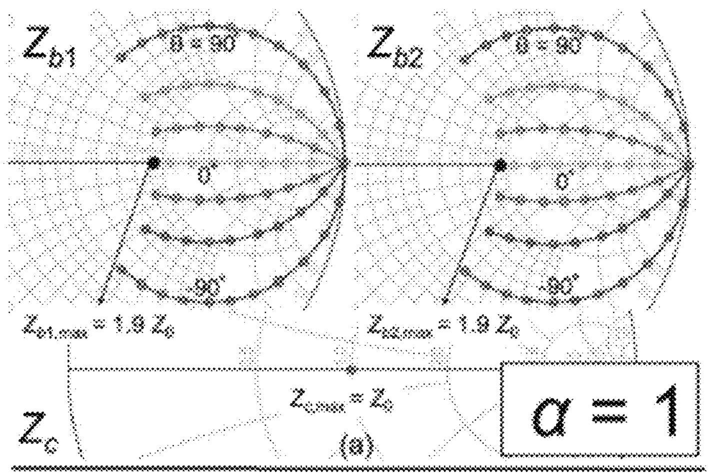
FIGS. 9A-9C illustrate a continuum of BA1, BA2, and CA LMs using the ideal generalized model for OBO=10 dB and various CA-LM ratio, α according to another implementation described herein.
Figure 9B:
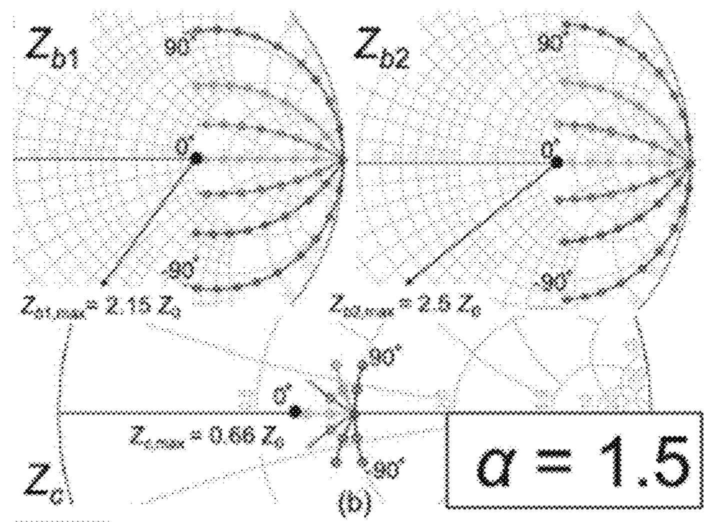
Figure 9C:
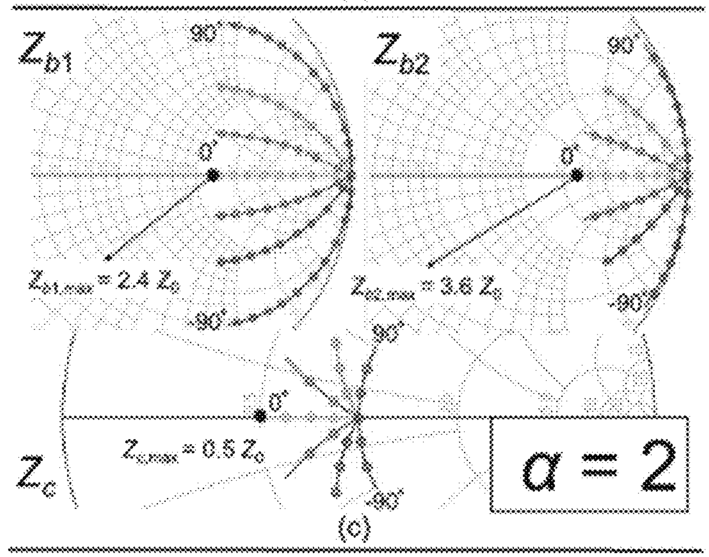

The dependence between a and a under different target OBO ranges can be derived with a combination of (19), (18), and (20), and the results are graphically presented in FIG. 8. As illustrated in FIG. 8, $I_{b2}=0$ is required to result in 6 dB of OBO and 2 of LM ratio, indicating the fact that the PD-ALMBA is converged to a standard DPA with the quadrature coupler functioning as an ideal Doherty combiner. The upper right half region of FIG. 8 marks the extended OBO range (>6 dB) that can be utilized in practical designs for amplification of high-PAPR signals. In addition to amplitude control, it is necessary to ensure that the phase difference between the current generators is properly set to result in optimal LM trajectories of each amplifier. As described in (16), by setting $\vartheta=0$, a purely resistive LM of $Z_{b1}$, $Z_{b2}$, $Z_c$ can be achieved, which can represent an optimal LM behavior according to the load-line theory, according to some implementations of the present disclosure. FIGS. 9A-9B show the analytically calculated LM trajectories of BA1, BA2, and CA for variations of phase offset ($\vartheta$) and CA LM ratio (α) under a constant OBO of 10 dB. All the LM traces can be maintained on the real axis of Smith chart for $\vartheta=0$. In realistic design with matching networks and parasitics of transistors, the optimal BA-CA phase offset will be determined through exhaustive sweeping in the actual circuit schematic. In summary, this section articulates a unified theory of quadrature-coupler-based amplifier with active LM of three different driving sources. The equations derived in this section prove that the asymmetry between BA1 and BA2 not only maintains the validity of LMBA architecture in FIGS. 6A-6B, but also leads to a continuum LM ratio of CA. Moreover, the LM of BA1, BA2, and CA can be performed individually in this PD-ALMBA topology, which is able to inherit the wideband and high-efficiency characteristics of symmetrical PD-LMBA. Meanwhile, the reduced CA over-driving leads to promising potential of improved linearity and reliability.

Example 2

An implementation of an ideal PD-ALMBA is emulated using bare-die GaN transistors and ideal quadrature couple was developed. The bare-die devices have minimized parasitics, which can closely mimic the behaviors of the ideal current generators in FIGS. 6A-6B.

Figure 10:
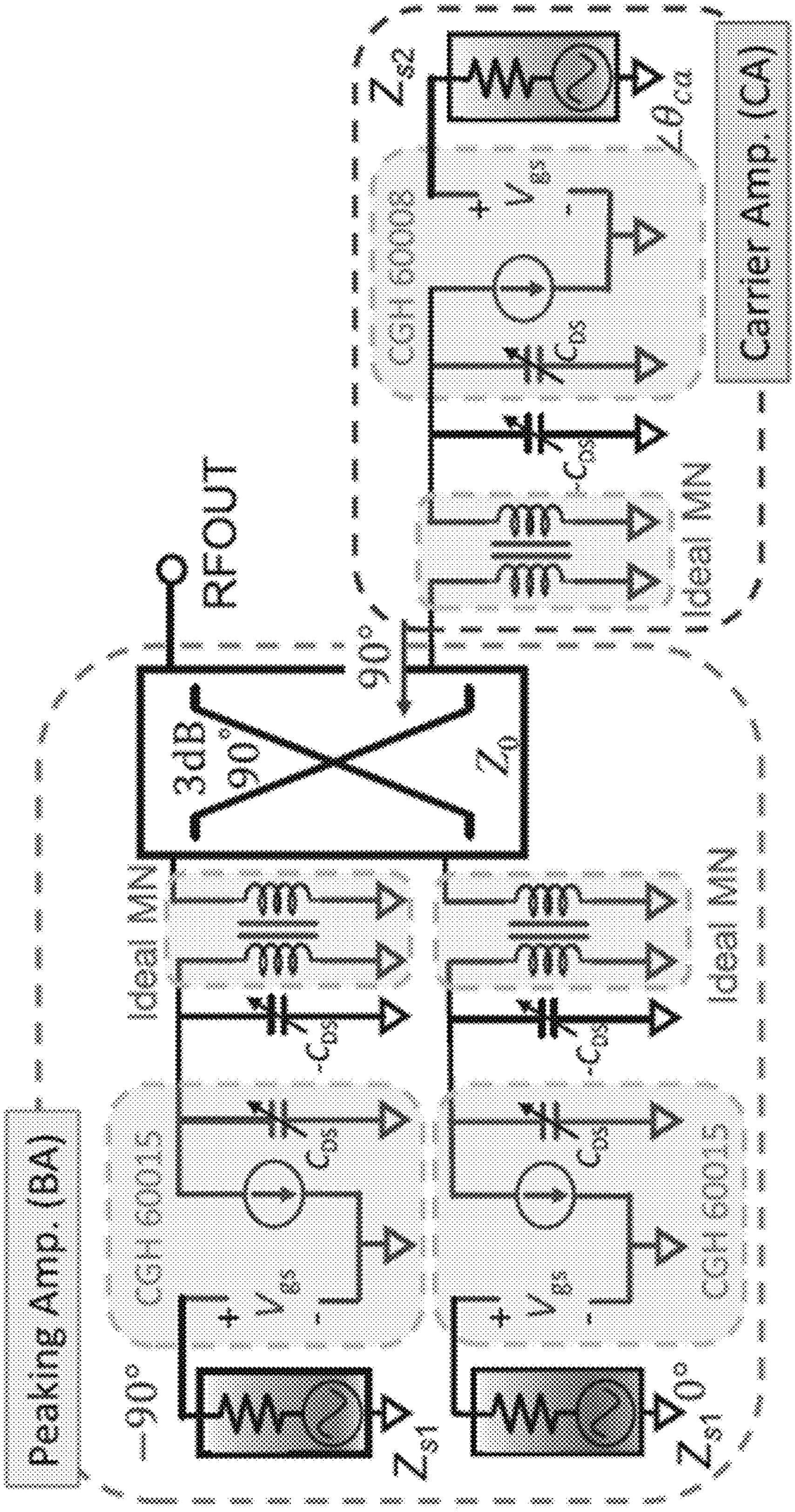
FIG. 10 illustrates Emulated model setup of the proposed PD-ALMBA with bare-die GaN transistors according to another implementation described herein.

Two different types of bare die transistors are used to establish the emulated ideal PD-ALMBA, as shown in FIG. 10. Specifically, BA1 and BA2 were built with CGH60015 model from Wolfspeed. The CGH60015 is intended only as a non-limiting example, and the use of other transistors is contemplated by the present disclosure. The intrinsic parasitic capacitance of the transistors (CDS) can be de-embedded using a dedicated negative capacitance, $-C_{DS}$. Therefore, the combo of transistor and $-C_{DS}$ can emulate an ideal current source. The input impedances for BA1 and BA2 are set to Zs1 obtained using the source-pull. Due to the LM of CA as derived in (19), the impedances of BA1 and BA2 at saturation power (i.e., $Z_{b1,sat}$ and $Z_{b2,sat}$) are different from the coupler characteristic impedance ($Z_0$=50 ohm). To study the continuum of LM behavior ($\alpha$ from 1 to 2), the transformer design can be based on the symmetrical case ($\sigma$=1) in which Zb1, sat and Zb2,sat are matched to $R_{Opt}$ of the transistor. Then, the power asymmetry of BA1 and BA2 (i.e., $\sigma$<1) is realized by offsetting the bias voltages of BA1 and BA2 for practically achieving $\alpha$>1. The output of CA is connected to the isolation port of the coupler. Considering that the output power of CA is much less than the total output power of BA, the bare-die CGH60008 model from Wolfspeed was selected with a smaller device size. Again, the CGH60008 model is intended only as a non-limiting example of a transistor that can be used in implementations of the present disclosure. The input impedance of CA is set to Zs2, which is obtained from sourcepull simulation result. When CA impedance is modulated from Z0 to Z0/$\alpha$ at the coupler interface, the same LM range can be transformed to CA transistor by another ideal transformer with optimized transformation ratio based on the CA power and bias voltage. In some implementations, the CA transistor with reduced VDD desires ROpt,CA≈Z0, leading to a 1:1 transformer for CA.

According to FIGS. 6A-6B and (13), the ideal phase offset between BA1 ($I_{b1}$) and the control source power (CSP, $jI_ce^{j\vartheta}$) is 90° at the coupler interface plane, such that the resistive LM can be achieved by setting $\vartheta$=0'. Therefore, the CA input phase ($\vartheta_{CA}$) needs to be properly selected to ensure that a 90° phase offset is maintained at the coupler interface for BA1 path and CA path.

Figure 11A:
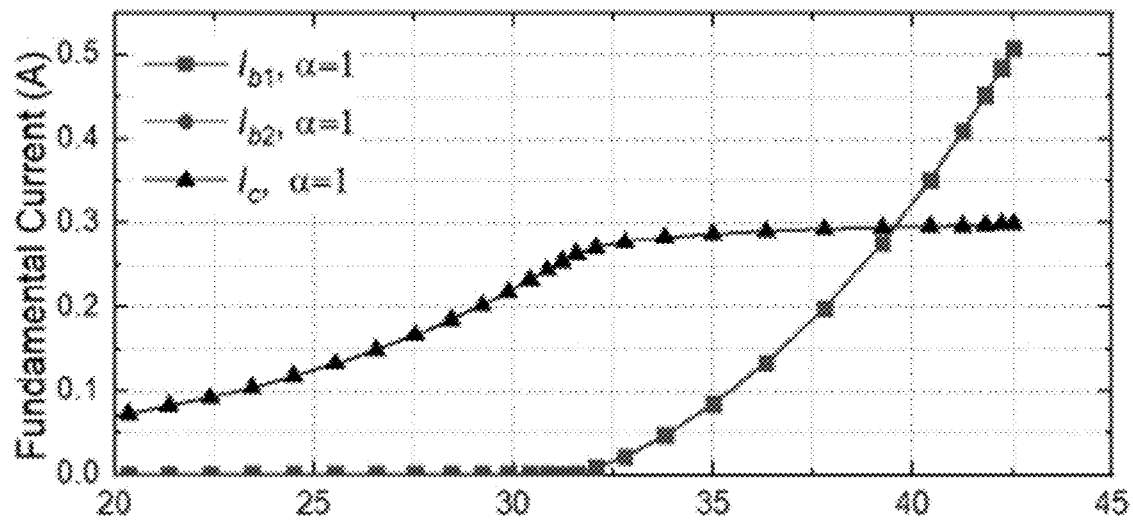
FIGS. 11A-11C illustrate Simulated BA1, BA2, and CA currents using emulated PD-ALMBA model at 1.7 GHz for different LM ratios where
Figure 11B:
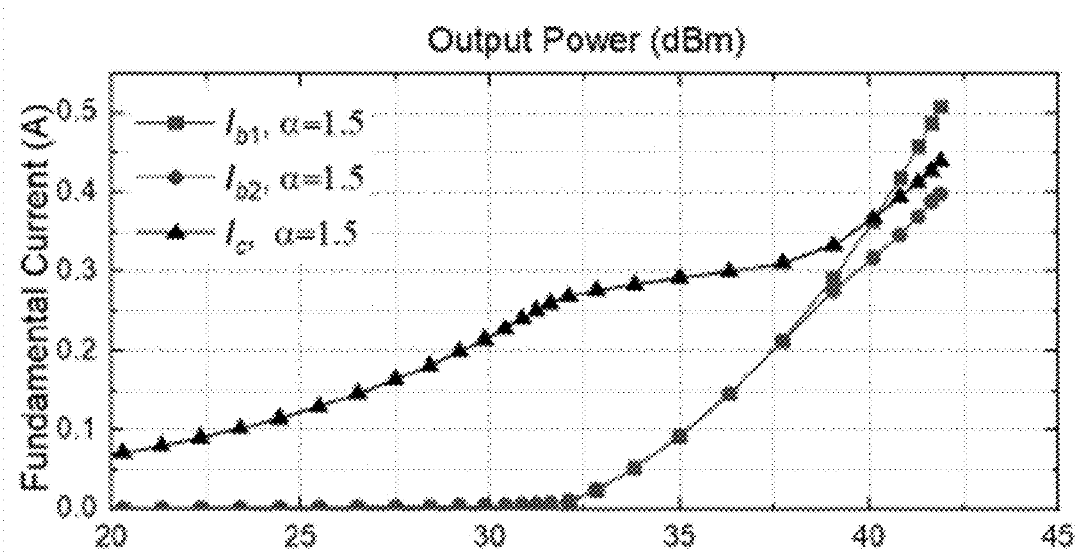
Figure 11C:
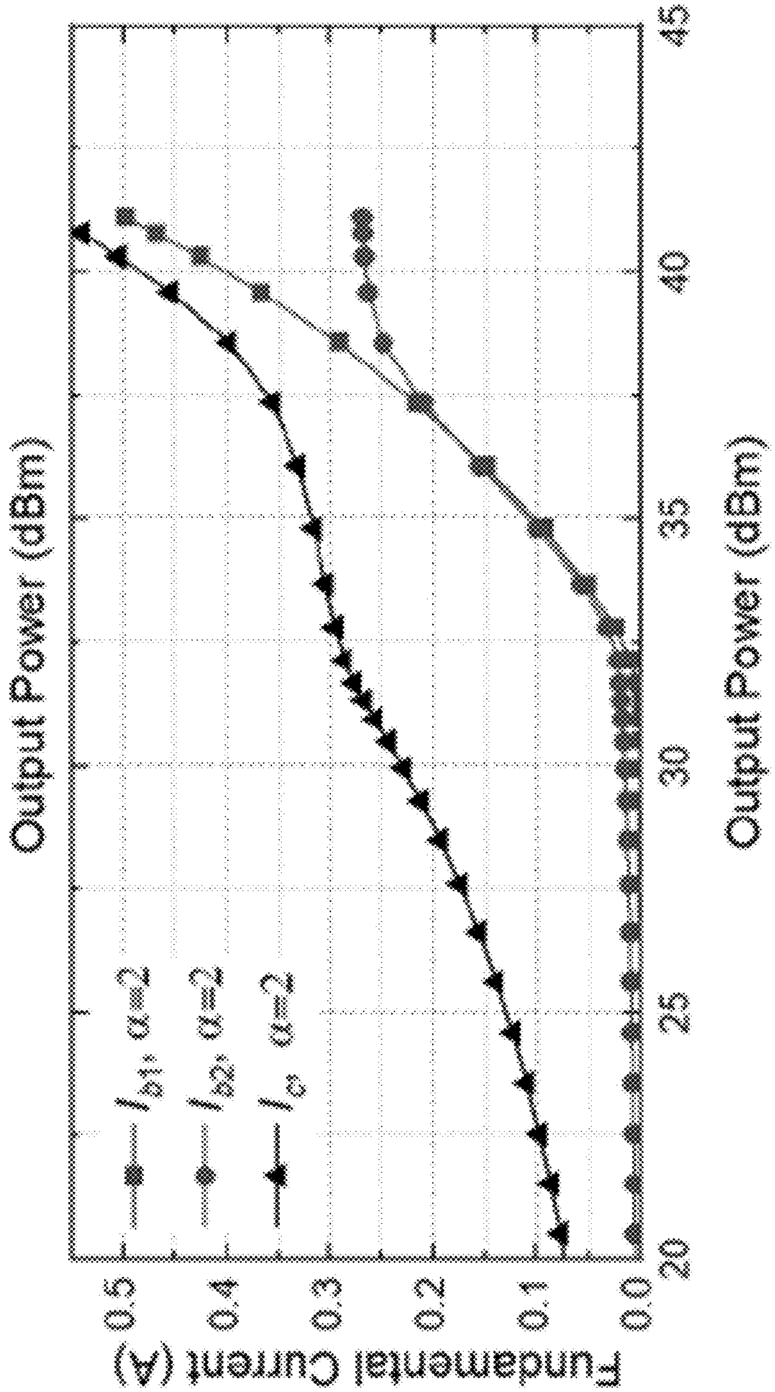
Figure 12A:
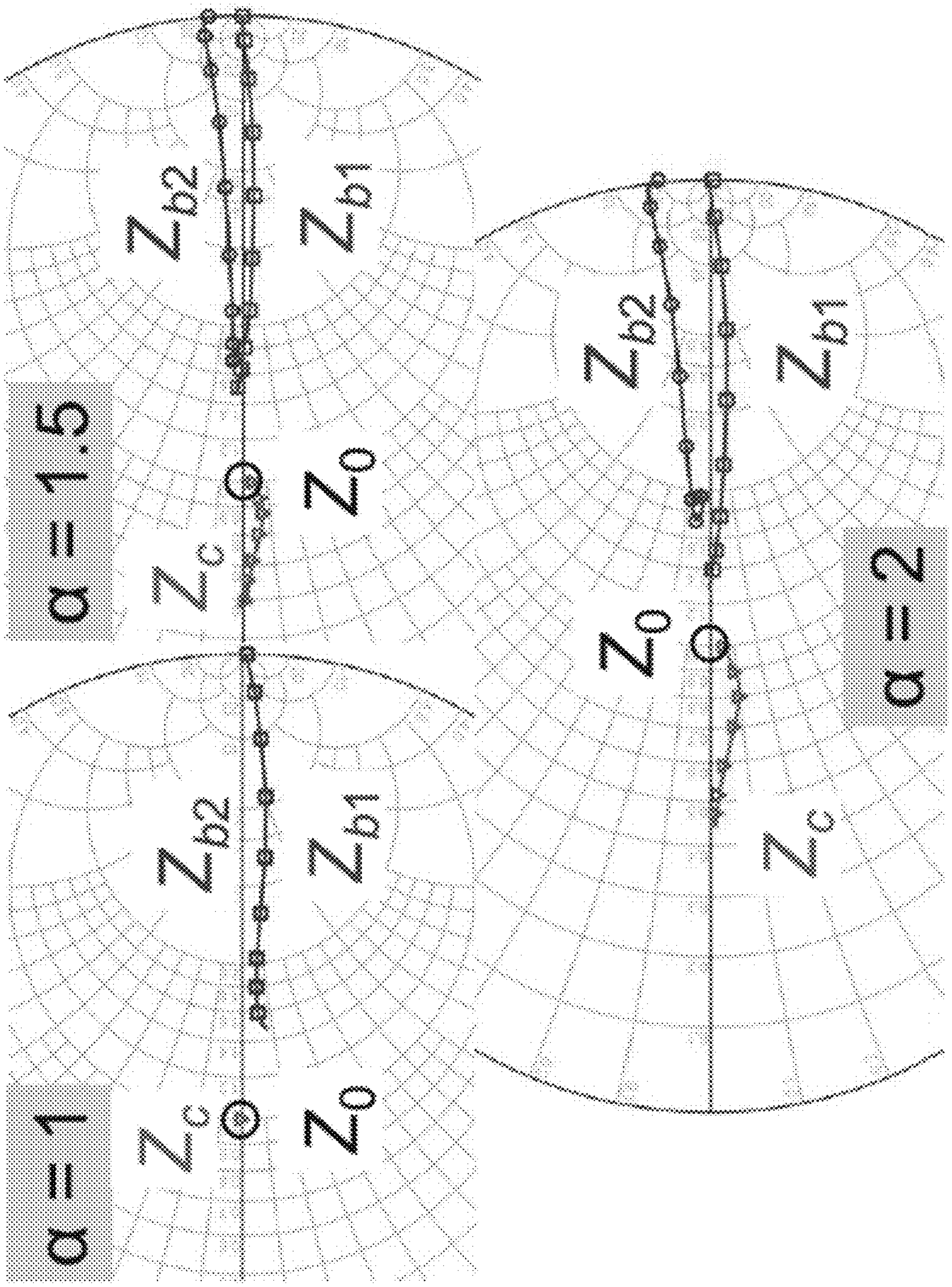
FIG. 12A illustrates simulated BA and CA LM trajectories of different a at 1.7 GHz using emulation PD-ALMBA model according to another implementation described herein.

FIGS. 11A-11C show the simulated fundamental current of the PD-ALMBA emulated model according to an implementation of the present disclosure with different $\alpha$ values. The simulation results in FIG. 11A illustrate how when $I_{b1}$ and $I_{b2}$ are identical, $\alpha$ can be equal to 1, and the CA can remains in the saturation region with constant $I_c$ beyond the back-off point. However, for $I_{b1}>I_{b2}$, $\alpha$ becomes greater than 1, and $I_c$ continues to increase after turning-on of BA, shown in FIGS. 11B and 11C. This PD-ALMBA model is able to alleviate the over-driving problem of CA. On the other hand, an excessively large value of $\alpha$ may also cause adverse effects for identical matching of BA1 and BA2. As observed in FIG. 11C with $\alpha$=2, $I_{b2}$ reaches saturation earlier than BA1, which may cause over-driving of BA2. While this can be solved by designing different transformers to BA1 and BA2, it may complicate the design since different matching networks can have different frequency response. Therefore, in actual circuit design in this article, $\alpha$≈1.5 is selected as the sweep spot of CA LM ratio. FIG. 12A shows the emulated model load trajectory of BA1, BA2, and CA with various $\alpha$ at 1.7 GHz. As seen from FIG. 12A, when $\alpha$=1, $Z_c$ equal to $Z_0$, and the maximum values of Zb1 and Zb2 are equal; when $\alpha$ is greater than 1, Zc is modulated along a resistive load trajectory in which the impedance decreases from $Z_0$ to $Z_{0/\alpha}$, while $Z_{b2,Sat}$ is greater than $Z_{b1,Sat}$.

Figure 12B:
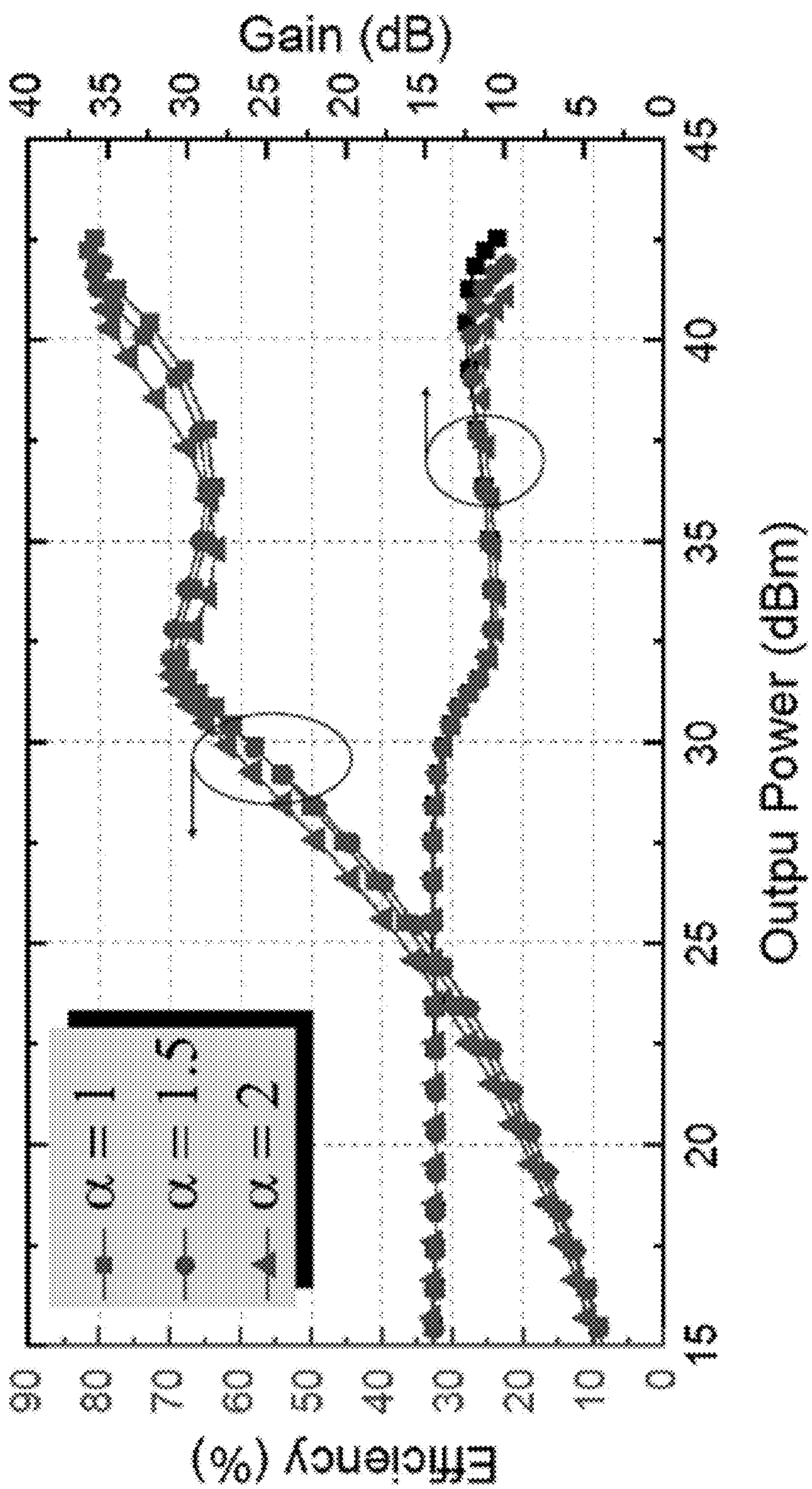
FIG. 12B illustrates Simulated power-swept efficiency of different α at 1.7 GHz according to another implementation described herein.

The simulation results are consistent with the theoretical derivation and implementations of the ALMBA/PD-ALMBA disclosed in example 1, above. FIG. 12B shows the simulated efficiency of different emulation models with different $\alpha$ at 1.7 GHz. The results show that in the example implementation the increase of LM ratio ($\alpha$) does not affect the overall output efficiency and gain on the basis of reducing CA over-driving.

Example 3

Figure 13:
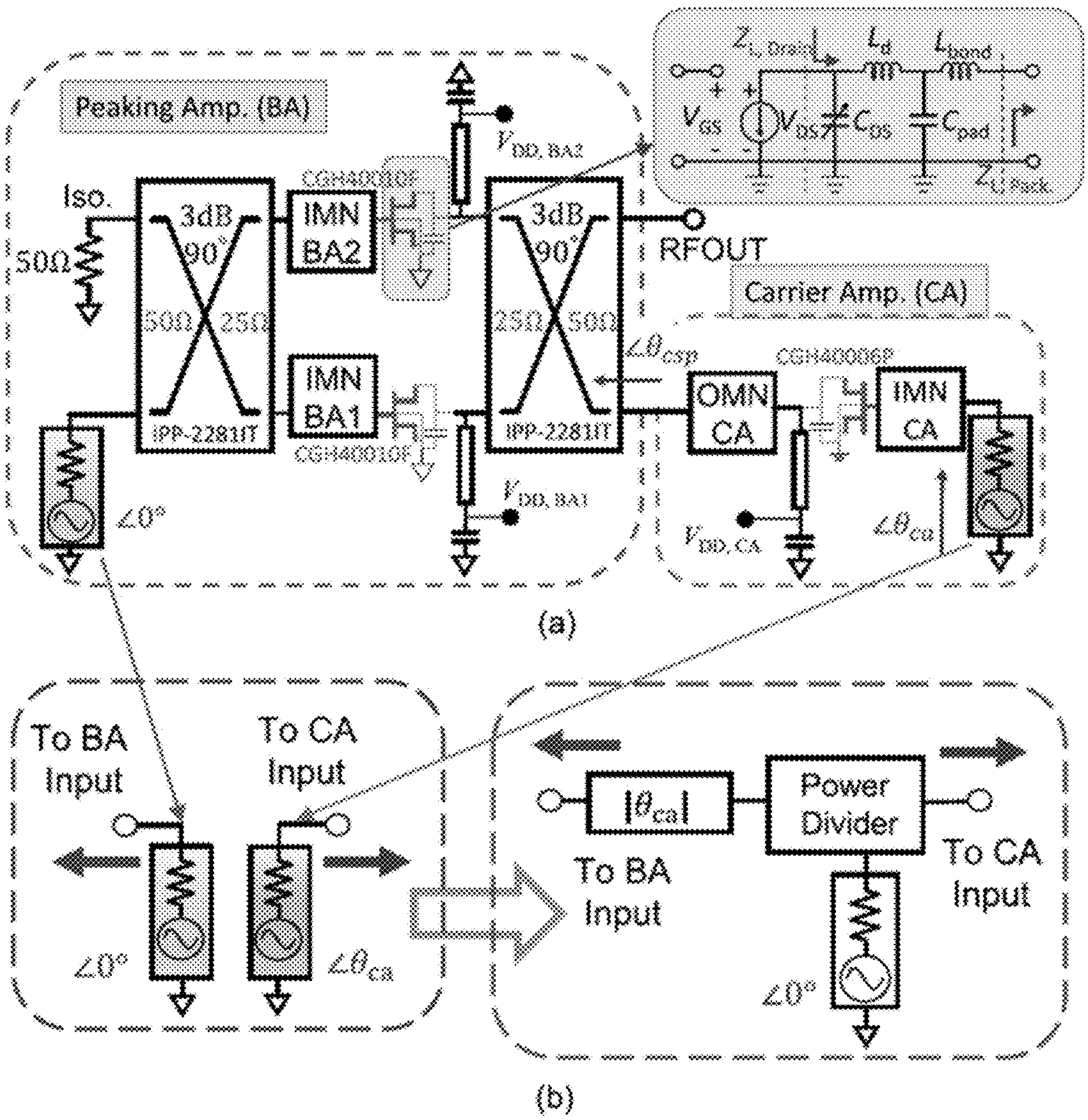
FIG. 13 illustrates a simulation setup of the proposed PD-ALMBA using realistic GaN transistors de-embedded with parasitic networks and design of TL-based wideband phase shifter for merging the BA and CA inputs according to another implementation described herein.

Another implementation of the present disclosure was evaluated based on the PD-ALMBA theory and emulation presented in the present disclosure. The LM ratio of CA, $\alpha$, can be directly related to the asymmetry of BA1 and BA2, $\sigma$, and the target OBO range. Considering a "sweet spot" of PD-ALMBA operation, a reduced CA LM ratio of $\alpha$=1.5 can be targeted in the practical design. To accommodate the high PAPR of emerging 4G and 5G signals, the target OBO is set to 10 dB. Two 10-W commercial GaN HEMTs (Wolfspeed CGH40010F) are used as the active devices for both BA1 and BA2, which are combined through two commercial quadrature couplers (IPP-22811T from Innovative Power Products). To achieve the target CA modulation, the BA2 power can be down-scaled from BA1 by reducing the BA2 supply voltage, which can be finally determined through circuit simulation. Due to the fact that the CA power can be much lower as compared to BA, the physical circuit of CA can be constructed using a 6-W GaN transistor (Wolfspeed CGH40006P), while the CA power is practically controlled with reduced VDD,CA in the actual circuit. The Wolfspeed CGH40006P should be understood as a non-limiting example of a suitable transistor and the use of other transistors is contemplated by the present disclosure. The overall realized circuit schematic is shown in FIG. 13. The target frequency range is 0.55 to 2.2 GHz, covering a majority of cellular communications bands.

Figure 14:
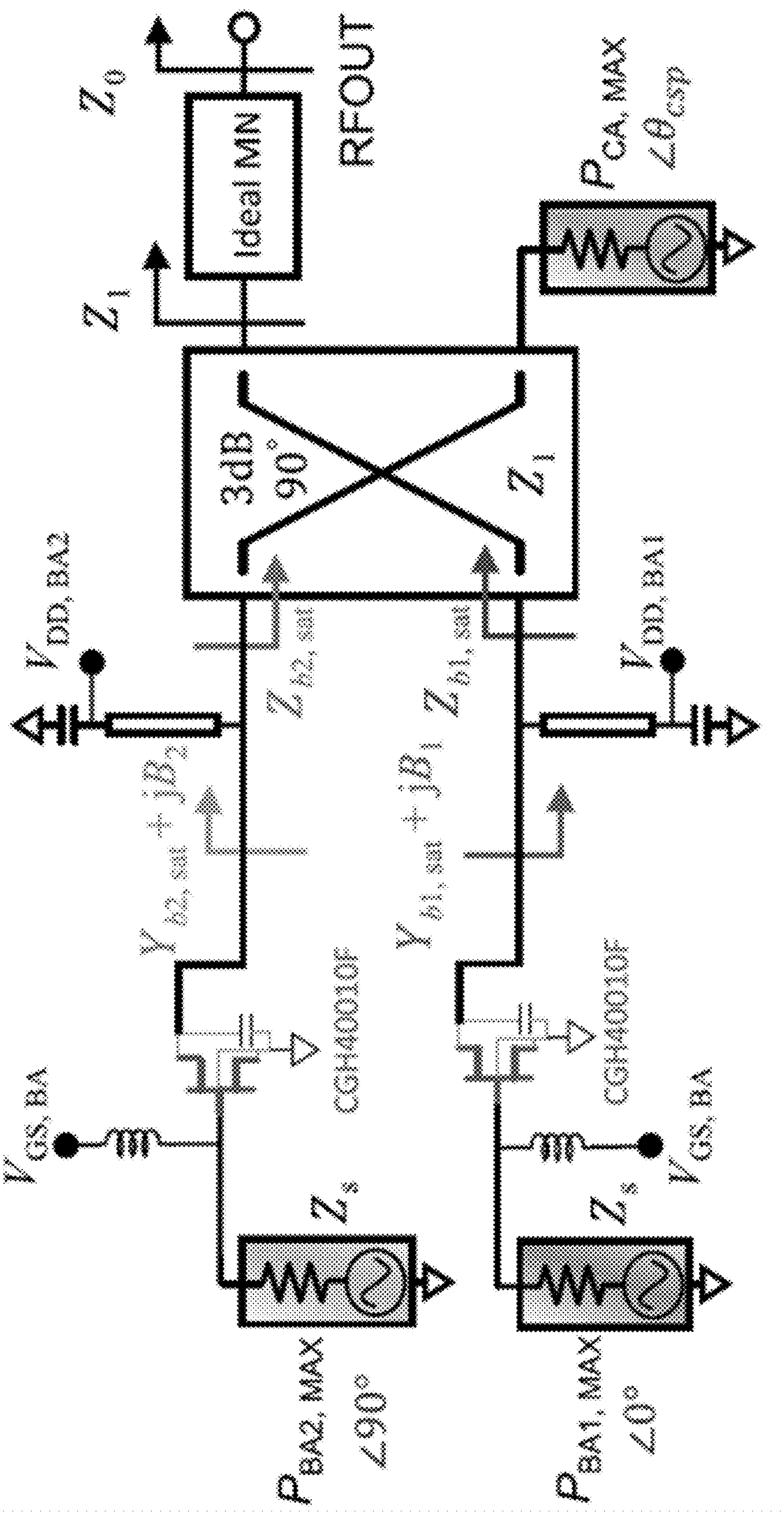
FIG. 14 illustrates BA matching design at maximum power according to another implementation described herein.

The wideband matching for the transistor can be realized with a wideband non-50-ohm-quadrature coupler and a bias line. As the schematic shown in FIG. 13 this circuit implementation of BA can eliminate the complex wideband output matching network, resulting in minimized dispersion effect and simplified load-modulation control. The packaged GaN transistor (e.g., CGH40010F) can desire a nearly constant real part of load admittance (YL=GL+j BL) over wide frequency range extracted from the load-pull simulation. According to the expressions of $Z_{b1,sat}$ and $Z_{b2,sat}$ in (19), BA1 and BA2 can see different impedances at the quadrature coupler plane with the contribution of CA. Therefore, to determine the characteristic impedance of the quadrature coupler, $Z_1$, co-simulation with CA can be required for some implementations, which can be modeled as an ideal source (CSP) with maximum CA power PCA,MAX ($=\alpha P_{MAX}/OBO$ as for estimation) at a proper phase. $Z_1$ is optimized such that $Y_{b1,sat}$ and $Y_{b2,sat}$ are both close to $G_{L,Opt}$. Since BA1 can generate the highest power, the optimization of $Y_{b1,sat}$ is given higher priority. The bias-line parameters (i.e., length and width) are utilized to provide dedicated values of BL for BA1 and BA2 over the target frequency range. The detailed design procedure is described in FIG. 14. The circuit simulation results show that $Z_1$ of 20-30 is the optimal value for covering the target frequency range. Therefore, a wideband impedance-transformer (2:1) coupler (IPP-2281IT, sold under the trademark Innovative Power Products) can be utilized to provide the desired BA matching. The same transformer coupler can be used for the input quadrature division of BA, leading to an eased transformation ratio of input matching, that is from 25 to the designated source impedance $Z_s$. The physical matching circuit can be realized using a multistage lowpass matching network. Since this design has two octave bandwidths, half of the frequencies have second harmonics in band. Therefore some implementations described herein can be not specifically designed for harmonic termination and instead can rely on saturation-mode for harmonic shaping. On the other hand, BA1 and BA2 in Class-C mode can be more efficient than CA in Class-AB, so in some implementations of the present disclosure harmonic matching is not necessary for BAs.

According to the amplitude control scheme described in Examples 1 and 2, above, the OBO power of CA can determine the dynamic range once the BA design is fixed. Given a specific OBO, the saturation power of CA can be determined by:

$$OBO \times \frac{P_{CA,MAX}}{\alpha} = | P_{BA1,MAX} + P_{BA2,MAX} + P_{CA,MAX}. \quad (21)$$

To achieve the target OBO of 10 dB, PCA,MAX should be around 7.5-dB below PBA1,MAX+PBA2,MAX. To realize this low output power, the CA is implemented with a 6-W GaN transistor (e.g. a Wolfspeed CGH40006P, which is intended only as a non-limiting example), and it is biased in Class-AB mode with partial $V_{DD}$. Since the CA is connected to the isolation port of the transformer coupler, the CA design is based on the 50-ohm reference impedance. With the target LM ratio of $\alpha$ set to 1.5, $Z_c$ (at the coupler plane) should be modulated from 50 to 33 as the power increases from 10-dB OBO to maximum, shown in FIG. 9B. The LM ratio of CA ($\alpha$) is determined by the asymmetry of BA1 and BA2, which is practically realized using the combination of: 1) fluctuation of quadrature coupler's transmission/coupling coefficients over frequency that is inevitable for wideband couplers, and 2) reduction of BA2 bias voltage. Thus, output matching of CA is required to transform this LM behavior from the coupler plane to the transistor package plane and eventually to the intrinsic drain plane. In the actual design of this article, a three-section transmission line matching network is designed, and the CA matching is eventually optimized through co-simulation with the designed BA.

The input matching network design of CA followed the same methodology as wideband input design of BA1 and BA2, and a three-section lowpass network based on transmission lines is designed to provide wideband input matching for the selected GaN transistor. Considering the complexity of the design and the dual-octave bandwidth, the harmonic control circuitry is not particularly included in this work. However, if certain harmonic matching is involved in CA design, it can potentially further improve the PD-ALMBA OBO efficiency.

Figure 15:
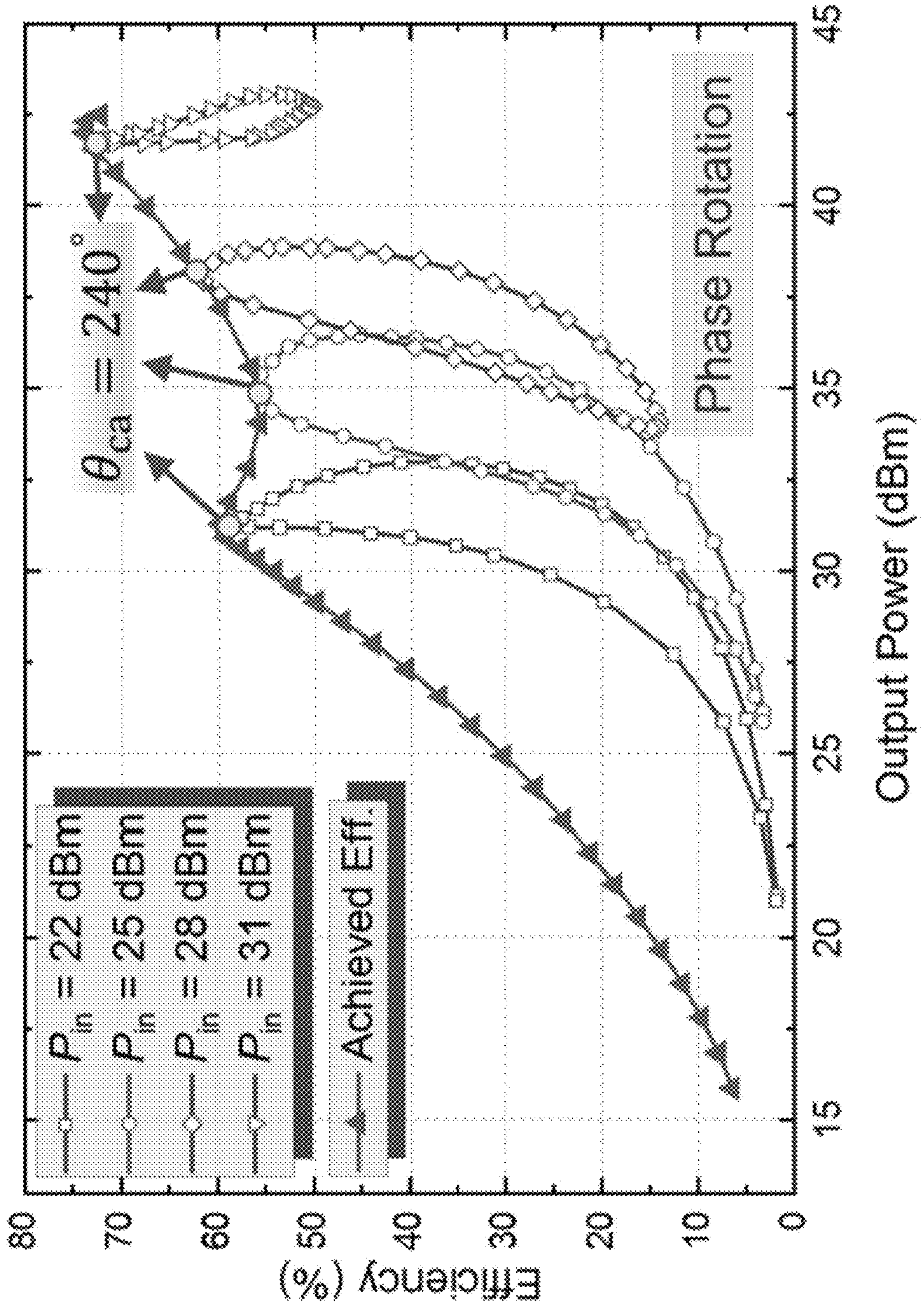
FIG. 15 illustrates determination of the optimal BA-CA phase offset based on dual input circuit schematic in FIG. 10 at 1.0 GHz through phase-swept input stimulus of CA power according to another implementation described herein.
Figure 16:
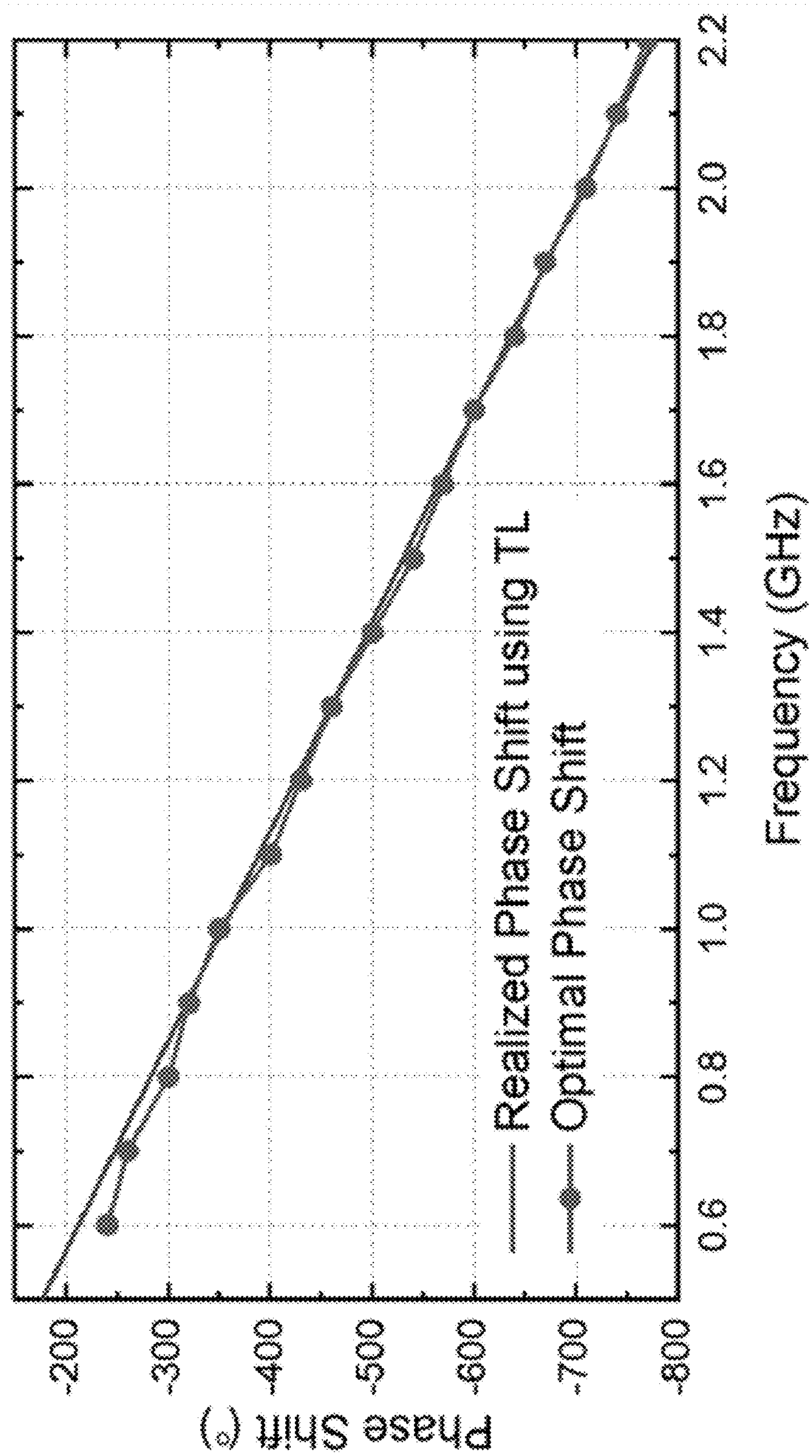
FIG. 16 illustrates simulated optimal BA1-CA phase offset at different frequencies according to another implementation described herein.

After finishing the design of BA1, BA2, and CA, the LM of all three amplifiers is mainly determined by the relative phase between BA1 and CA, as described in (16). To ensure the resistive LM of BA1, BA2, and CA for maximized back-off efficiency, the BA1-CA phase offset is required to be $\vartheta=0°$ (equivalent to $\vartheta_{CSP}=90°$) at the coupler plane. With the practical BA and CA incorporated with the coupler, the phase offset optimization is moved to the inputs of BA and CA, which can be determined using the dual-input (with equal amplitude) schematic shown in FIG. 15. It is worth noting that the optimal phase shift between BA and CA is almost linearly proportional to the frequency with a negative slope, as plotted in FIG. 16. Therefore, a 50-ohm transmission line (TL) can be used to achieve this frequency-dependent phase shift, thereby providing accurate wideband phase control. Given the fact that the relative phase between CA and BA is negative, the offset transmission line in the CA path can have a negative length, and can be functionally equivalent to placing a symmetrical TL with a positive length in the BA path. Using this TL phase shifter, and a standard wideband Wilkinson frequency divider can combine the dual inputs to a single RF input, as depicted in FIG. 13.

Figure 17:
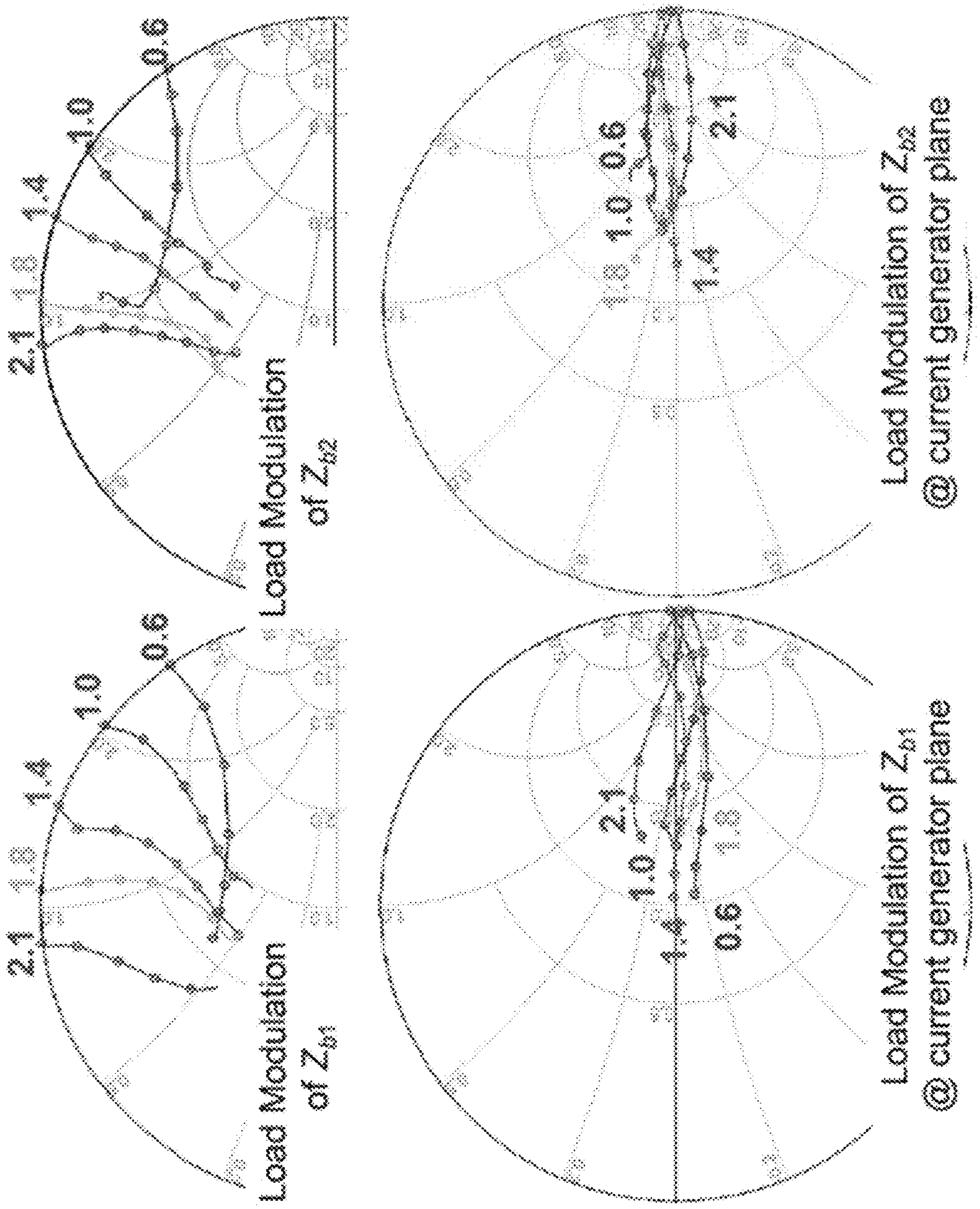
FIG. 17 illustrates load modulation (LM) of Zb1 and Zb2 across the entire bandwidth for α=1.5 according to another implementation described herein.
Figure 18:
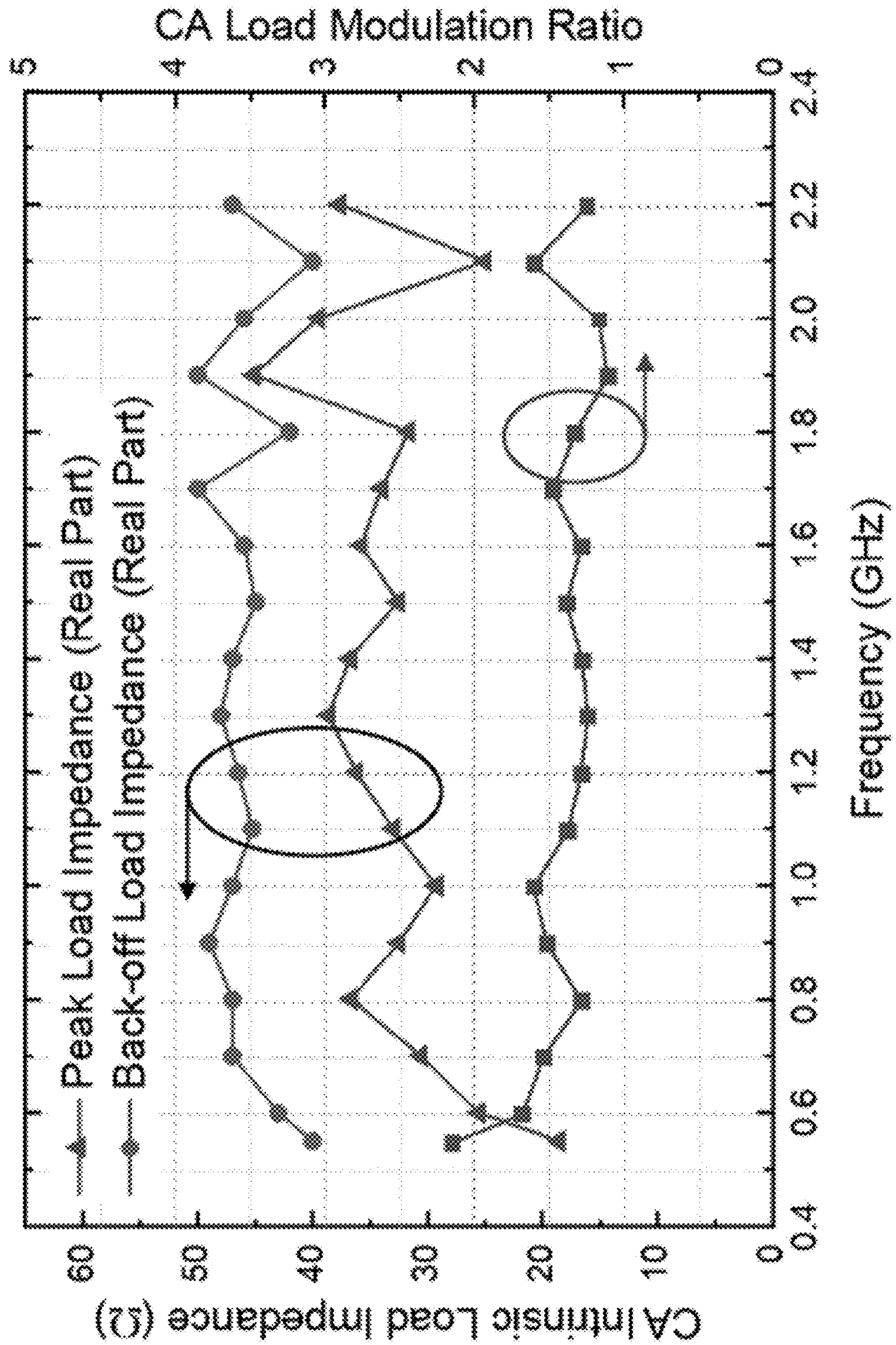
FIG. 18 illustrates simulated CA load-modulation behavior across the entire frequency band according to another implementation described herein.

To verify the wideband LM behaviors of all three amplifiers, the transistor parasitic network is modeled to access the intrinsic drain LM trajectory at the current generator plane, as shown in FIG. 17. The desired resistive LM trajectories can be achieved for BA1 and BA2 over the entire frequency range. The optimized real part impedances of CA (for PMAX and OBO) at the intrinsic drain plane are shown in FIG. 18, indicating that the target LM ratio of 1.5 can be achieved across the target band. The CA-LM trajectory travels nearly on the real axis with very small fluctuations, as shown in FIG. 12A, so the imaginary part changes of CA can be ignored.

Figure 19:
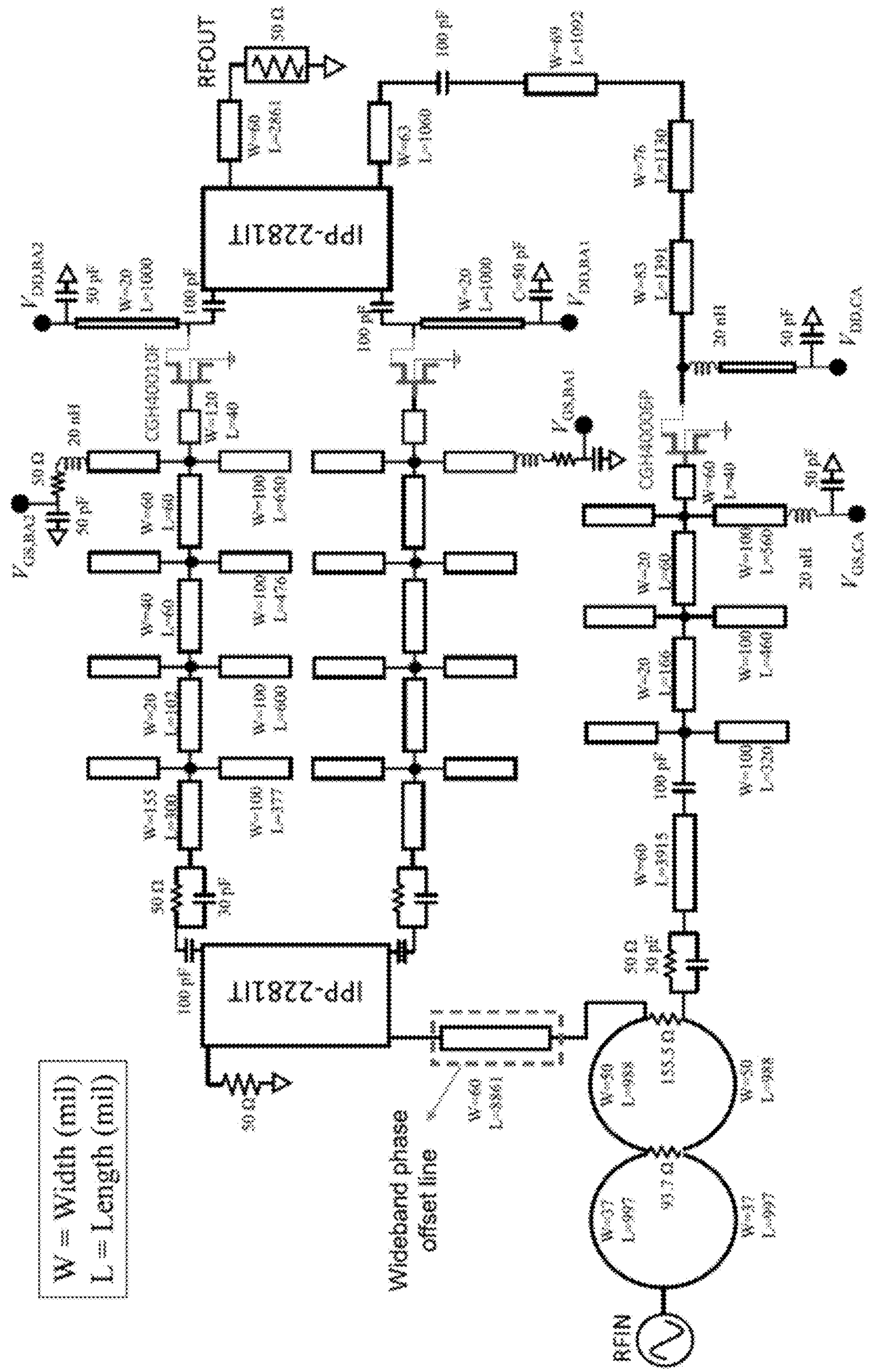
FIG. 19 illustrates a circuit schematic overview of designed PD-LMBA according to another implementation described herein.
Figure 20A:
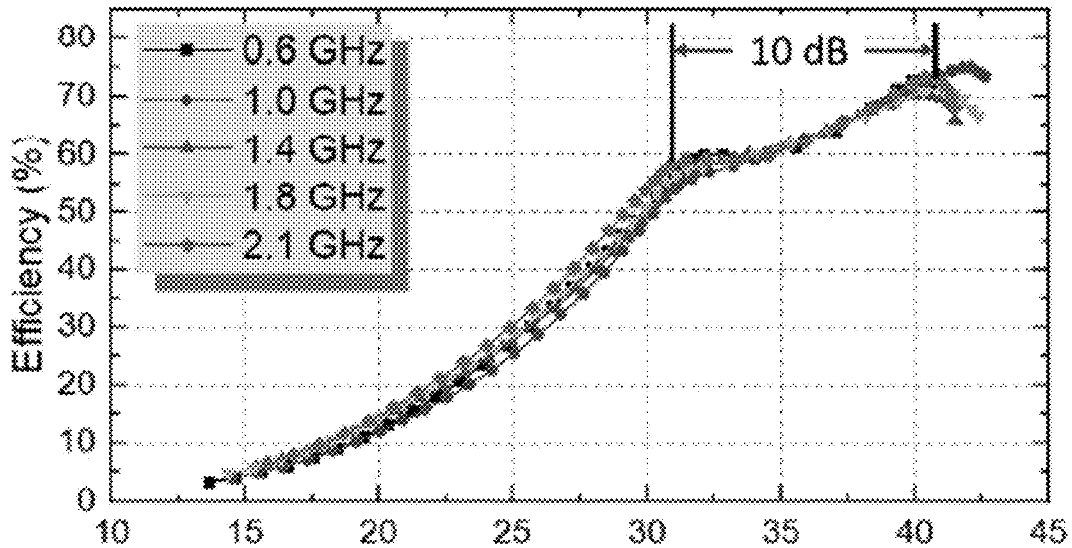
FIGS. 20A-20B illustrate power-swept CW simulation results of the designed PD-ALMBA with the best BA-CA phase setting at different frequencies.
Figure 20B:
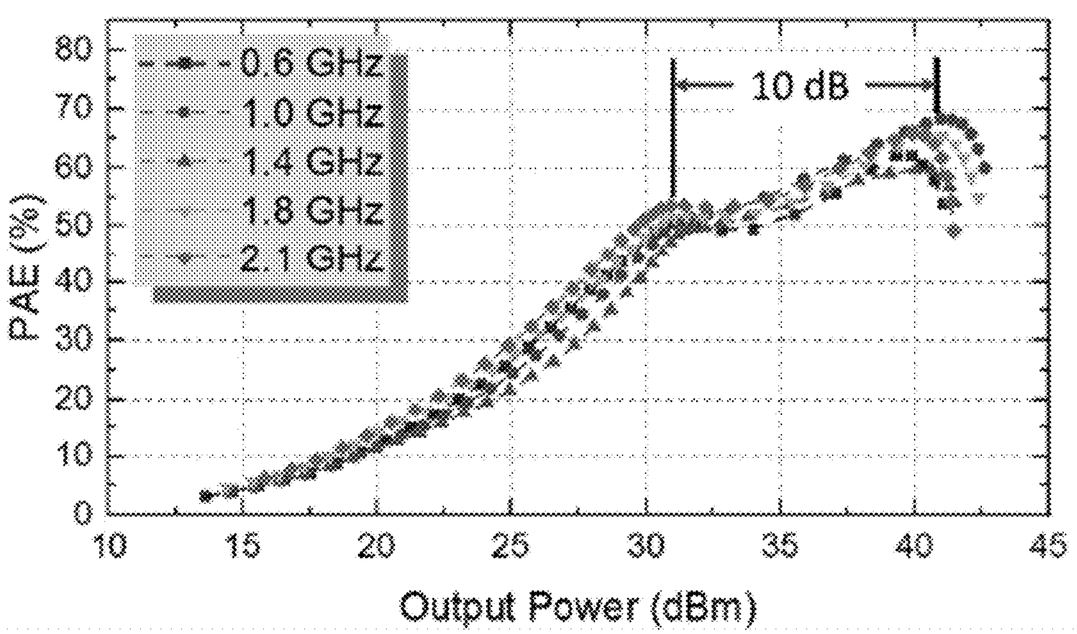

The finalized circuit schematic overview is shown in FIG. 19, and actual circuit-element values are exhibited next to the schematic. The gate bias voltages of BA1 and BA2 can be properly set such that they turn on around 10 dB power backoff, where the CA LM is performed concurrently. Through the design of the wideband BA1, BA2, CA, and phase shifter described in above sections, the overall efficiency and PAE of the PD-ALMBA are simulated with swept input power, as shown in FIG. 20. It is clearly seen that a high efficiency is achieved at the peak power, and the back-off efficiency is significantly enhanced down to 10-dB OBO. This Doherty-like efficiency and PAE profile can be well maintained overextended frequency range.

Figure 21:
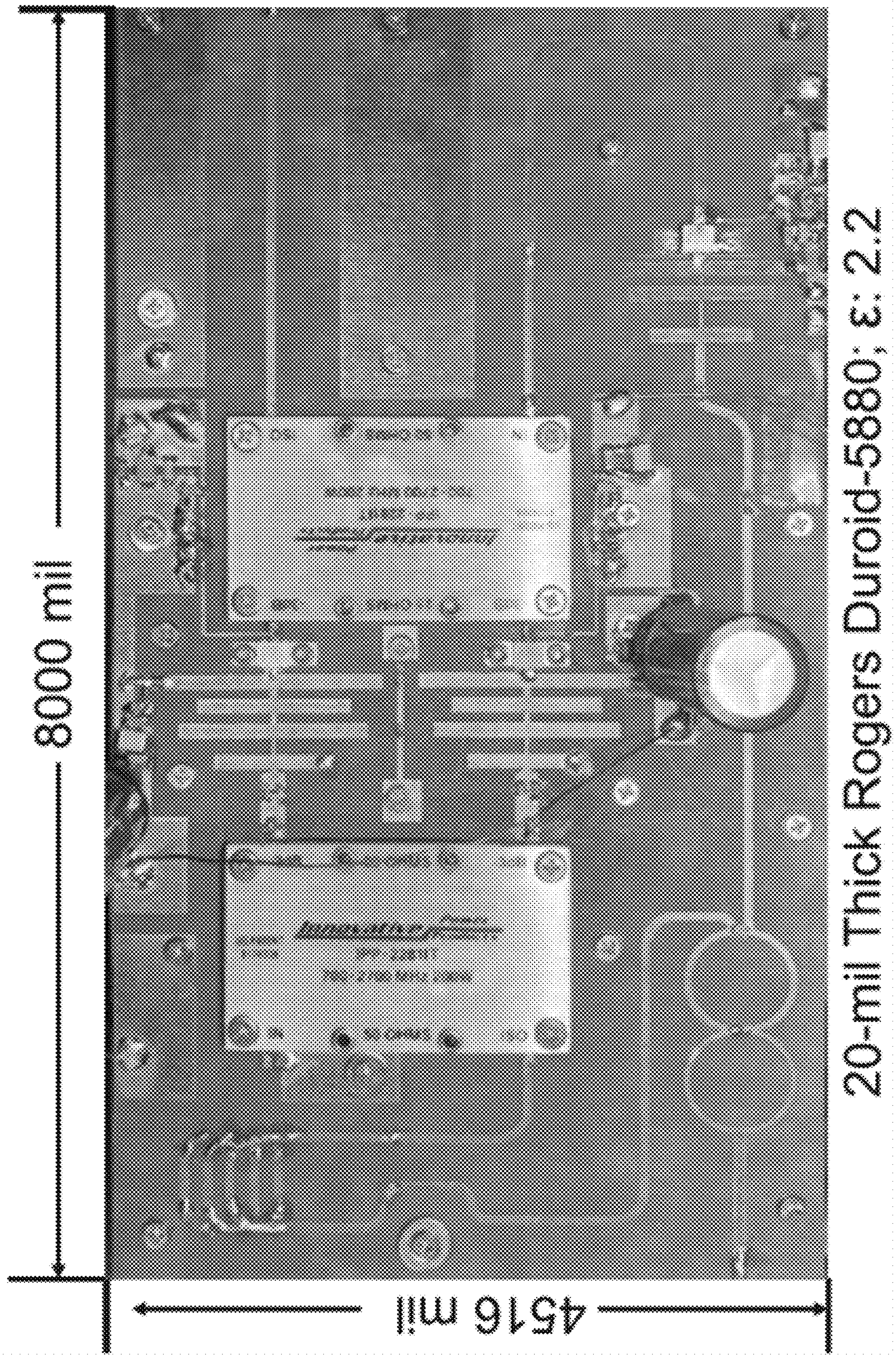
FIG. 21 illustrates a fabricated PD-ALMBA prototype according to another implementation described herein.
Figure 22A:
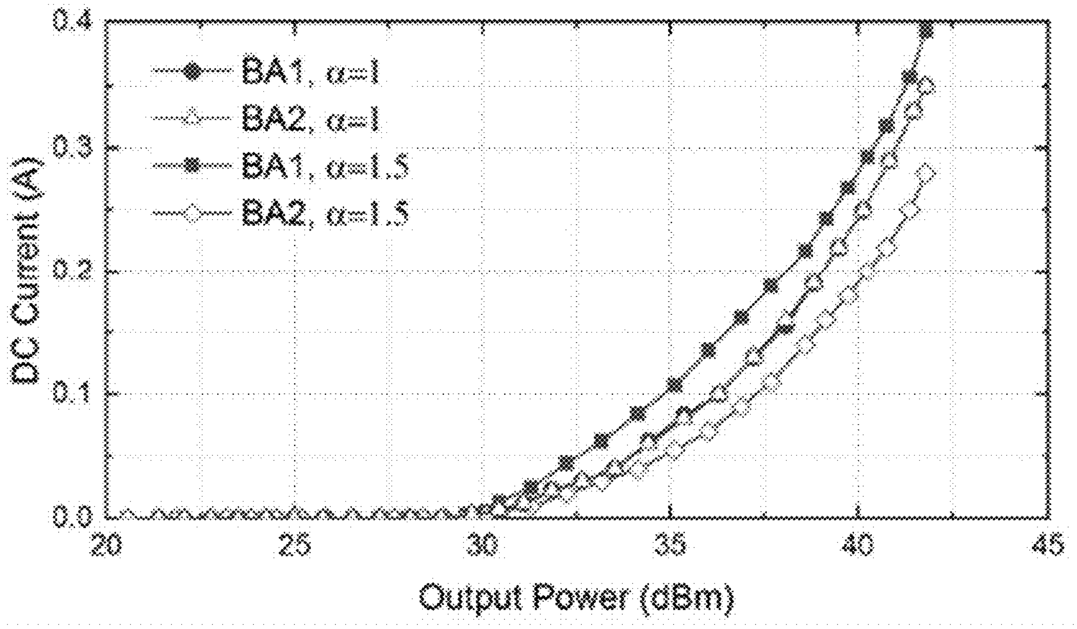
FIGS. 22A-22B illustrate measured drain dc current versus output power of BA1, BA2, and CA at 1.4 GHz.
Figure 22B:
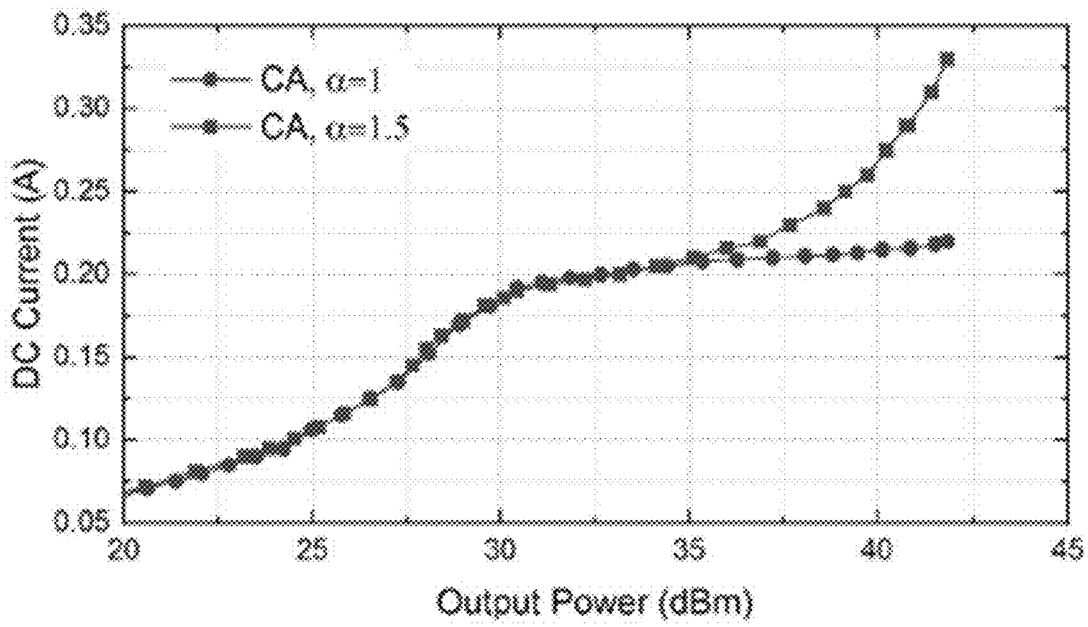

An implementation of the present disclosure including a PD-ALMBA was implemented on a 20-mil thick Rogers Duroid-5880 PCB board with a dielectric constant of 2.2. A photograph of the fabricated PD-ALMBA is shown in FIG. 21. The size of the entire circuit is 4.5 in×8 inch. The fabricated PD-ALMBA is measured using both continuous wave (CW) and modulated LTE signals. In this implemented circuit, CA is biased in Class-AB with a VDD,CA around 11 V. BA1 and BA2 are biased in Class-C with 32-V VDD,BA1 and 24-V VDD,BA2, respectively. Fine tuning of VGS,BA1 and VGS,BA2 between −5 and −4 V is performed at different frequencies to optimize the best power-added efficiency (PAE). FIG. 22A-22B shows drain dc currents versus output power from CW measurement for BA1, BA2, and CA, where a comparison is experimentally presented between symmetrical and asymmetrical cases. It can be clearly seen from FIG. 22B that the current of CA continuously increasing after the turning-on of BA for ALMBA. These results exhibit a solid validation of the propose ALMBA theory and well agree with the simulated fundamental currents using emulation model in FIGS. 11A-11C.

Figure 23:
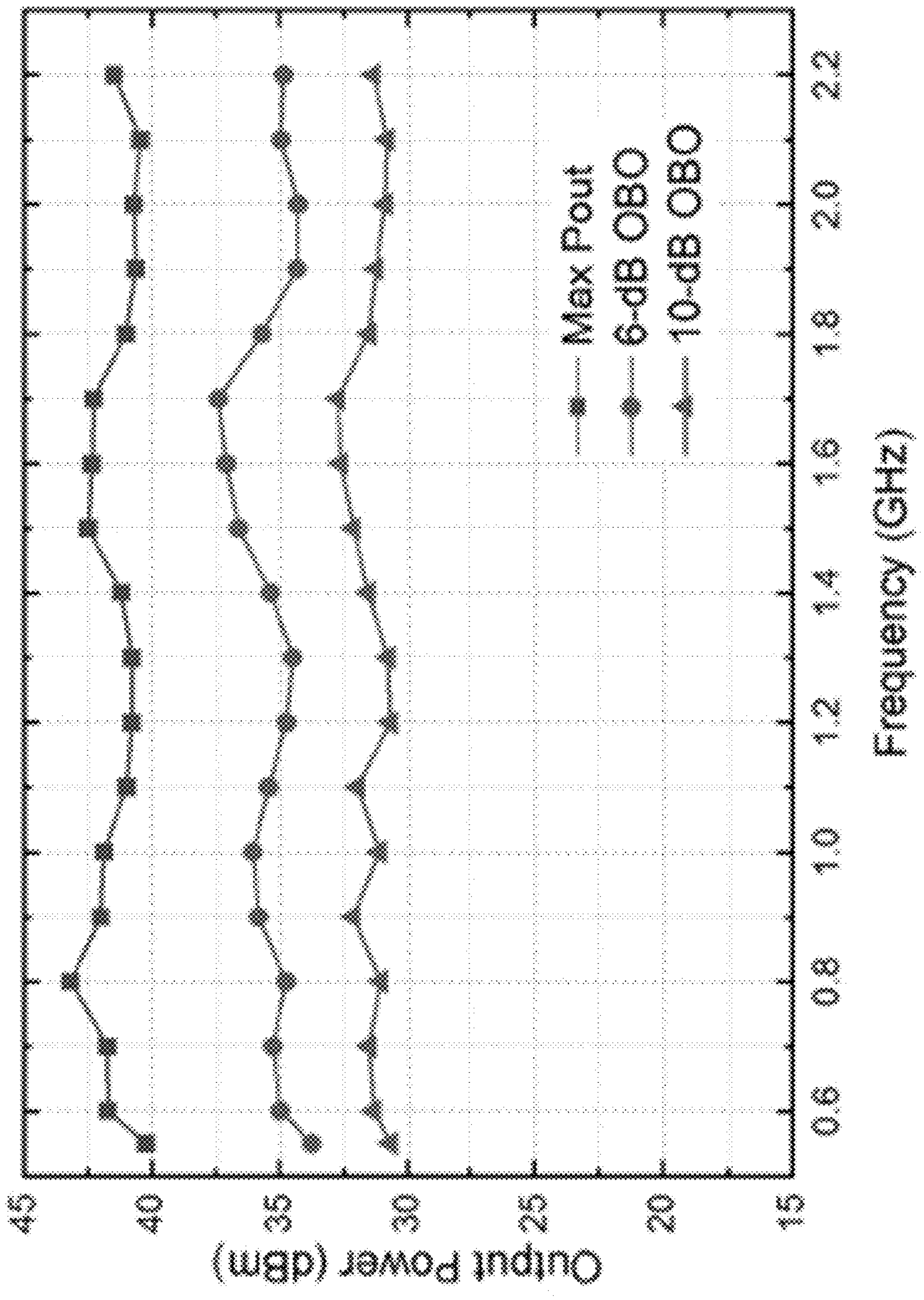
FIG. 23 illustrates measured output power at various OBO levels from 0.55 to 2.2 GHz.
Figure 24A:
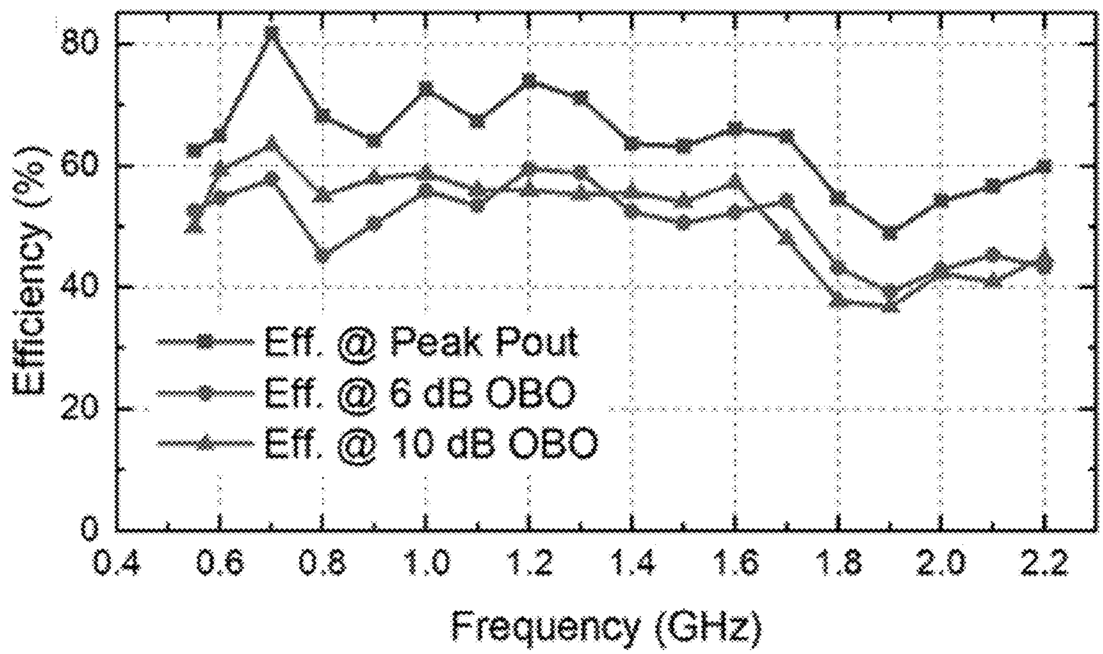
FIGS. 24A-24B illustrate performance at various OBO levels according to another implementation described herein.
Figure 24B:
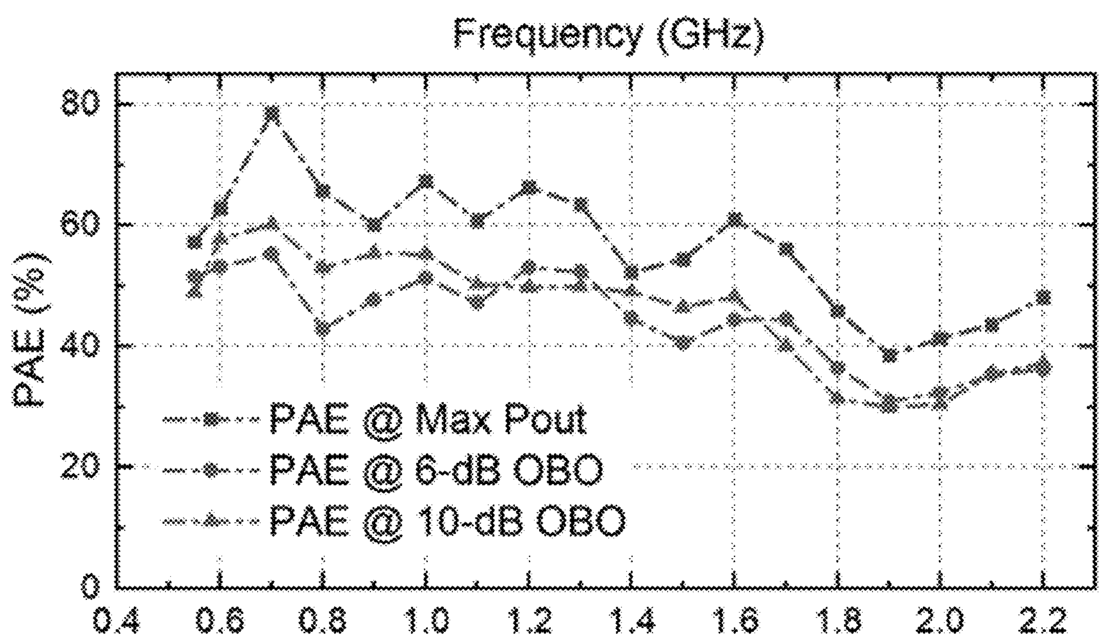
Figure 25:
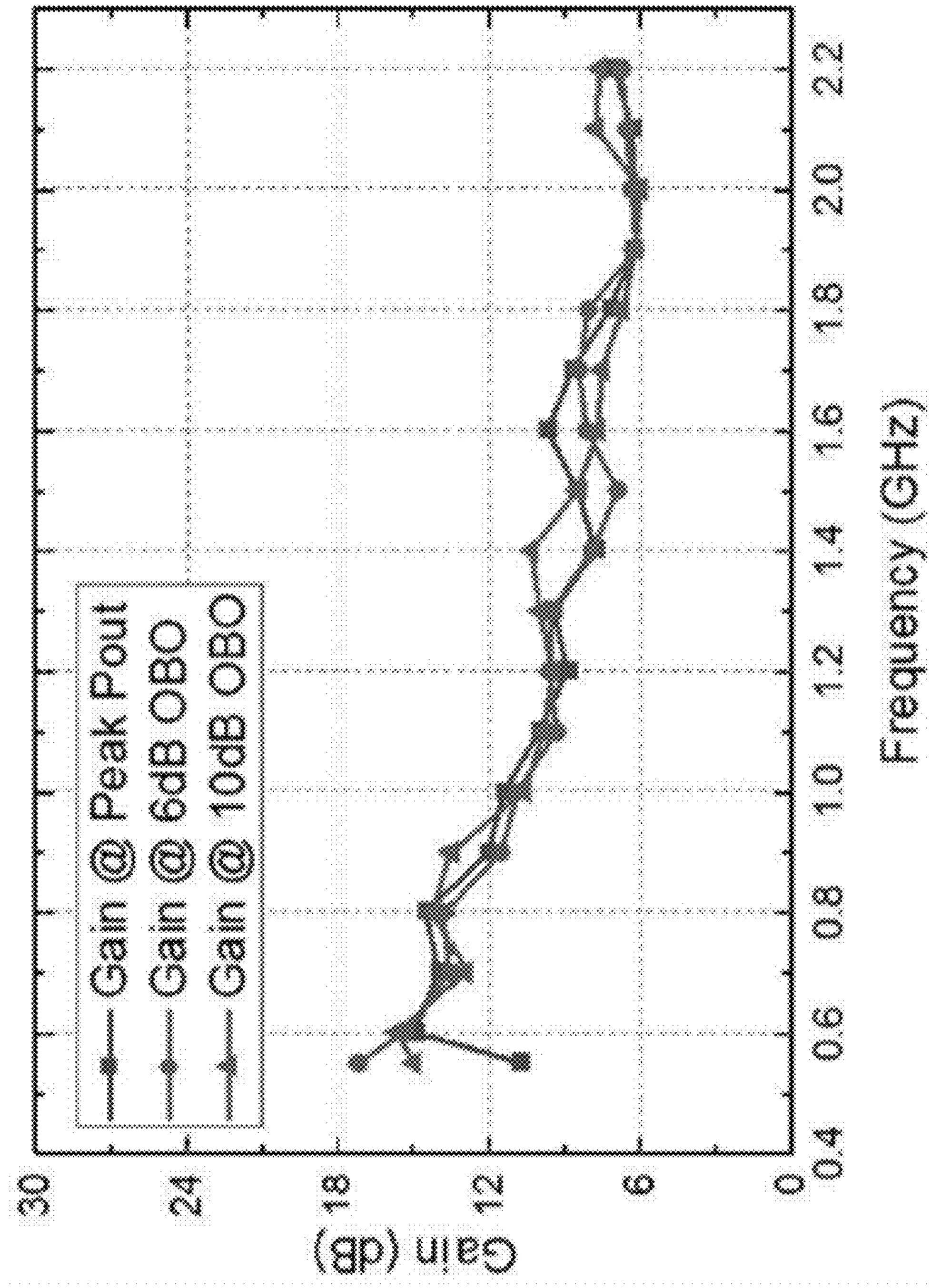
FIG. 25 illustrates measured gain at various OBO levels from 0.55 to 2.2 GHz according to another implementation described herein.
Figure 26:
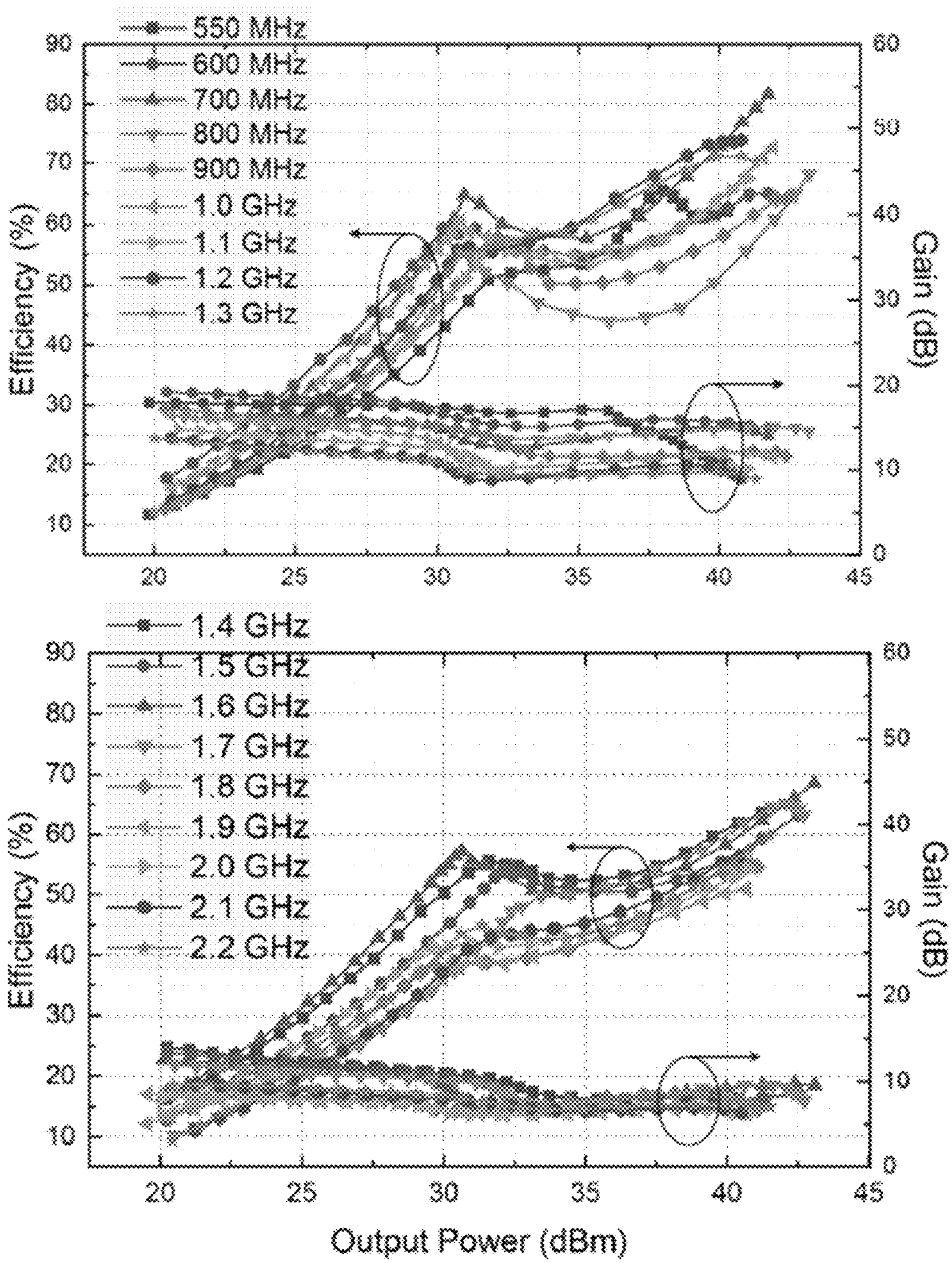
FIG. 26 illustrates power-swept measurement of efficiency and gain from 0.55 to 2.2 GHz according to another implementation described herein.

The fabricated PD-ALMBA is measured under the excitation of a single-tone CW signal from 0.55 to 2.2 GHz with a large variation of power levels. The CW signal is generated by a vector signal generator, and then boosted by a broadband linear driver amplifier to a sufficiently high level for driving the device under test (DUT). The output power is measured using spectrum analyzer and power sensor. A peak output power of 41-43 dBm is measured across the entire bandwidth, as shown in FIG. 23. In FIGS. 24A-24B, 82% of drain efficiency and 79% of PAE at peak power is measured at 0.7 GHz. The drain efficiency remains higher than 49% and PAE remains higher than 39% throughout entire frequency range. As shown in FIG. 24A, the drain efficiencies at 10-dB and 6-dB OBOs are in the range of 39-64% and 40-60%, respectively. It can be seen from FIG. 25 that the gain is maintained around 8-15 dB. Moreover, the PD-ALMBA prototype is measured with a power-swept stimulus at 1-dB step, and the measured efficiency and gain profiles are plotted in FIG. 26. A Doherty-like behavior could be clearly observed from the shape of the efficiency versus output power curves at almost every single sample frequency point from 0.55-2.2 GHz, while the efficiency is effectively boosted down to 10-dB back-off power, as shown in FIG. 26. These measurement results validate implementations of the PD-ALMBA disclosed herein and demonstrate the advantage of this new technology in PA efficiency enhancement over ultrawide bandwidth. FIG. 30 presents a comparison between this design and other recently published active-load-modulation PAs with similar frequency range, output power level, and technology. As a single-input LMBA architecture, this work significantly advances the state-of-the-art by demonstrating the widest RF bandwidth of two octaves together with efficient PA performance across extended OBO range of ≥10 dB.

Figure 27:
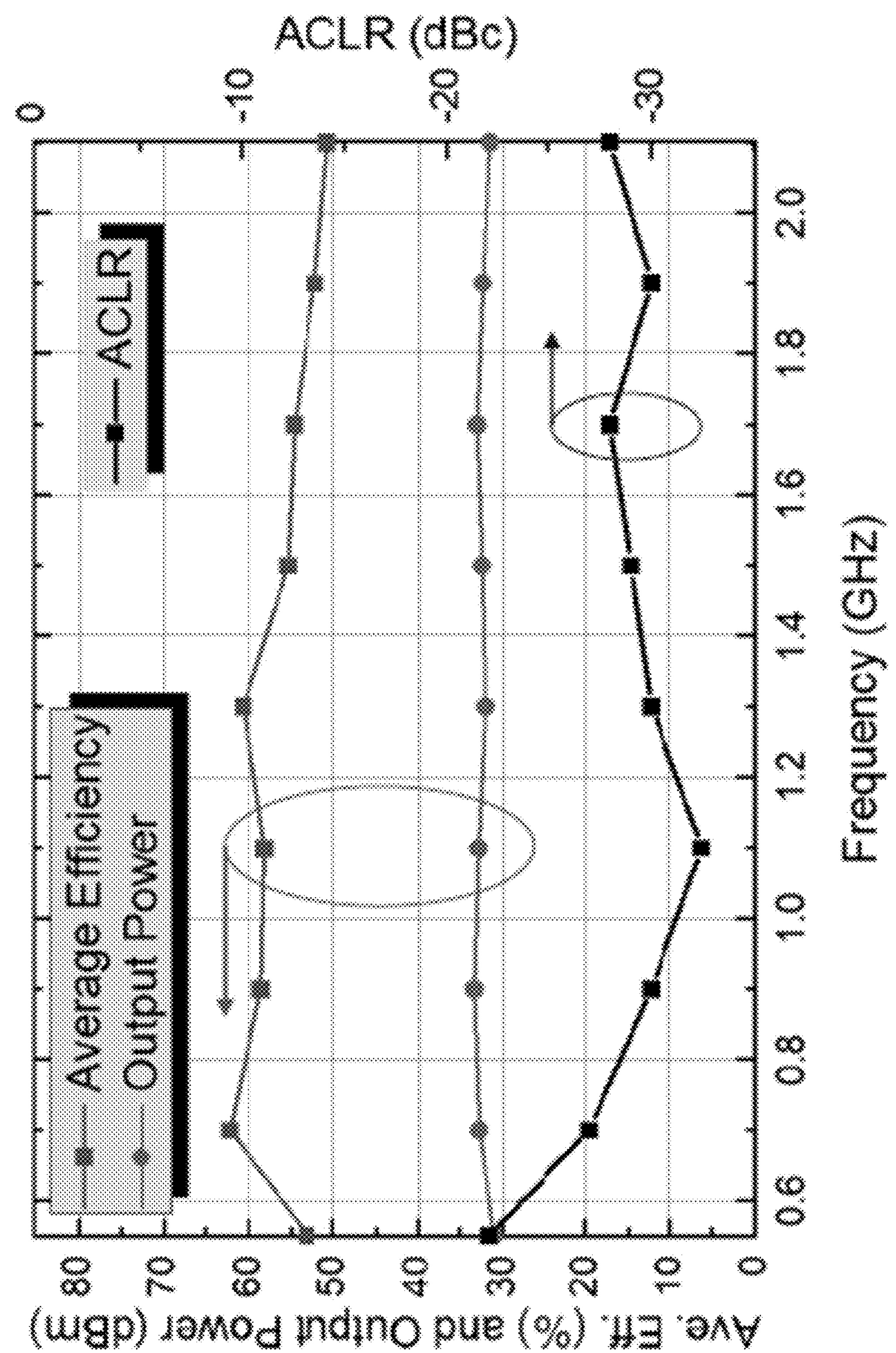
FIG. 27 illustrates measured average drain efficiency, output power, and ACLR with 20-MHz 10.5-dB-PAPR LTE signal at 0.55, 0.7, 0.9, 1.1, 1.3, 1.5, 1.7, 1.9, and 2.1 GHz according to another implementation described herein.
Figure 28:
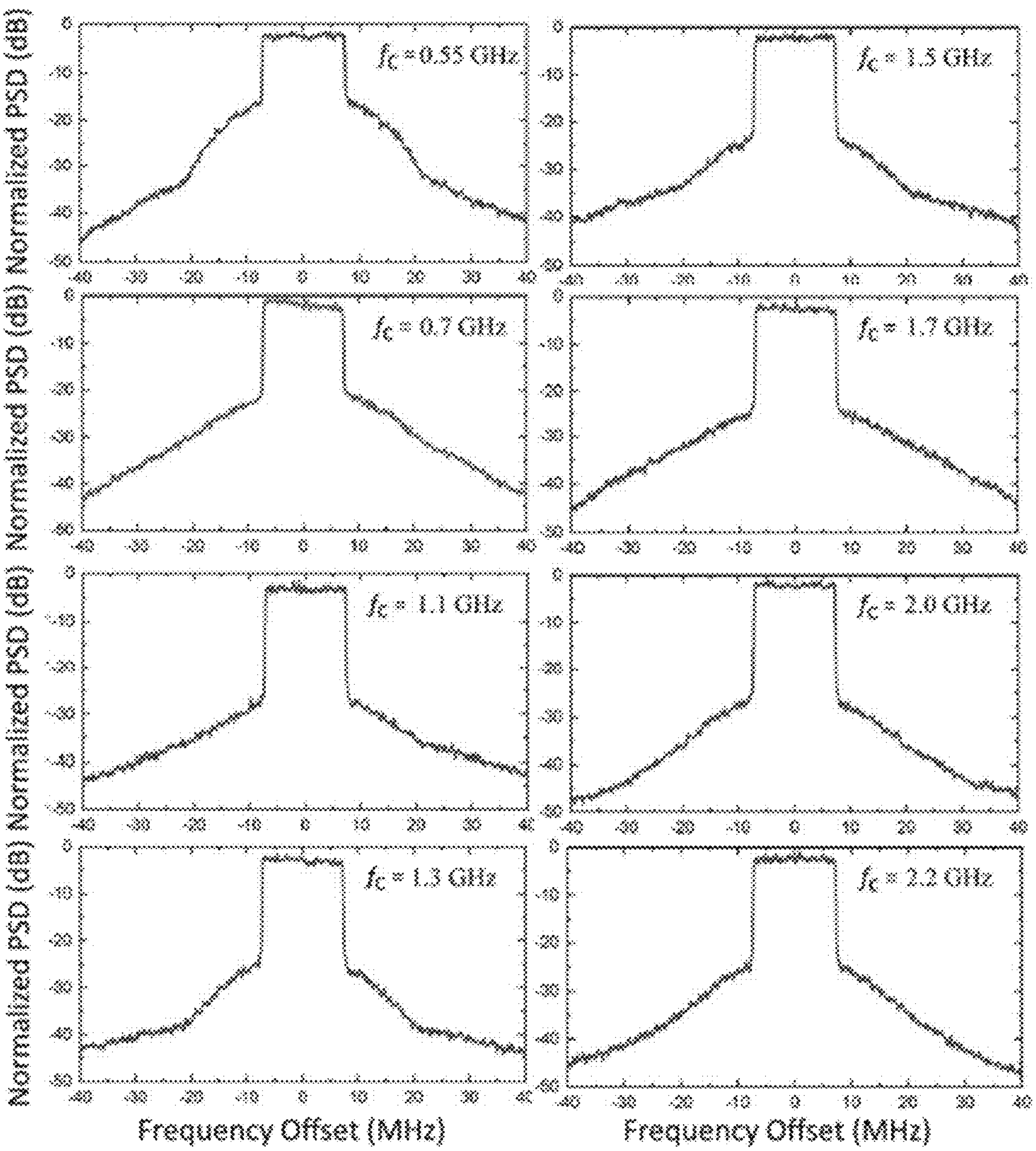
FIG. 28 illustrates output power spectrum from modulated measurement using 20-MHz 10.5-dB-PAPR LTE signal centered at 0.55, 0.7, 1.1, 1.3, 1.5, 1.7, 2.0, and 2.2 GHz according to another implementation described herein.
Figure 29:
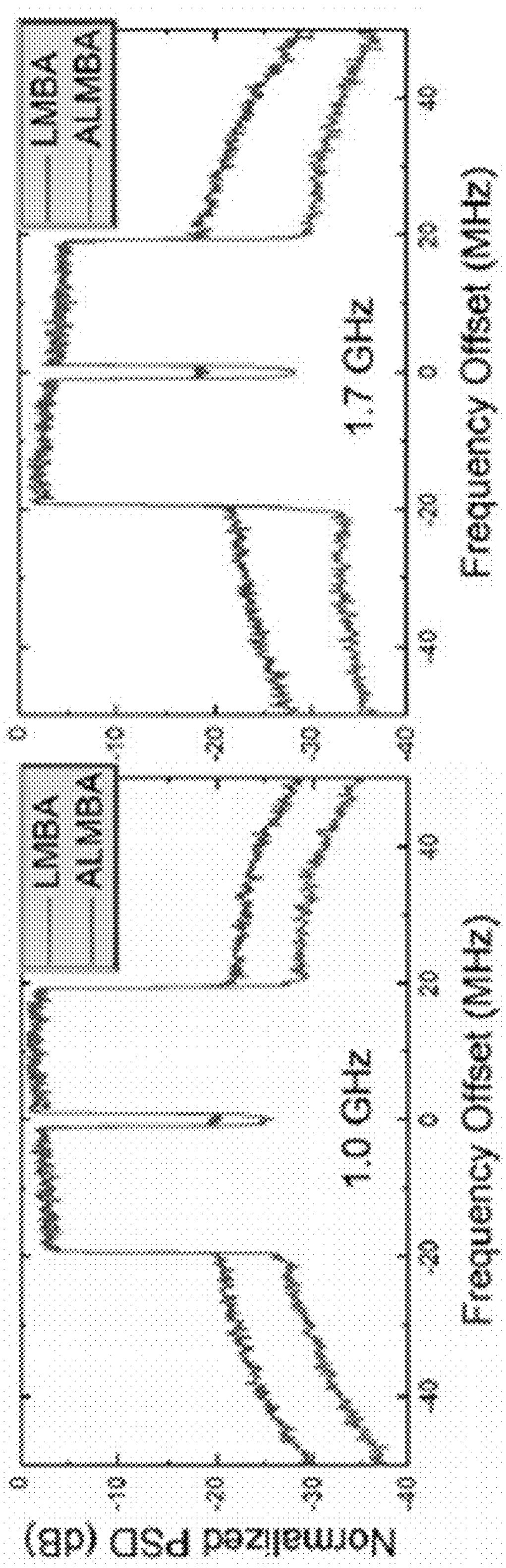
FIG. 29 illustrates output spectrum comparison between PD-LMBA and ALMBA from modulated measurement using a 40-MHz 10.5-dB-PAPR dual-carrier LTE-A signal centered at 1.0 and 1.7 GHz according to another implementation described herein.

To evaluate the capability of the proposed PD-ALMBA under modulated signal stimulation in realistic communications, a 20-MHz LTE signal with a PAPR of 10 dB is employed as the input. The modulated signal is generated and analyzed by a Keysight PXIe vector transceiver (VXT M9421). The generated LTE signal is further boosted by a linear preamplifier (ZHL-5W-422+) to a sufficient level for driving the developed prototype. The measurement results at an average output power around 33 dBm are presented in FIG. 27. The PD-ALMBA achieves a high average efficiency of 51%-62% over the target frequency band. The measured output power spectral density (PSD) is shown in FIG. 28. The ACLR of most measured frequencies are higher than 28 dB without any digital predistortion. This linearity performance can thereby be improved across the entire band. In the actual measurement, the drain and gate bias voltages of BA1 and BA2 can be adjusted separately to further optimize the PD-ALMBA linearity. FIG. 29 shows the comparison of the modulated measurement between PD-LMBA (same prototype with symmetrical bias for BA1 and BA2) and PD-ALMBA (asymmetrical bias) using a dual-carrier LTE-Advanced (LTE-A) signal with 40-MHz bandwidth and 10.5-dB PAPR. The linearity is substantially enhanced with up to 10-dB reduction of ACLR at two sample frequencies at 1 and 1.7 GHz, respectively. Overall, the linearity enhancement of PD-ALMBA as compared to PD-LMBA mainly attributes to the reduced CA over-driving and the cooperation with asymmetrical BA1 and BA2.

A load-modulation platform of ALMBA is disclosed together with the design methodology and implementation. The design methodology and implementation disclosed significantly expands the design space and implementation horizon of conventional LMBA and show that the CA can be designed with arbitrary LM ratio by properly setting the asymmetry of BA's two subamplifiers, BA1 and BA2. Based on Doherty-like biasing of the asymmetric BA1 and BA2 (peaking) and the CA (carrier) with appropriate amplitude and phase controls, the optimal LM performances of three amplifiers can be achieved independently overextended power back-off range and ultrawide RF bandwidth. Moreover, the LM of CA can effectively alleviate the over-driving issue imposed on the symmetric PD-LMBA, thus improving the overall reliability and linearity. The implementations of the present disclosure have been experimentally validated through hardware prototyping, demonstrating the capability of efficiently amplifying a signal with 10-dB PAPR over a 120% fractional bandwidth, which inherits the wideband and high-efficiency characteristics of symmetrical PD-LMBA. Meanwhile, the reduced CA over-driving can lead to about 10-dB ACLR reduction over entire bandwidth, which can greatly improves the PD-ALMBA linearity and reliability. This proposed PD-ALMBA provides a promising solution for next generation multiband wireless transmitters.

Example 4

Figure 31:
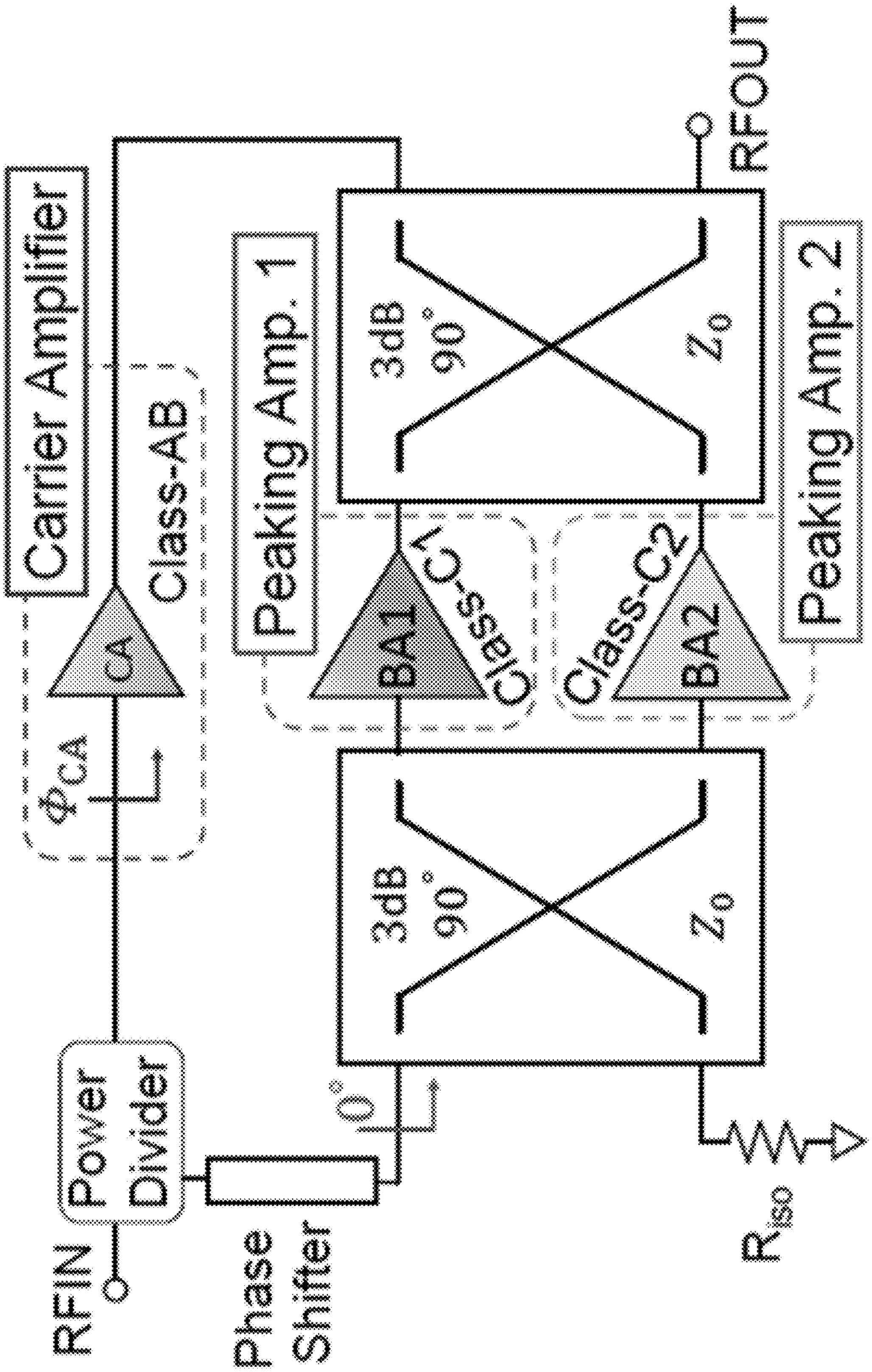
FIG. 31 illustrates a schematic of an H-ALMBA according to one implementation described herein.
Figure 32:
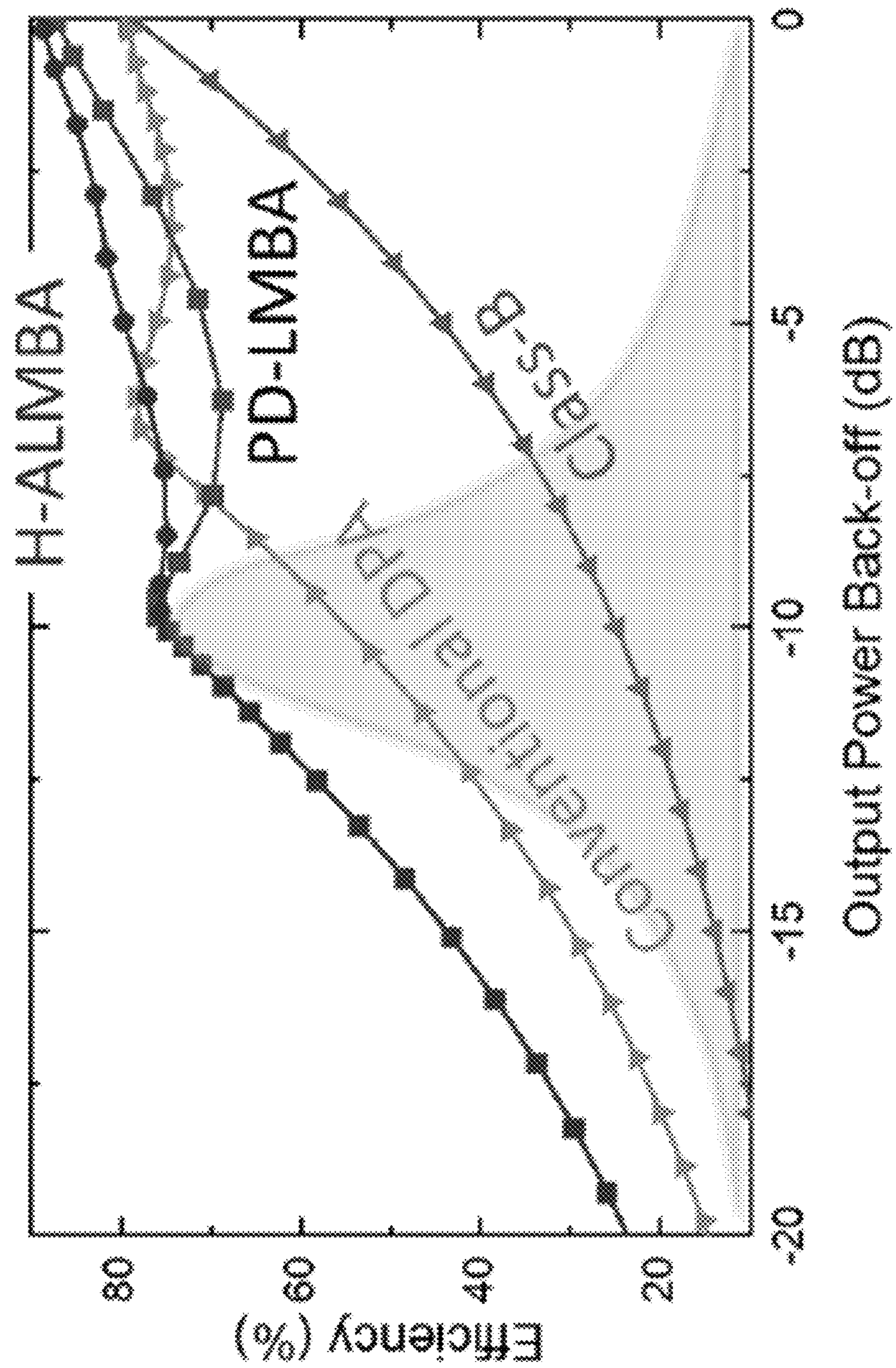
FIG. 32 illustrates a simulated efficiency profile for an implementation described herein, including a comparison between Class-B amplifier, DPA, PD-LMBA, and H-ALMBA (simulation based on bare-die GaN devices to emulate the ideal transistor models).

Another example implementation of the H-ALMBA is described herein. The example implementation includes three PAs, including a control amplifier (CA) biased in Class-AB mode, BA1 in Class-C mode, and BA2 in deep Class-C mode, as shown in FIG. 31. All PAs can be connected to a 3-dB quadrature coupler with a port impedance of $Z_0$. The CA functions as the carrier amplifier, while BA1 and BA2 turn on sequentially at different OBO levels. When BA1 is turned on at low-back-off (LBO) level with BA2 remained off, CA and BA1 form a DPA-like PA. When BA2 is turned on at high-back-off (HBO) level, three PAs cooperate like the LMBA but with BA1 and BA2 asymmetrical. The load modulation of three amplifiers are different at different back-off ranges, which can be similar to a three-way DPA. Therefore, multiple efficiency peaks can be formed across the extended dynamic power range, as plotted in red curve of FIG. 32, leading to a higher average efficiency when amplifying high-PAPR signals.

Figure 33:
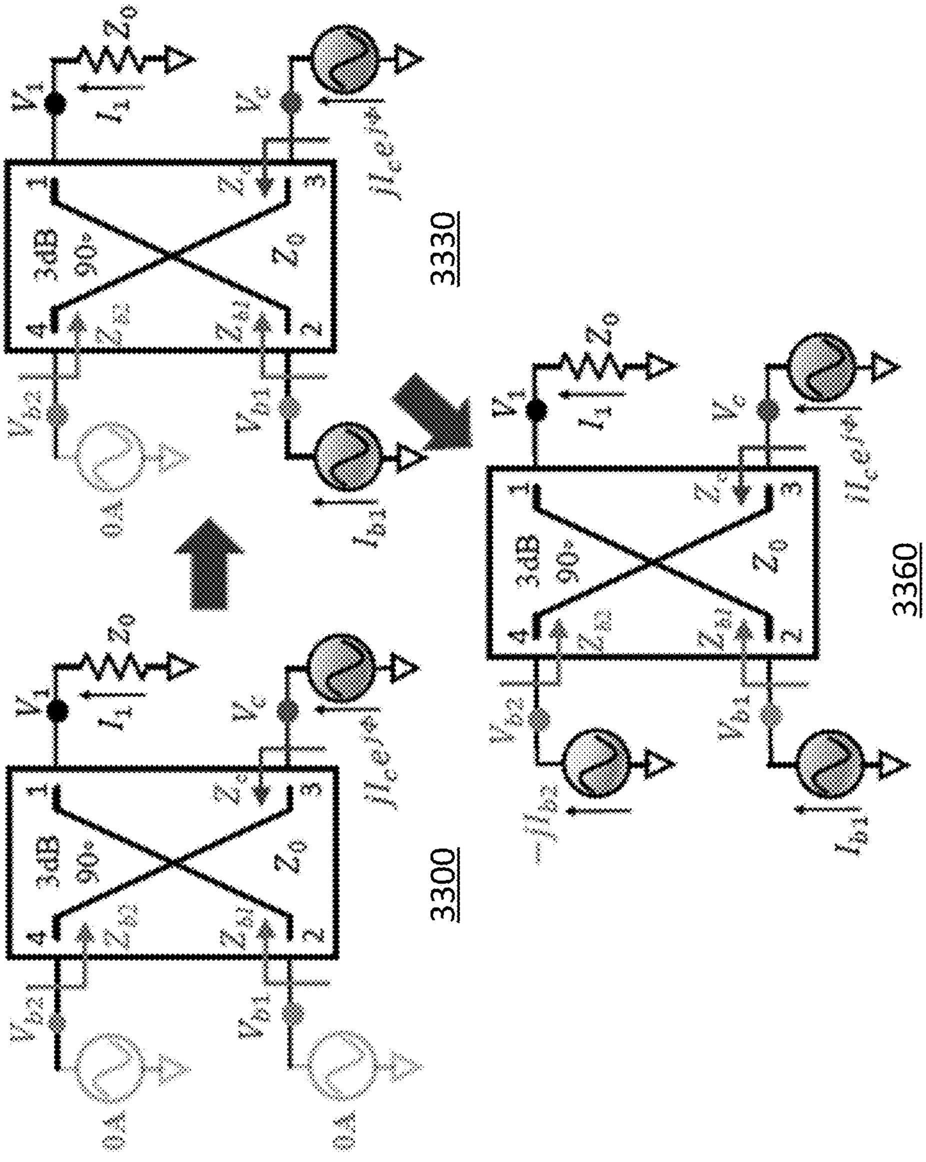
FIG. 33 illustrates a generalized schematic of quadrature-coupled three-way load modulation (H-ALMBA) according to one implementation described herein, including the low-power region (CA only), Doherty region (CA+BA1) and ALMBA region (CA+BA1+BA2).

In the analytical modeling of H-ALMBA, all PAs are regarded as ideal voltage-controlled current sources, and they are coupled to the three ports of a 3-dB quadrature hybrid with the fourth port connected to a load, as shown in FIG. 33. The voltages and currents of all four ports are dependent through the Z expressed as:

$$\begin{bmatrix} V_1 \\ V_2 \\ V_3 \\ V_4 \end{bmatrix} = Z_0 \begin{bmatrix} 0 & 0 & +j & -j\sqrt{2} \\ 0 & 0 & -j\sqrt{2} & +j \\ +j & -j\sqrt{2} & 0 & 0 \\ -j\sqrt{2} & +j & 0 & 0 \end{bmatrix} \begin{bmatrix} I_1 \\ I_2 \\ I_3 \\ I_4 \end{bmatrix} \tag{22}$$

where $V_1=-I_1Z_0$, $I_2=I_{b1}$ and $I_4=-jI_{b2}$ representing the input RF currents from BA1 and BA2, while $I_3=jI_ce^{j\varphi}$ denotes the CA current that is phase-shifted from BA1 by $\pi/2+\varphi$. Using the matrix operation in (22), the impedances of BA1, BA2 and CA can be calculated as:

$$Z_{b1} = Z_0\left(\frac{I_{b2}}{I_{b1}} + \frac{\sqrt{2}\, I_c e^{j\phi}}{I_{b1}}\right); \tag{23}$$

$$Z_{b2} = Z_0\left(2 - \frac{I_{b1}}{I_{b2}} + \frac{\sqrt{2}\, I_c e^{j\phi}}{I_{b2}}\right); \tag{24}$$

$$Z_c = Z_0\left(1 - \sqrt{2}\,\frac{I_{b1} - I_{b2}}{I_c e^{j\phi}}\right). \tag{25}$$

Eqs. (23)-(25) indicate the generic quadrature-coupled load modulation behavior, which can explain implementations of the LMBA and all LMBA variants. In some implementations, the load modulation of $Z_{BA1}$ and $Z_{BA2}$ can be controlled by the change of $I_c$ amplitude and phase. At the same time, the load of carrier amplifier, $Z_C$, can be determined by the difference between $I_{b1}$ and $I_{b2}$. For a standard ALMBA implementation, the asymmetry between $I_{b1}$ and $I_{b2}$ can be realized using different supply voltages ($V_{DD,BA1}$, $V_{DD,BA2}$), in order to control the load modulation of CA. In contrast, H-ALMBA can leverage different turn-on thresholds of BA1 and BA2 ($V_{GS,BA1}$, $V_{GS,BA2}$), which can not only adjust $I_{b1}$ and I at different OBO levels but can also form a three-way load modulation.

With different gate-bias settings of CA, BA1 and BA2, the dynamic operation of H-ALMBA can be divided into Low-Power (CA only) 3300, Doherty (CA+BA1) 3330, and ALMBA (CA+BA1+BA2) regions 3360, illustrated in FIG. 33. To analyze the detailed load-modulation characteristics of H-ALMBA, the currents of all three amplifiers are modeled. As the carrier amplifier, the CA current, $i_{ca}$ can be defined as:

$$i_{ca}(\beta) = \begin{cases} i_{ca,lp}(\beta), & 0 \le \beta < \beta_{lbo} \\ i_{ca,hp}(\beta), & \beta_{lbo} \le \beta \le 1 \end{cases} \tag{26}$$

where $i_{ca,lp}$ can represent the CA current at low power region where the BA1 and BA2 are not turned on, and $i_{ca,hp}$ can denote the CA current at high power region, including both Doherty and ALMBA regions. $\beta$ is a normalized variable to describe the magnitude of the input driving level, and $\beta_{lbo}$ is the BA1 threshold between the low-power region and DPA region. $i_{ca,lp}$ can be simply expressed using the piece-wise linear model of standard Class-B mode:

$$i_{ca,lp}(\beta) = \begin{cases} \beta I_{Max,C}\cdot\cos\theta, & -\frac{\pi}{2} \le \theta < \frac{\pi}{2} \\ 0, & \text{otherwise} \end{cases} \tag{27}$$

where $I_{Max,c}$ can represent the maximum current allowed for the power device of CA. Using (27), the DC and fundamental components of $i_{ca,lp}$ can be obtained as:

$$i_{ca,lp}[0] = \frac{\beta\cdot I_{Max,C}}{\pi}; \qquad i_{ca,lp}[1] = \frac{\beta\cdot I_{Max,C}}{2} \tag{28}$$

Figure 34:
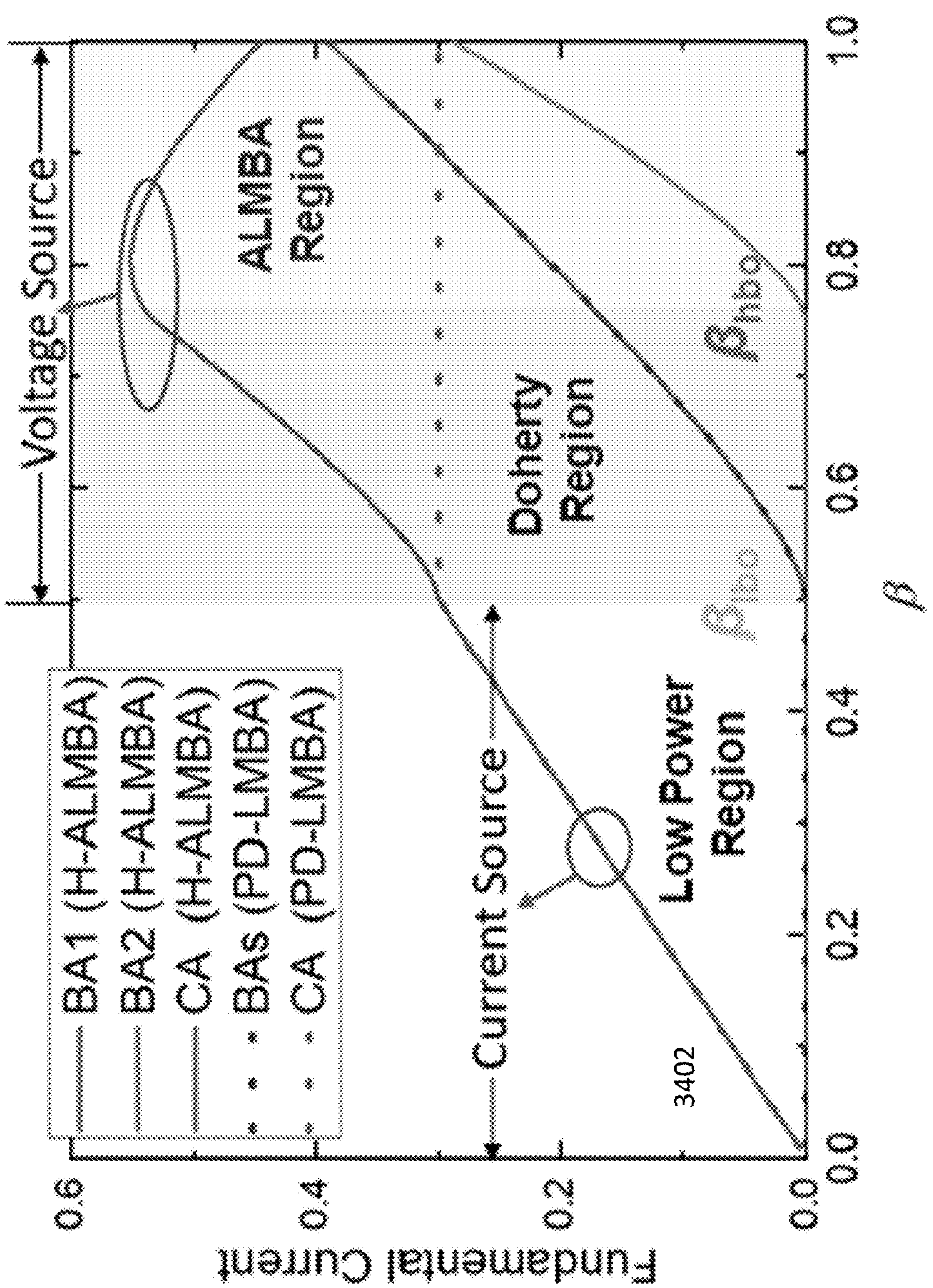
FIG. 34 illustrates a comparison of fundamental currents (normalized IMax,C/β) of three amplifiers in H-ALMBA and PD-LMBA modes according to an implementation described herein.

When the driving power increases to $\beta_{lbo}$, the CA can be saturated corresponding to the first efficiency peak at the target LBO level. For implementations of the present disclosure including a symmetrical PD-LMBA, $i_{ca,lp}$ grows to its maximum value, and this maximum CA current can be maintained regardless of the continued increase of driving power towards the maximum input driving level, as the red dotted line plotted in FIG. 34. For some implementations of the H-ALMBA, however, only the voltage of CA is saturated at $\beta_{lbo}$ that still leads to an efficiency peak. As $\beta$ increases above $\beta_{lbo}$, the CA current can continue to increase towards full saturation (both voltage and current) at $\beta=\beta_{hbo}$, which is the BA2 threshold between the DPA region and ALMBA region, as shown in FIG. 34 as line 3402. For $\beta$ between $\beta_{hbo}$ and 1, the CA current can be subject to a decrease because the load impedance can increase as BA2 turns on, indicated by (25), but the contribution of CA is overwhelmed by the two peaking amplifiers in this region. Nevertheless, it should be emphasized that in some implementations of the present disclosure, the CA should remain voltage-saturated offering a maximal efficiency across Doherty and ALMBA regions, and thus, the modeling of CA is converted from a current source to a voltage source in the high-power region. With a constant voltage saturation, the CA current can be expressed as $$i_{ca,hp}(\beta) = \begin{cases} \frac{2V_{DD,CA}}{Z_c(\beta)}\cdot\cos\theta, & -\frac{\pi}{2} \le \theta < \frac{\pi}{2} \\ 0, & \text{otherwise} \end{cases} \tag{29}$$

where $V_{DD,CA}$ equals to the maximum fundamental voltage of CA, and $Z_c$ is the load impedance of CA that can be calculated from (25). As a voltage source, the CA fundamental voltage maintains a constant value of $V_{DD,CA}$ as the red curve shown in FIG. 35. Eq. (29) can be implicit, since $Z_c(\beta)$ can be also dependent on the fundamental component of $i_{ca,hp}$ as well as the currents of BA1 and BA2 in the high-power region, as indicated by (25). Thus, the CA current and load impedance in (29) can be eventually determined together with the BA1 and BA2 models. Particularly, the following boundary condition can be satisfied:

$$i_{ca,lp}(\beta_{lbo}) = i_{ca,hp}(\beta_{lbo}) \tag{30}$$

BA1 and BA2 can be biased at Class-C mode with different thresholds. BA1 is turned on at $\beta_{lbo}$, while BA2 is turned on at $\beta_{hbo}$. The currents of BA1 and BA2 can be derived as:

$$i_{ba1}(\beta) = \begin{cases} 0, & 0 \le \beta < \beta_{lbo} \\ i_{ba1,hp}(\beta), & \beta_{lbo} \le \beta \le 1 \end{cases} \tag{31}$$

$$i_{ba2}(\beta) = \begin{cases} 0, & 0 \le \beta < \beta_{hbo} \\ i_{ba2,hp}(\beta), & \beta_{hbo} \le \beta \le 1 \end{cases} \tag{32}$$

The BA1 current in Doherty and ALMBA region can be expressed using Class-C current formula as:

$$i_{ba1,hp}(\beta) = \begin{cases} \frac{\beta\cdot\cos\theta - \beta_{lbo}}{1-\beta_{lbo}} I_{Max,B}, & -\theta_b \le \theta < \theta_b \\ 0, & \text{otherwise} \end{cases} \tag{33}$$

$I_{MAX,B}$ represents the maximum current provided by the peaking device, which is assumed identical for BA1 and BA2. With a different turning-on threshold, the BA2 current in ALMBA region can also be expressed using Class-C current formula as:

$$i_{ba2,hp}(\beta) = \begin{cases} \dfrac{\beta \cdot \cos\theta - \beta_{hbo}}{1 - \beta_{hbo}} I_{Max,B}, & -\theta_b \le \theta < \theta_b \\ 0, & \text{otherwise} \end{cases} \quad (34)$$

where $(-\theta_b, +\theta_b)$ defines the turn-on phase range of BA1 and BA2. Thus, $\theta_b$ is obtained as $$\theta_b = \arccos(\beta_{bo}/\beta). \quad (35)$$

By applying Fourier Transformation, the DC and fundamental currents of BA1 and BA2 can be calculated as:

$$i_{ba1,hp}[0] = \frac{I_{Max,B}}{1 - \beta_{lbo}} \cdot \frac{\beta\sin\theta_b - \beta_{lbo}\theta_b}{\pi}; \quad (36)$$

$$i_{ba1,hp}[1] = \frac{I_{Max,B}}{1 - \beta_{lbo}} \cdot \frac{\beta(2\theta_b + \sin 2\theta_b) - 4\beta_{lbo}\sin\theta_b}{2\pi}.$$

$$i_{ba2,hp}[0] = \frac{I_{Max,B}}{1 - \beta_{hbo}} \cdot \frac{\beta\sin\theta_b - \beta_{hbo}\theta_b}{\pi}; \quad (37)$$

$$i_{ba2,hp}[1] = \frac{I_{Max,B}}{1 - \beta_{hbo}} \cdot \frac{\beta(2\theta_b + \sin 2\theta_b) - 4\beta_{hbo}\sin\theta_b}{2\pi}$$

Figure 35:
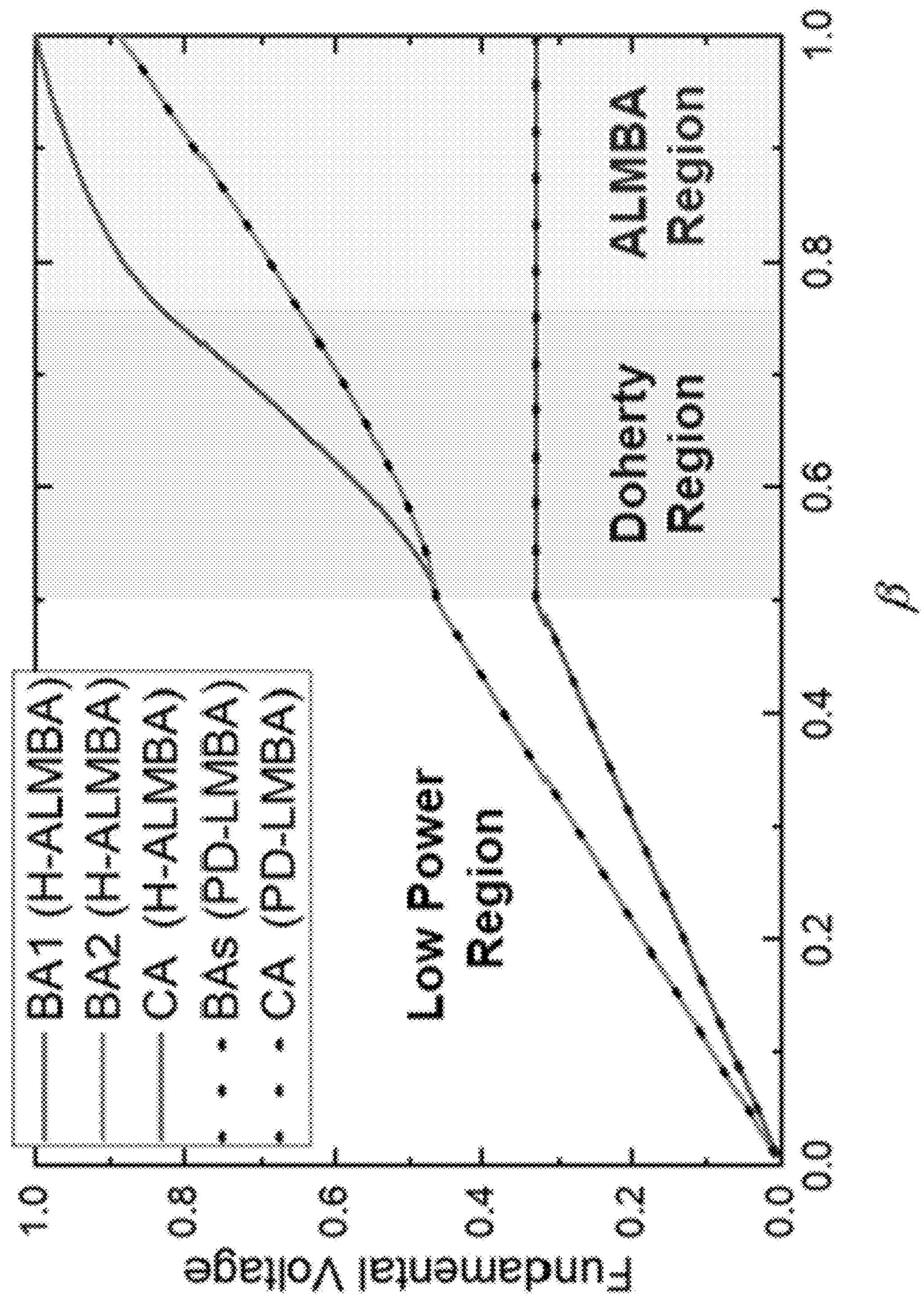
FIG. 35 illustrates a comparison of normalized fundamental voltages of each path in H-ALMBA and PD-LMBA modes according to an implementation described herein.

FIG. 34 shows the normalized fundamental current of the BA1 and BA2 versus β with $\beta_{lbo}$=0.5 and $\beta_{hbo}$=0.75, respectively, and FIG. 35 depicts the corresponding voltages of BA1 and BA2. The voltage of individual BA in PD-LMBA ($\beta_{PD\text{-}LMBA}$=0.5) can be the same as that of BA2 in H-ALMBA.

A detailed analysis on load-modulation behavior of H-ALMBA can be performed for all three different regions:

Low-Power Region ($P_{OUT}<P_{MAX}/LBO$): When operating at low power level below the predefined target LBO power, the BA1 and BA2 are not turned on, as depicted in the schematic 3300 shown in FIG. 33. The CA can operate as a standalone Class-B amplifier, and the output power can be solely generated by CA. In this low-power region, there can be no load modulation for all three amplifiers, and the currents are provided as following:

$$I_c = i_{ca,lp}[1]$$

$$I_{b1} = I_{b2} = 0. \quad (38)$$

Their load impedances, $Z_{c,LP}$, $Z_{b1,LP}$, and $Z_{b2,LP}$, can be expressed as:

$$Z_{c,LP} = Z_0;$$

$$Z_{b1,LP} = Z_{b2,LP=\infty}. \quad (39)$$

Since BA1 and BA2 (BAs) are not operating, the overall efficiency of H-ALMBA is equal to the efficiency of CA. Doherty Region (PMAX/LBO≤POUT<PMAX/HBO): When the output power increases to the target LBO level, BA1 is turned on, and CA reaches saturation at the same time. At PMAX/LBO, CA is designed to be only voltage-saturated (Zc>ZCA,Opt) corresponding to the first efficiency peak, while there is still headroom for further increase of CA current. In this region, BA1 and CA currents can both increase, given by:

$$I_c = i_{ca,hp}[1] = V_{DD,CA} Z_c;$$

$$I_{b1} = i_{ba1,hp}[1];\ I_{b2} = 0. \quad (40)$$

By substituting the above currents into (23)-(25), and when φ=0°, the load modulation behaviors of CA, BA1, and BA2 impedances can be derived as:

$$Z_{c,Doherty} = \frac{Z_0 V_{DD,CA}}{V_{DD,CA} + \sqrt{2}\, I_{b1} Z_0} \Big|_{\phi=0^\circ}; \quad (41)$$

$$Z_{b1,Doherty} = 2Z_0 + \frac{\sqrt{2}\, V_{DD,CA}}{I_{b1}} \Big|_{\phi=0^\circ};$$

$$Z_{b2,Doherty} = \infty.$$

The above equation shows that as the power increases to the Doherty region, $Z_c$ can be modulated below $Z_0$. Since the CA voltage remains constant (=$V_{DD,CA}$) at this time, the current ($I_c$) and output power of CA can continue to increase.

ALMBA Region ($P_{MAX}$/HBO $P_{OUT}<P_{MAX}$): When the driving power reaches $\beta_{hbo}$, BA2 is turned on, and the PA load modulation follows the ALMBA mode. Therefore, the currents of all three amplifiers can pressed as $$I_c = i_{ca,hp}[1] = V_{DD,CA}/Z_c;$$

$$I_{b1} = i_{ba1,hp}[1];\ I_{b2} = i_{ba2,hp}[1]. \quad (42)$$

The load impedances of CA, BA1, and BA2 can be described using (23)-(25), and when Φ=0°, the impedance equations can be further derived as:

$$Z_{c,ALMBA} = \frac{Z_0 V_{DD,CA}}{V_{DD,CA} + \sqrt{2}(I_{b1} - I_{b2}) Z_0} \Big|_{\phi=0^\circ}; \quad (43)$$

$$Z_{b1,ALMBA} = 2Z_0 + \frac{\sqrt{2}\, V_{DD,CA} - Z_0 I_{b2}}{I_{b1}} \Big|_{\phi=0^\circ};$$

$$Z_{b2,ALMBA} = \frac{Z_0 I_{b1} + \sqrt{2}\, V_{DD,CA}}{I_{b2}} \Big|_{\phi=0^\circ}.$$

Figure 36:
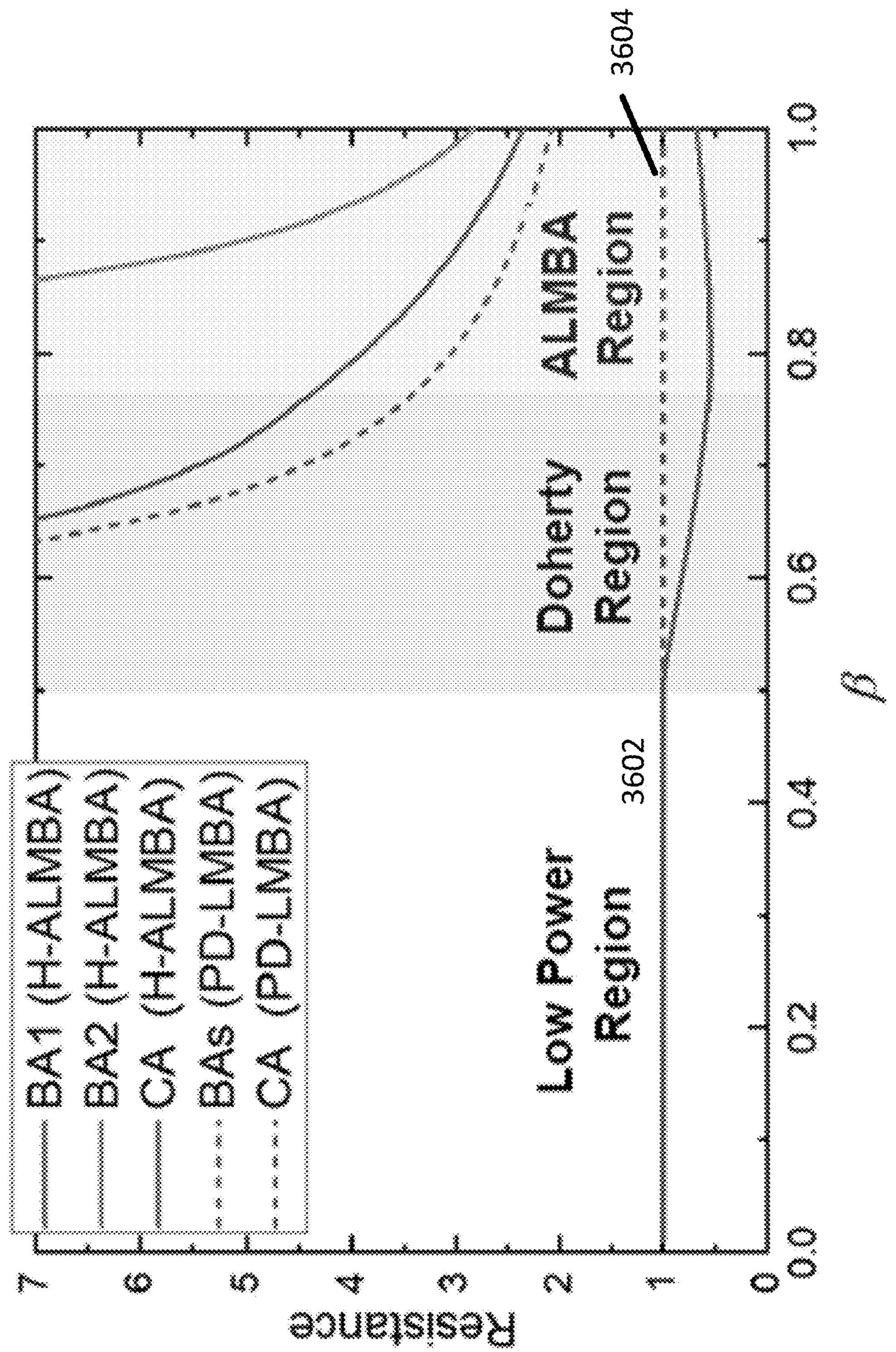
FIG. 36 illustrates a comparison of resistances of each path in H-ALMBA and PD-LM BA modes.
Figure 37A:
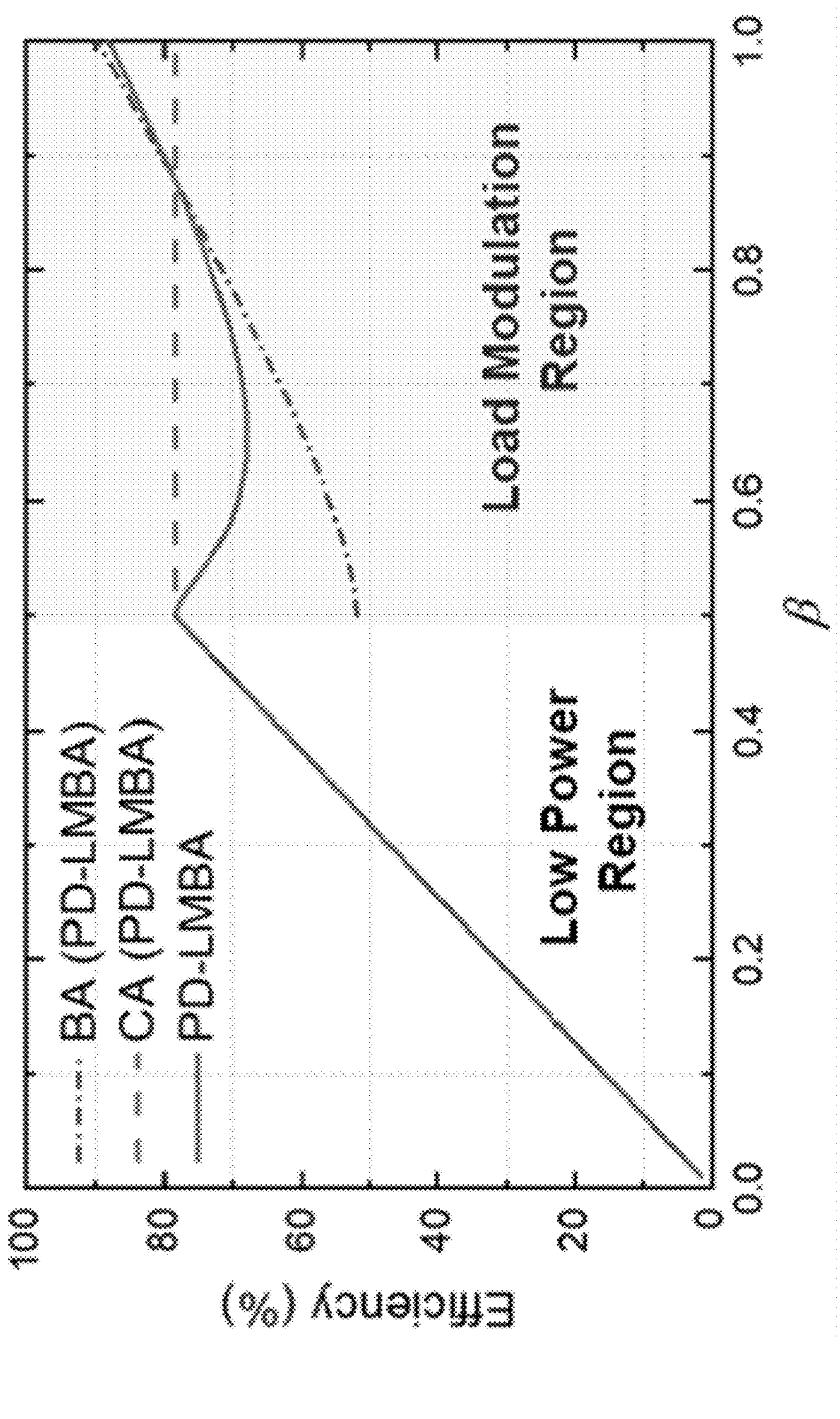
Figure 37B:
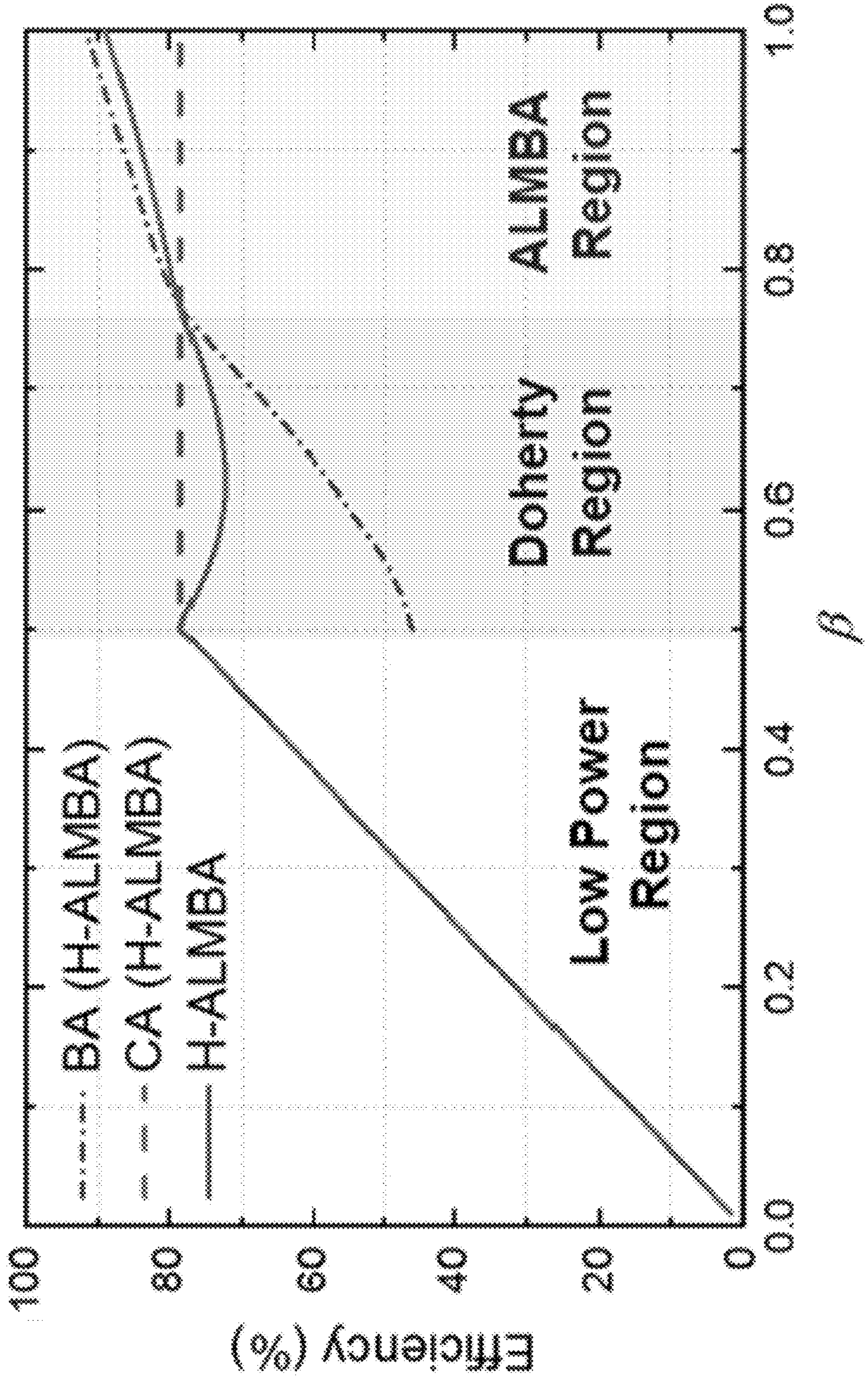

As illustrated in FIG. 34, the fundamental current of BA2 can increase more sharply as compared to the current of BA1. Thus, when the driving level (β) reaches to maximum, the BA1, BA2, and CA can be all saturated respectively, and a maximum DE can be obtained. Based on the above comprehensive load-modulation analysis, the load impedance and current of CA can be analytically determined using (25) and (29). The curves 3602 3604 in FIG. 36 compare the CA load modulation trajectories with φ=0° between symmetrical PD-LMBA and H-ALMBA in different regions. Correspondingly, the overall fundamental CA current ($I_c$) versus driving level is plotted as the curve 3402 in FIG. 34. The load modulation behaviors of BA1 and BA2 in H-ALMBA are calculated using (23)-(24), which are plotted in FIG. 36 in comparison with PD-LMBA. The normalized fundamental voltages of different amplifier branches in H-ALMBA and PD-LMBA modes are shown in FIG. 35. With the derived load modulation behaviors in terms of current, voltage, and impedance, the overall efficiency responses of PD-LMBA and H-ALMBA across the entire dynamic range are obtained and plotted as solid lines in FIG. 37A and FIG. 37B, respectively, which also show the efficiencies of individual BA and CA. It can be seen that, in Doherty region (8 from 0.5 to 0.75) with BA2 turned off, the BA efficiency of H-ALMBA increases more sharply than that of PD-LMBA. Therefore, an extra peak efficiency can be formed at the end of Doherty region (HBO level), which can greatly improve the overall efficiency of the entire back-off range. Note that the efficiency at peak power is higher than 78.5% because of the Class-C operation of peaking amplifiers.

Figure 38:
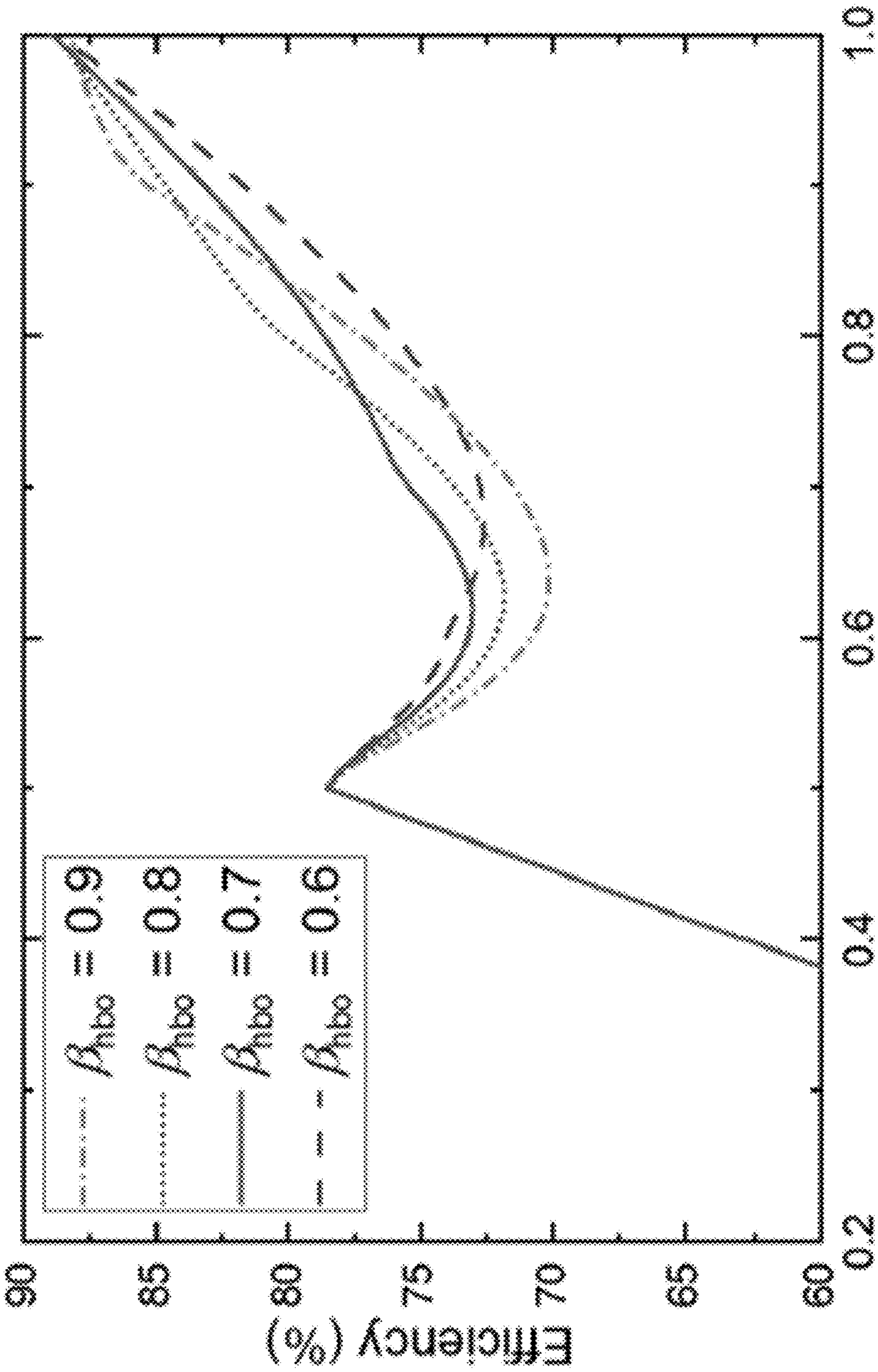
FIG. 38 illustrates the efficiency of an implementation of a H-ALMBA vs. β with $\beta lb_o$=0.5 and different values of $\beta_{hbo}$.

The amplitude control of H-ALMBA involves the power ratio of all three amplifiers and the turn-on points of BA1 and BA2. In this H-ALMBA operation, BA1 needs to be turned on at a pre-determined OBO level. By sweeping the turning on time of BA2, $\beta_{hbo}$, an optimal DE of the entire back-off region can be determined. The efficiency profiles with different $\beta_{hbo}$ are shown in FIG. 38. It can be seen that the highest overall efficiency could be achieved with $\beta_{hbo}$ between 0.7 and 0.8, which can be close to half of the entire back-off region.

In addition to amplitude control, in some implementations of the present disclosure, the phase difference between the power generators can be set to result in an optimal load modulation trajectory for each amplifier. As described in (41), by setting $\varphi=0°$, a purely resistive load modulation of $Z_{b1}$, $Z_{b2}$, $Z_c$, can be achieved, which represent the optimal LM behaviors according to the classical load-line theory. In some implementations of the present disclosure including realistic designs with matching networks and parasitics of transistors, the optimal BA-CA phase offset can be determined through exhaustive sweeping in the actual circuit schematic.

Moreover, compared to other load modulation architectures, H-ALMBA can be easier to achieve different OBO levels by properly selecting the turning-on points of BA1 and BA2. The value of $\beta_{lbo}$ not only represents the turning on point of BA1, but it also affects the selection of CA drain voltage, which can be utilized to ensure a voltage saturation of CA at the target OBO. The $\beta_{hbo}$ denotes the turning on of BA2, which can be leveraged to optimize the overall back-off efficiency for different OBO levels.

Figure 39:
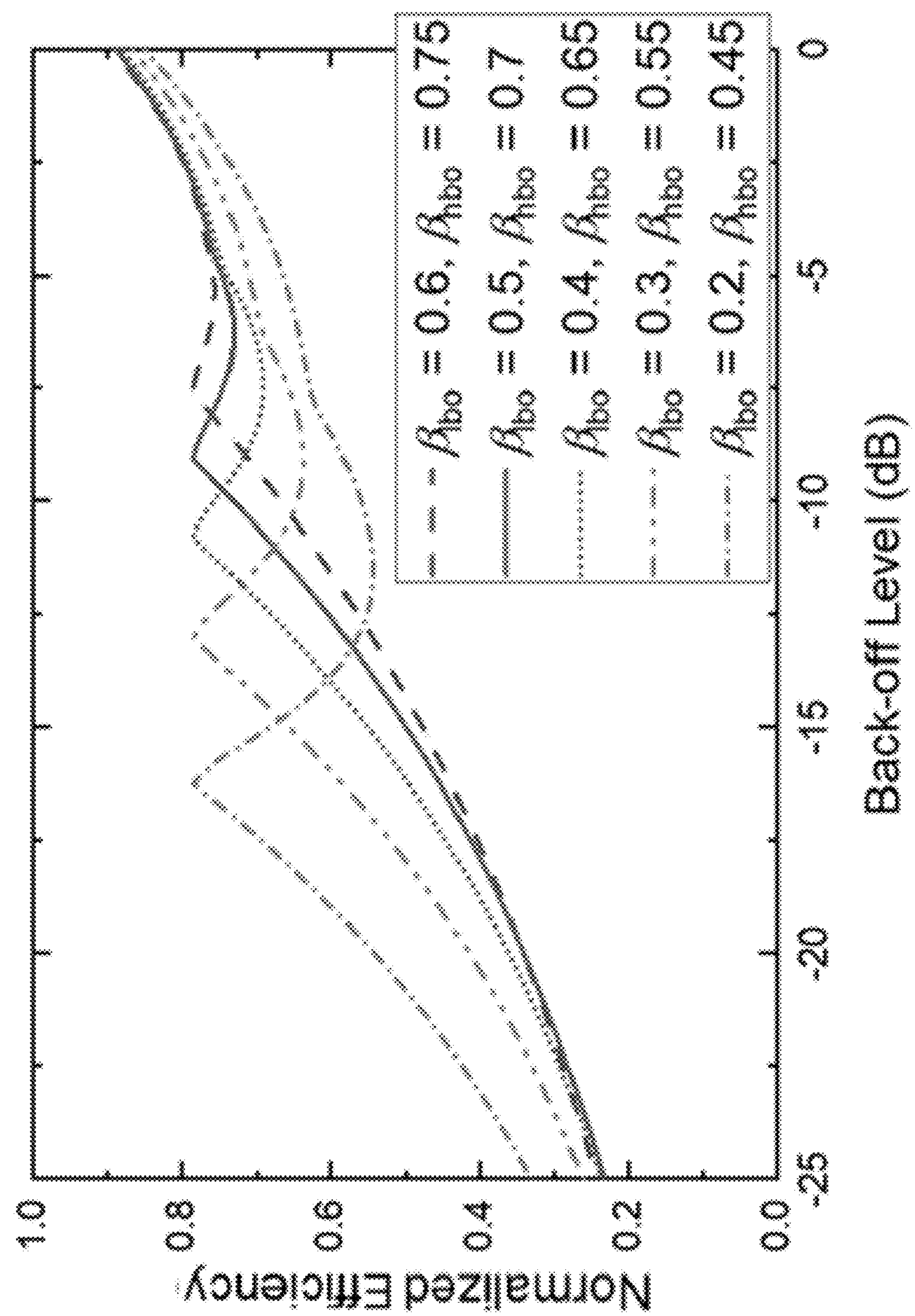
FIG. 39 illustrates efficiency performance of an implementation of an H_ALMBA vs. back-off level with different $\beta_{lbo}$ and $\beta_{hbo}$.
Figure 40:
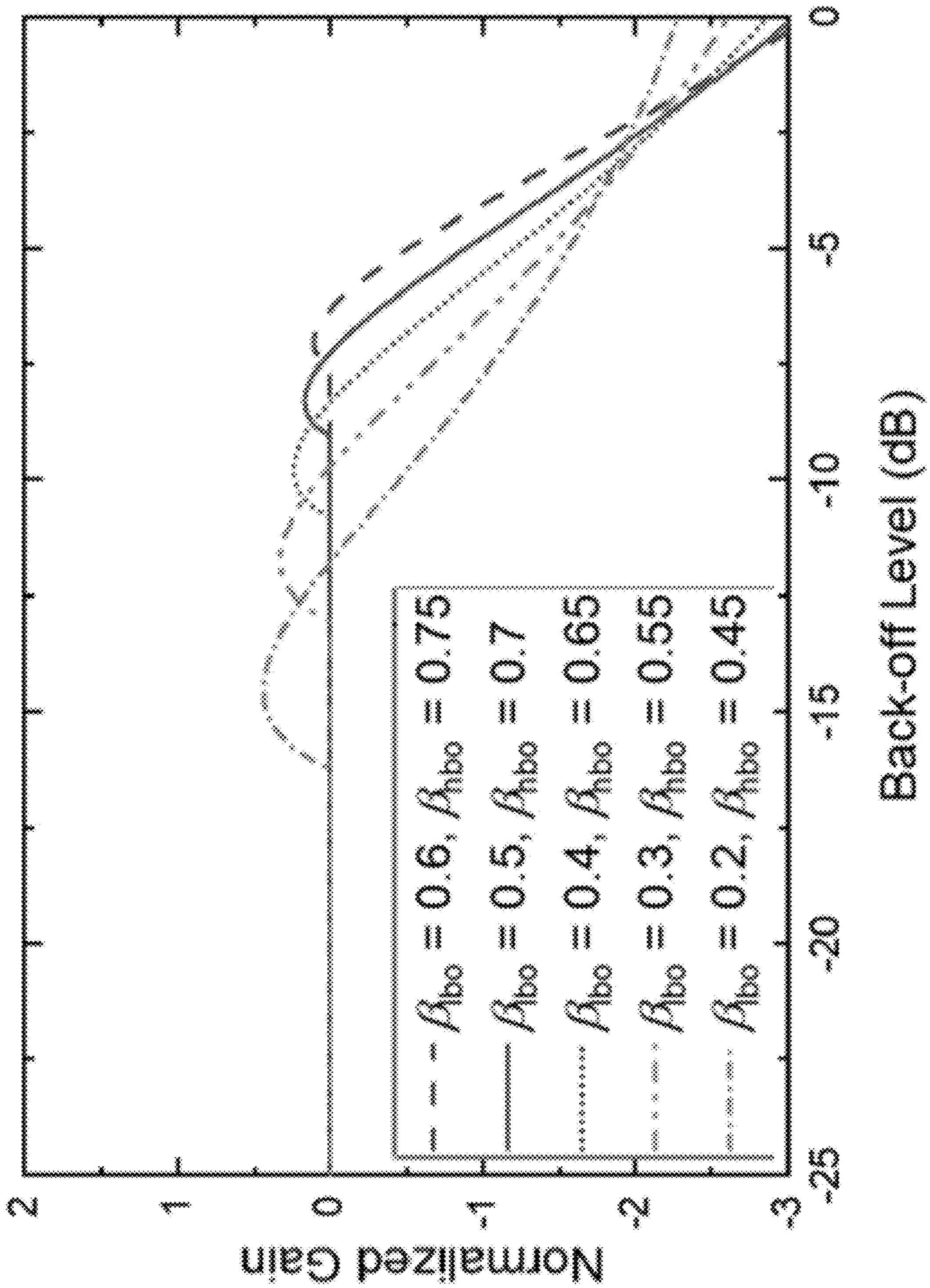
FIG. 40 illustrates gain performance of an implementation of a H-ALMBA vs. back-off level with different $\beta_{lb_o}$ and $R_{hbo}$.

FIG. 39 shows the efficiency performance of the proposed H-ALMBA with different $\beta_{lbo}$ and $\beta_{hbo}$. Within the range from 0.6 to 0.2 of $\beta_{lbo}$ and corresponding $\beta_{hbo}$ from 0.75 to 0.45, the power back-off range of H-ALMBA could be extended from 7 dB to 17 dB with the highest possible back-off efficiency. The gain (AM-AM) profiles with different $\beta_{lbo}$ and $\beta_{hbo}$ are shown in FIG. 40. It can be seen that with the increase of the OBO range, a flatter gain response can be achieved. Overall, the efficiency and gain results indicate that the H-ALMBA mode is very suitable for amplification of high-PAPR signals. As illustrated in FIG. 40, the change of $\beta_{hbo}$ in some implementations does not impact the gain response as long as $\beta_{lbo}$ is fixed. This shows that even if the output power of CA is backed-off after BA2 is turned on (ALMBA region), it does not compromise the gain and power-added efficiency (PAE) of the overall PA.

Figure 41A:
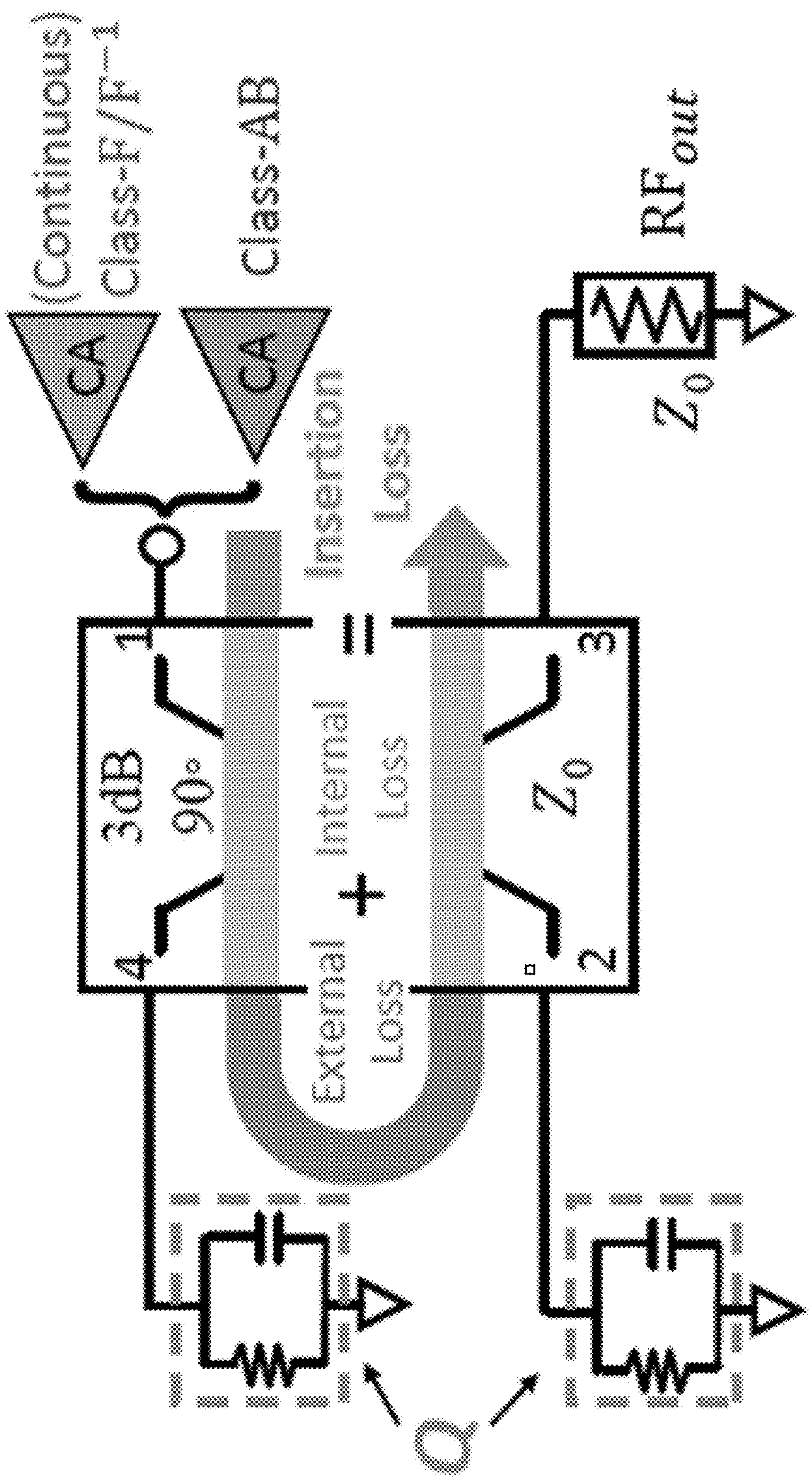
FIG. 41A-41B illustrate comparisons of a CA according to an implementation described herein, designed with continuous Class-F/F$^{-1}$ and Class-AB, where

It should be noted that in the low-power region, the BA1 and BA2 are off, and all output power is generated by CA. Therefore, the impedance matching of the CA needs to ensure its wideband efficiency when operating alone, since the CA efficiency sets the first efficiency peak of the power back-off range and the average efficiency of entire PA. In the H-ALMBA architecture, CA is biased in Class-AB that has an efficiency naturally lower than that of the Class-B (78.5%). On the other hand, the CA output connects to the PA load through the output quadrature coupler, and the broadband out-put quadrature coupler itself usually has a certain internal loss. At the same time, when BA1 and BA2 are not turned on, BA1 and BA2 present off-state impedances to the corresponding ports of the output couplers, which can be regarded as two identical R-C tanks with the same quality factor (Q). The Q of R-C tank determines the external power loss of quadrature coupler, which is added together with the internal loss forming the total insertion loss from CA port to the output, as shown in FIG. 41A. Thus, the overall efficiency of CA in Class-AB mode can be significantly degraded, as depicted in the curve 4152 in FIG. 41B.

Figure 41B:
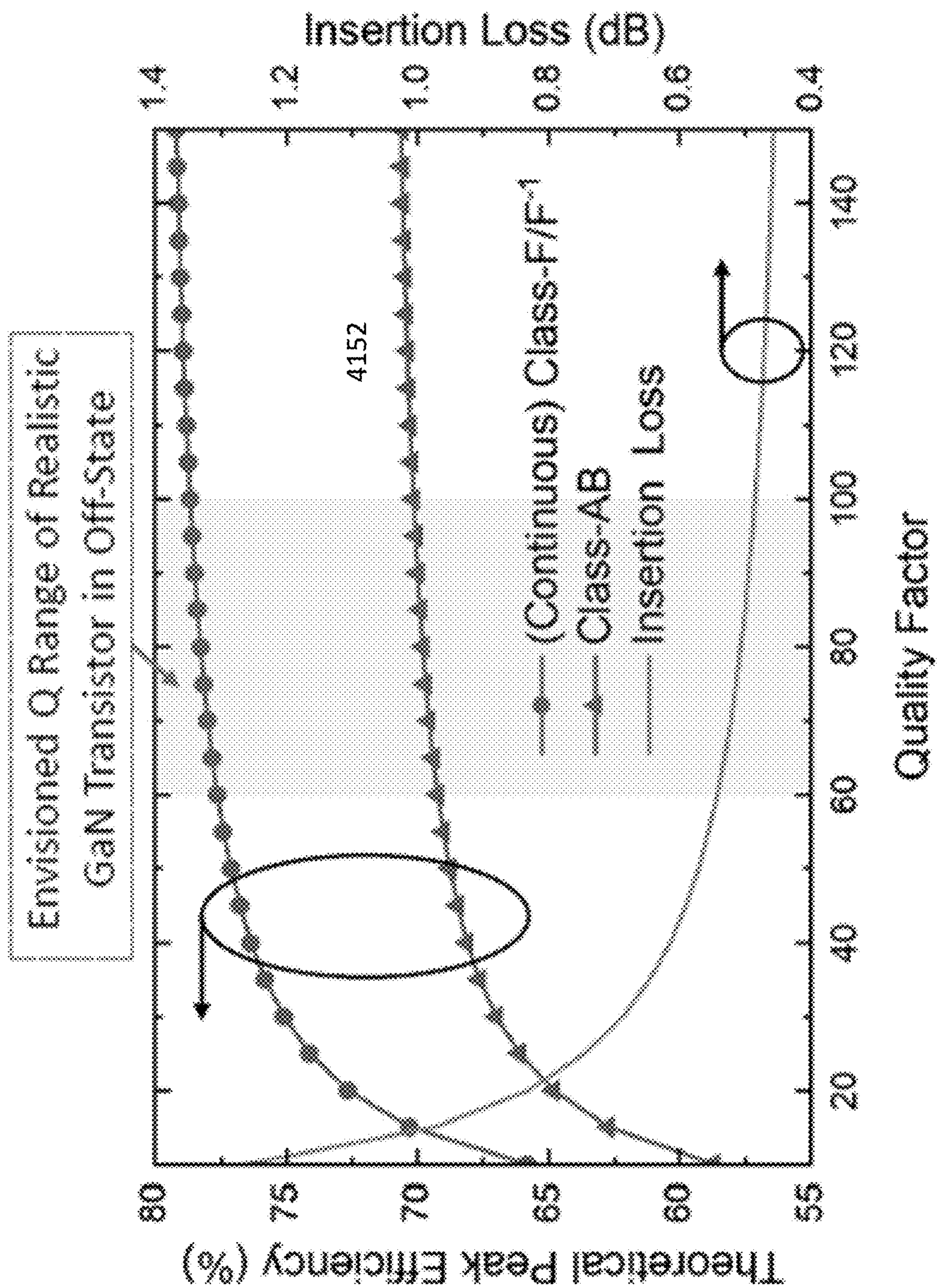

In order to maximize the peak efficiency of CA, this paper combines the high-efficiency harmonic-tuned matching (e.g., Class-F/F$^{-1}$ or its extension, continuous Class-F/F$^{-1}$) with H-ALMBA for the first time, and the output impedance matching with continuous mode (CM) is used to realize broadband CA design. Under the same insertion loss, the peak efficiency of the CA designed with continuous Class-F/F$^{-1}$ (blue curve with circles) can be greatly improved as compared to that with Class-AB, as shown in FIG. 41B (the quadrature coupler internal loss is assumed to be 0.4 dB). Thus, in some implementations of the present disclosure, upgrading CA from Class-AB to continuous Class-F/F$^{-1}$ can greatly improve the peak efficiency of CA, thereby enhancing the overall PA back-off efficiency.

Example 5

In order to accommodate the high PAPR of emerging 5G and WiFi6 signals, the back-off range of implementations of the H-ALMBA according to the present disclosure can be up to 17 dB according to actual needs, as shown in FIGS. 39 and 40. In this implementation, a back-off range of 10-dB, is selected as a target OBO of this example. The target frequency range is from 1.7 to 3.0 GHz, which can cover most cellular communication frequency bands.

According to the amplitude control scheme described in example 4, above, the power of CA at the first efficiency peak determines the dynamic range once the output power of BA is fixed. Given a specific OBO target, the power of CA can be expressed by $$\text{OBO}\times P_{CA,Sat1}=P_{BA1,MAX}+P_{BA2,MAX}+P_{CA,Sat2} \quad (44)$$

where $P_{CA,Sat1}$ represents the CA power at voltage saturation (first peak), and $P_{CA,Sat2}$ denotes the final CA power at maximum overall output power. A rough calculation indicates that $P_{CA,Sat1}$ is around 9-dB below $P_{BA1,MAX}+P_{BA2,MAX}$, while the accurate power dependence can be calculated by detailed analytical expressions presented in Example 4. To realize this low output power, the CA can implemented with a 10-W GaN transistor (a non-limiting example of a 10-W GaN transistor that can be used in implementations of the present disclosure is the CG2H40010 sold under the trademark Wolfspeed), and it can be biased in Class-AB mode with around 10-V drain bias voltage $V_{DD,CA}$. This value can be adjusted slightly at different frequencies to ensure that the OBO range of each frequency is 10 dB.

In a low-power region, the BA1 and BA2 ports of the output coupler can be open, and in some implementations of the present disclosure all output power is generated by CA. Therefore, in the actual matching design of the CA, the optimal wideband efficiency of CA standalone is considered, and meanwhile, its load modulation control of BA is also taken into account. However, in some implementations to ensure highest possible efficiency of standalone CA over the entire target bandwidth can require a complex harmonic-tuned wide-band matching network, but an excessively complex matching network can cause uncontrollable phase dispersion over frequency, which invalidates the precise phase control of BA. In some implementations of the present disclosure a simple three-segment transmission line can used as the output matching of the CA to maximize the efficiency of the BAs. But that can sacrifice the peak efficiency of CA, resulting in a reduction of the PA back-off efficiency.

Figure 42A:
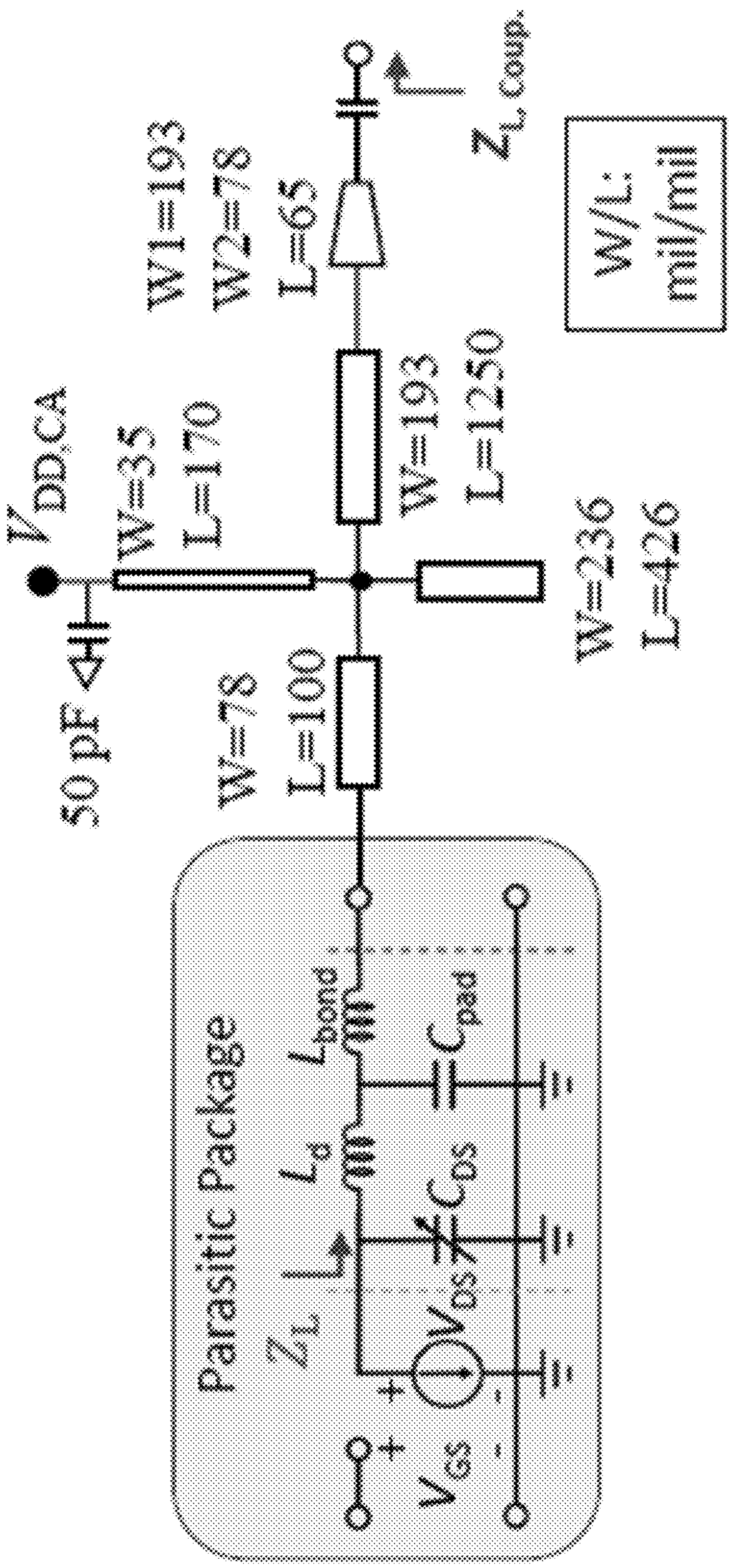
FIGS. 42A-42B illustrate OMN design of a CA according to an implementation described herein, where
Figure 42B:
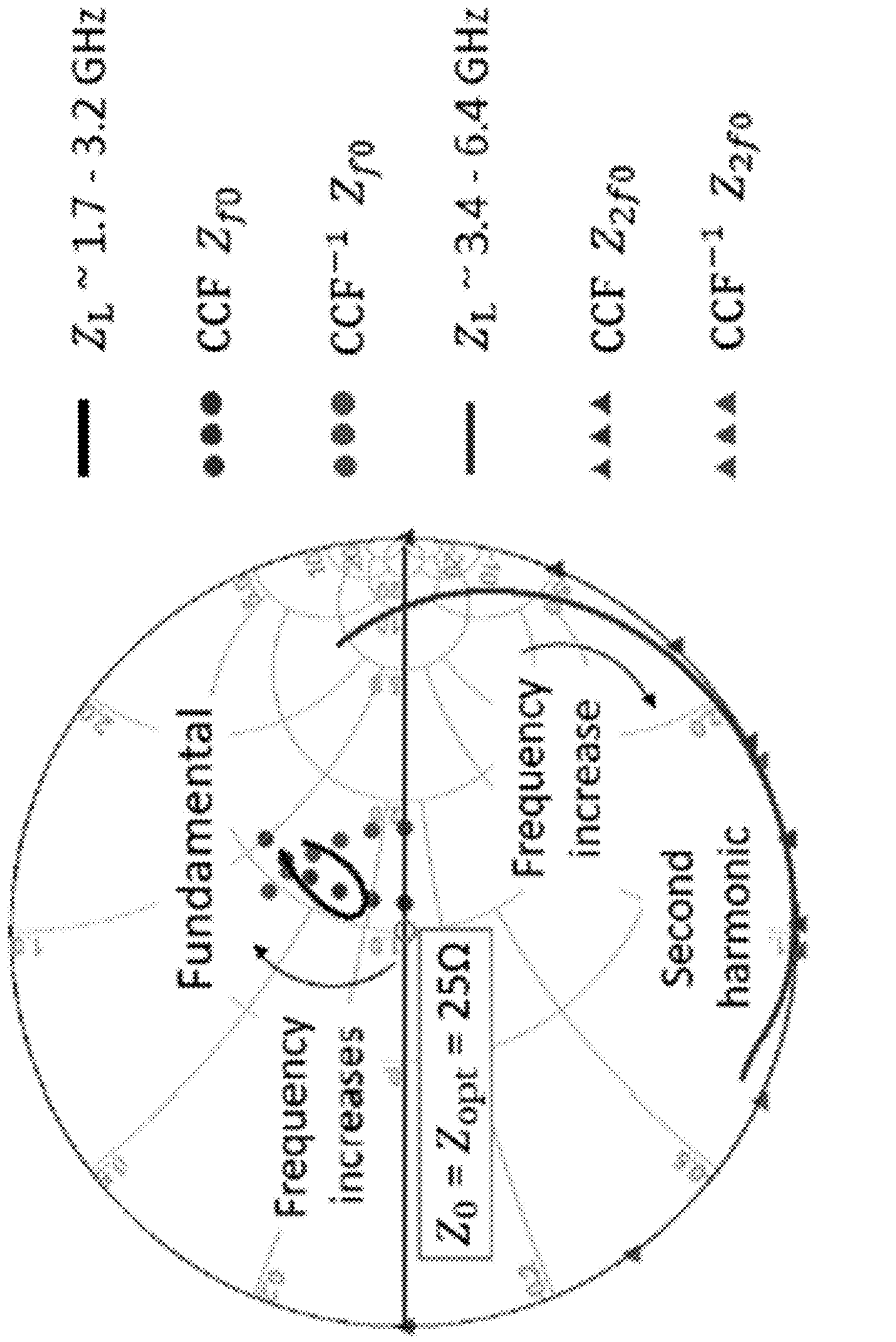

In order to maximize the PA back-off efficiency, a simplified harmonic output matching network (OMN), can be designed to realize a CM of CA for wideband operation, as shown in FIG. 42A. Within the target frequency range from 1.7-3 GHz, this OMN converts the Zo of isolation-port impedance of quadrature coupler to the fundamental impedance of continuous Class-F (CCF) and continuous Class-$F^{-1}$ ($CCF^{-1}$) modes in the inductive half plane of Smith chart, as shown in FIG. 42B. Meanwhile, the frequency response of this OMN over the second harmonic frequency range from 3.4-6 GHz is distributed to the corresponding second harmonic impedance of the $CCF^{-1}$ and CCF modes. Thus, a harmonic-tuned CA is realized in a transferring mode between $CCF^{-1}$ and CCF.

On the other hand, the phase dispersion of this OMN can be minimized if only one shunt stage (with a bias line and open-ended stub in parallel) is involved. The phase shift of series stages in the form of transmission lines (TLs) can be perfectly compensated with a phase offset line at BA input. The wideband CA input-matching network (IMN) needs to ensure a decent gain performance within the target bandwidth. Therefore, a two-section lowpass network based on transmission lines can be designed to provide wideband input matching for the selected GaN transistor.

Figure 43:
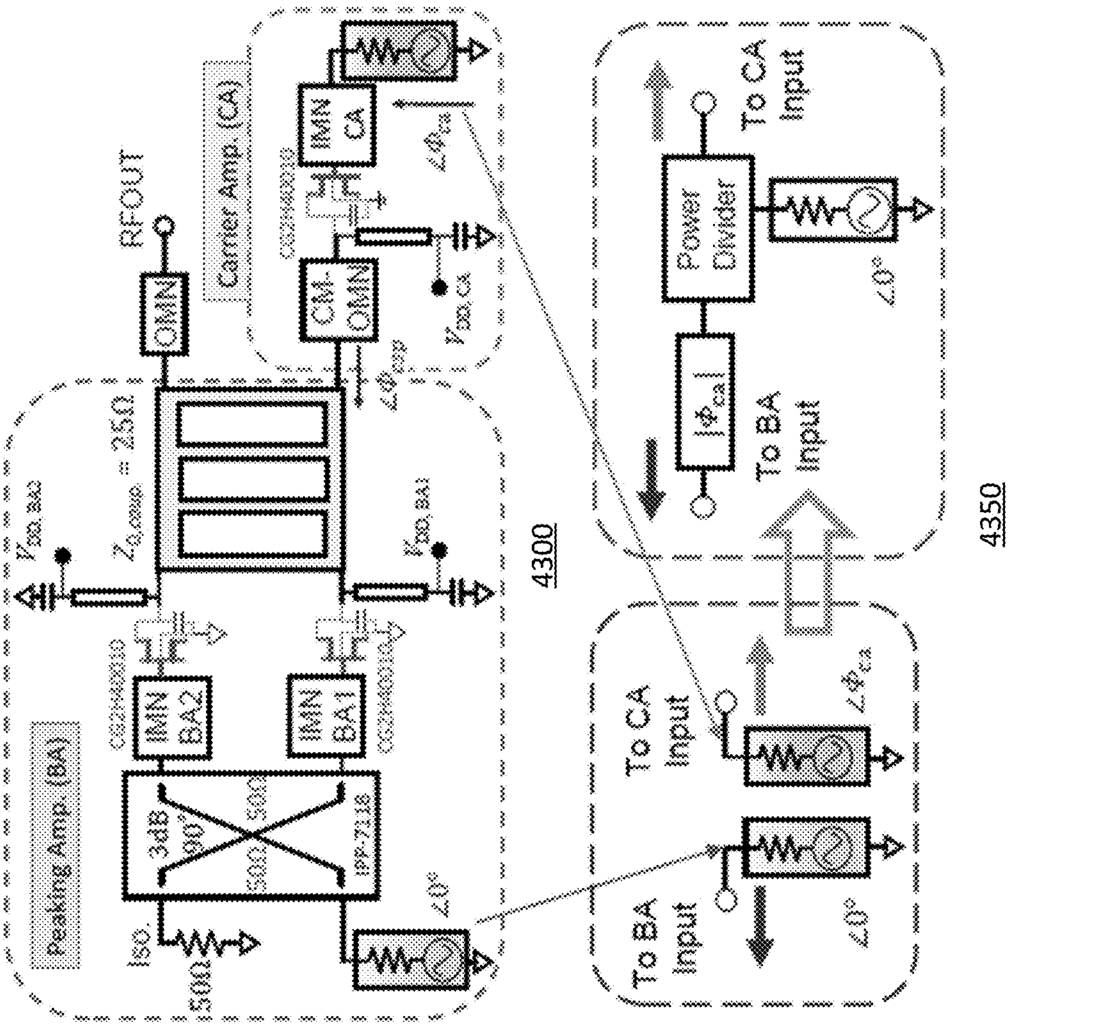
FIG. 43 illustrates a simulation setup of an implementation of an H-ALMBA using realistic GaN transistors for verification and the transistor parasitic network, and design of a Transmission line (TL)-based wideband phase shifter for merging the BA and CA inputs according to one implementation described herein.

FIG. 43 illustrates another implementation of a design of the present disclosure. As shown in FIG. 43, the two peaking amplifiers, i.e., BA1 and BA2, are designed with identical matching but different gate bias voltages. The input coupler (IPP-7118, sold under the trademark Innovative Power Products) can be constructed using commercial equipment with a wide operating bandwidth of 1.7 to 3.0 GHz. The output coupler is realized with a non-50 Ωthree-stage branch hybrid structure, which can provide enough bandwidth to cover the design goal. BA1 and BA2 are implemented with 10-W packaged GaN transistors (a non-limiting example of which is the CG2H40010). The BA output matching can be performed using the characteristic impedance of output coupler ($Z_{0,Coupler}$) and bias lines (a shunt L). Note that the BA1 and BA2 are in Class-C mode, and their efficiencies are intrinsically higher than that of Class-B. Thus, the simplified matching of BA1 and BA2 can suffice for the harmonic tuning. In implementations of the H-ALMBA design, load impedances of BA1 and BA2 can be determined by the power (amplitude) and phase of CA, as indicated by (23) and (24). Therefore, the value of $Z_{0,Coupler}$ (=25 Ω in the illustrated design) the bias lines are finalized through co-simulation with the CA using the simulation setup 4300 shown in FIG. 43.

A four-stage low-pass network is designed and implemented with transmission lines to provide input matching covering the target bandwidth from 1.7 to 3.0 GHz. Each stage can include of a series L (high impedance TL) and a shunt C (low impedance open stub). The length and width of TL can be adjusted to absorb the parasitic effects of RF and DC modules and device packaging.

Still referring to FIG. 43, the phase difference between BA1 and BA2 can be fixed to 90° in a balanced amplifier. Therefore, after combining the complete BA (BA1 and BA2 with input and output couplers) and CA, the load modulation of all three amplifiers can be determined by the relative phase between BA and CA. In order to ensure the purely resistive load modulation of three amplifiers for maximized efficiency, a phase-adjustment network between BA and CA 106 can be used in some implementations of the present disclosure. Thus, in some implementations, an optimal phase offset can be realized at the input of BA and CA, which can be determined using an equal-amplitude dual-input schematic diagram, as plotted 4350 in FIG. 43. By adding an ideal control signal to the isolation port of the output coupler, and scanning a large number of different phase values, the best phase corresponding to each frequency can be found.

Figure 44:
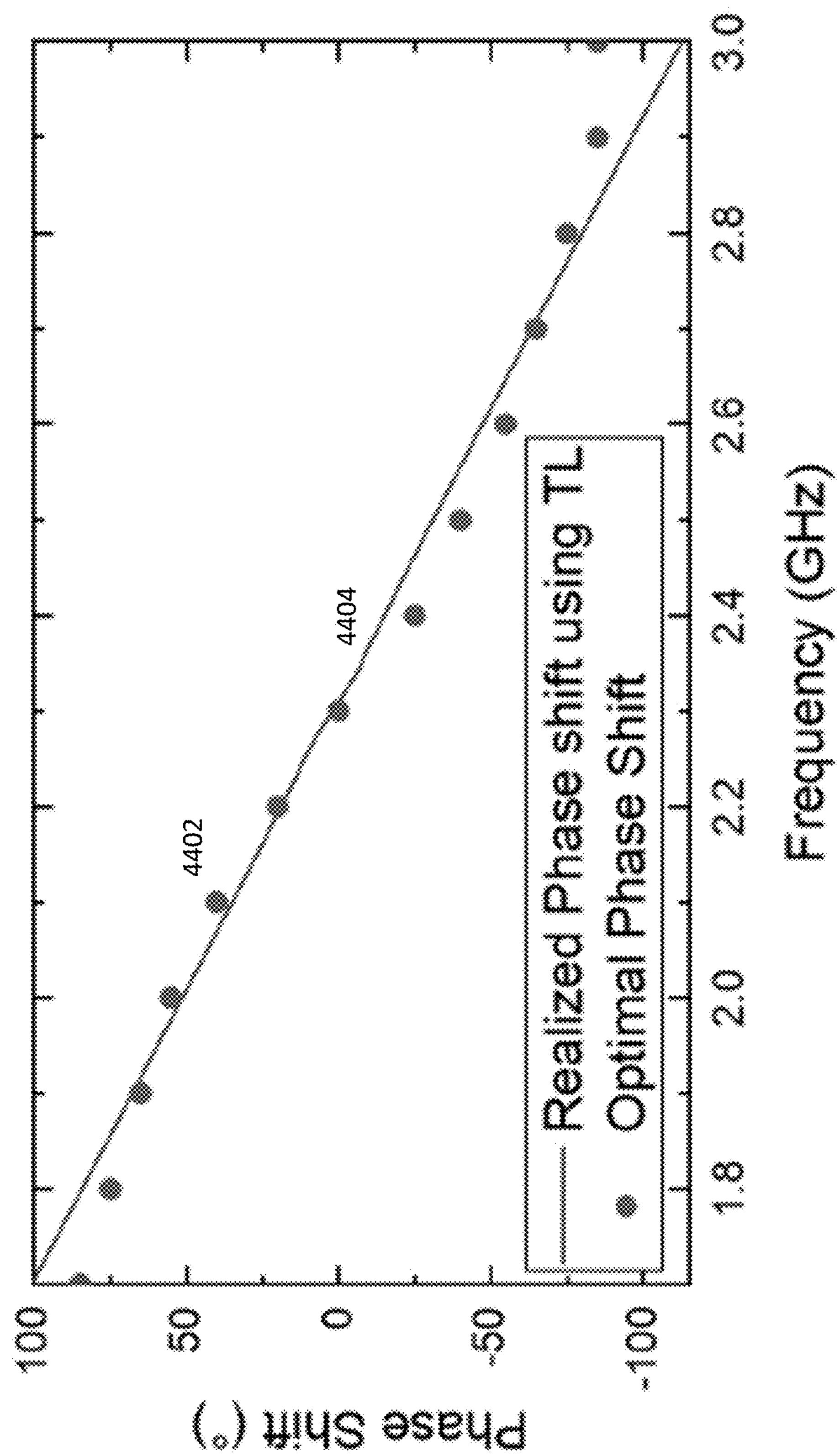
FIG. 44 illustrates simulated optimal BA1-CA phase offsets at different frequencies for an implementation described herein.

As shown in the plotted phase shift points 4402 and 4404 illustrated in FIG. 44, an optimal phase shift between BA and CA can be almost linearly proportional to the frequency with a negative slope. Therefore, an input-phase-adjustment network can be added at the input side of BA by using a 50-Ω TL to suit the frequency-dependent phase-offset requirement. The 'curve-fitting' results are plotted in FIG. 44. It can be seen that the realized TL phase shifter offers near-optimum phase setting at different frequencies. In some implementations of the present disclosure, if the frequency continues to increase, the phase difference between BA and CA can no longer completely comply to a linear relationship. This can be due to the limited bandwidth of output quadrature coupler (i.e., three-section branch-line quadrature hybrid) and the phase dispersion of transistor parasitics. To further perfect the phase control over a broadened bandwidth, more precise phase control can be achieved through digital-assisted dual-input in the future designs.

Figure 45A:
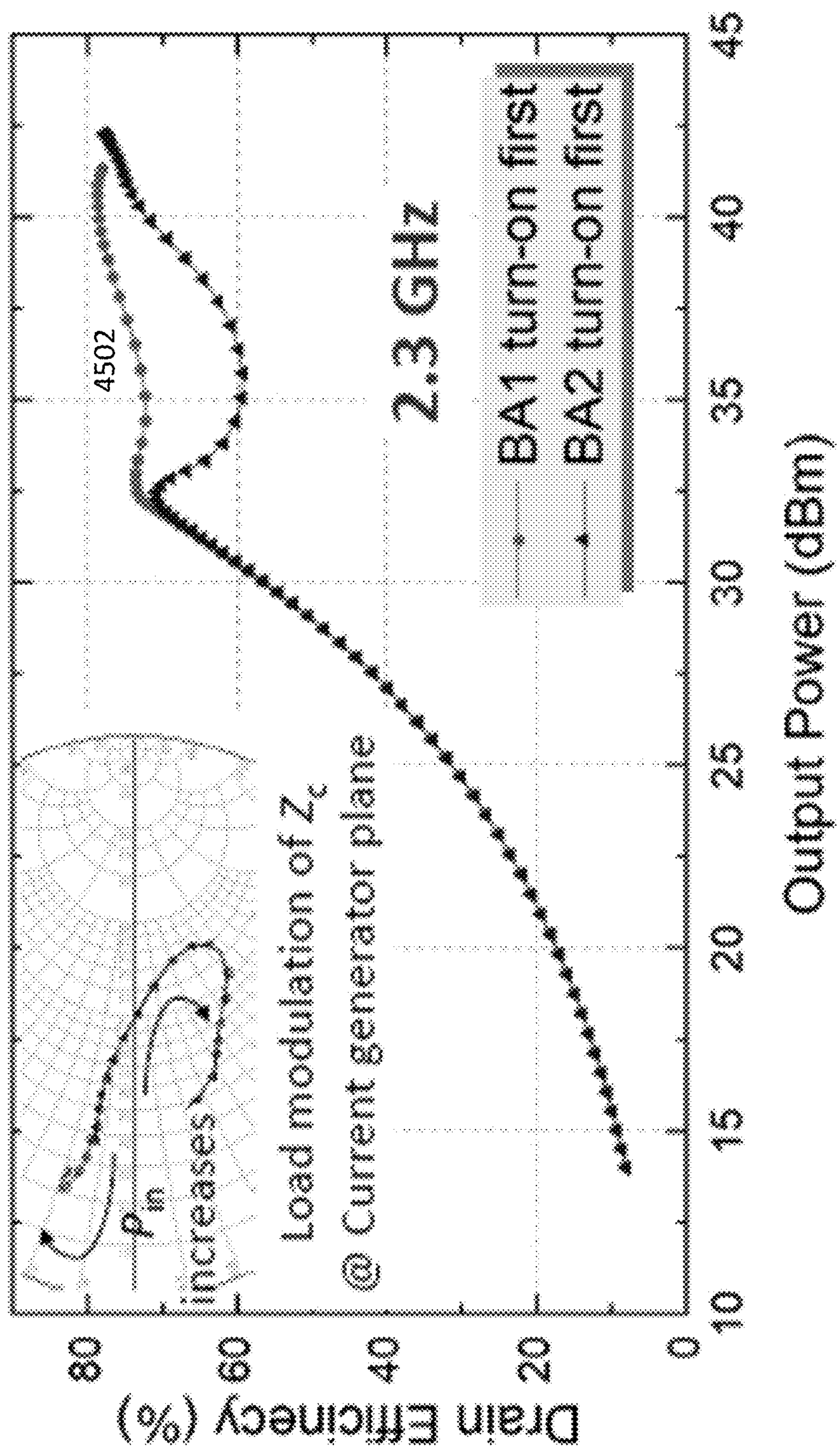
FIGS. 45A-45B illustrate a reciprocal turning-on sequence of BA1 and BA2 at different frequencies and the impact on CA load modulation and efficiency profile according to one implementation described herein, where
Figure 45B:
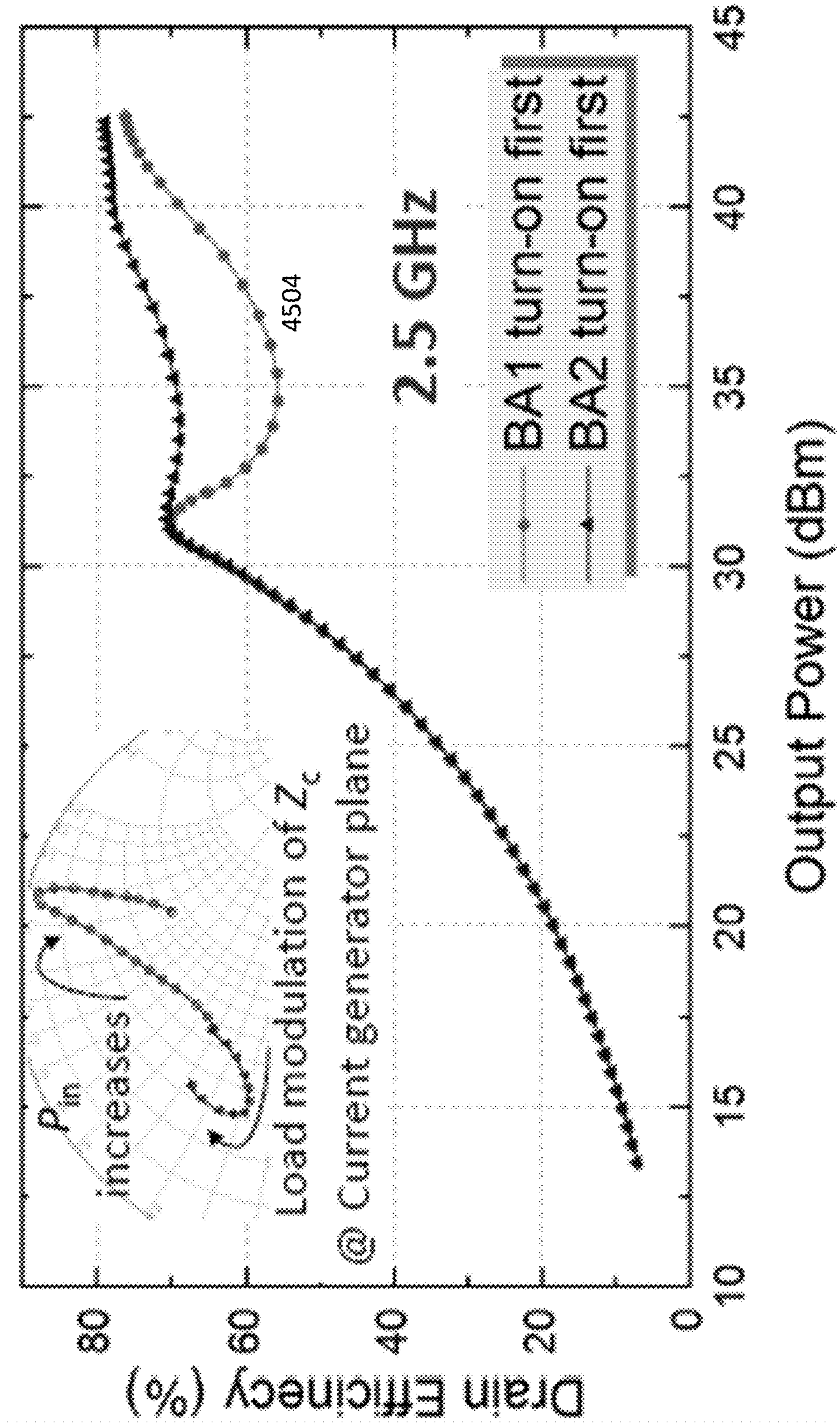

Under ideal conditions, in some implementations of the present disclosure the CA impedance in the plane of the coupler isolation port can be Zo for any in band frequencies. Then, when BA1 is turned on, the CA impedance can be modulated to the lower impedance region, so that the CA output power can continue to increase, thus boosting the back-off efficiency, as the dotted curve 4502 shown in FIG. 45A. However, due to the inevitable phase/amplitude imbalances of realistic broadband quadrature couplers, the load modulation of CA can be affected as well as BA1 and BA2. Therefore, at some frequencies, the ideal turning on sequence does not lead to the desired back-off efficiency enhancement, e.g. 2.5 GHz of this design as the dotted curve 4504 shown in FIG. 45B. In some implementations, the roles of BA1 and BA2 can be exchanged so that with BA2 turned on first, in order to compensate the imperfects of quadrature coupler. At 2.5 GHz, the reciprocal biasing can effectively re-establish a desired load modulation trajectory and overall efficiency profile, as shown in FIG. 45B. With a combination of nominal and reciprocal biasing modes, the three-way load-modulation can be optimized over a wide bandwidth without having to rely on any additional tuning elements. This can give implementations of the present disclosure an advantage over a three-way Doherty PA, which can be difficult for wideband design.

Figure 46:
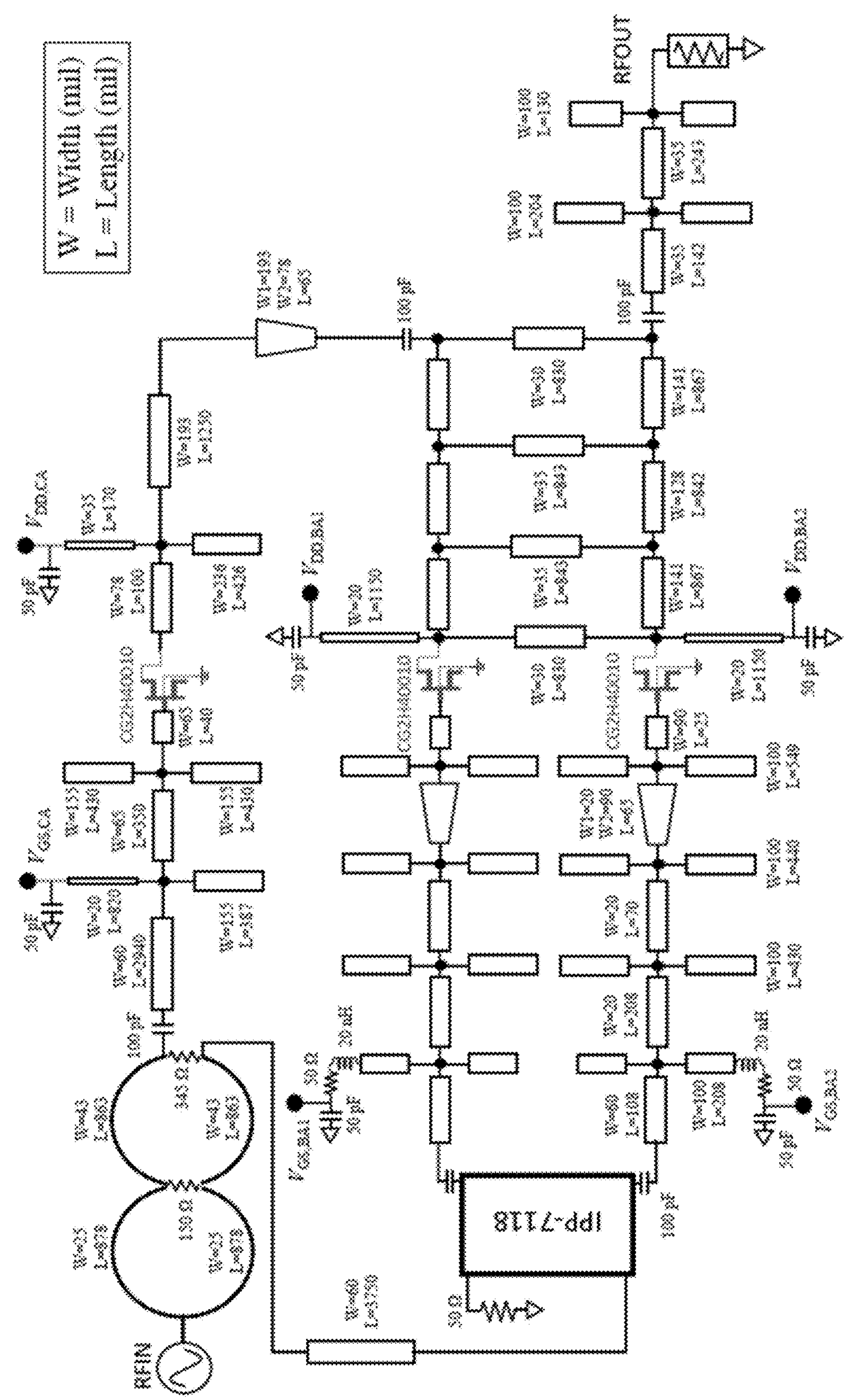
FIG. 46 illustrates a circuit schematic overview of a designed CM-H-ALMBA according to one implementation described herein.

The designed final circuit schematic is shown in FIG. 46, and the values of all actual circuit elements are displayed next to the symbols. Between exchangeable gate biasing of BA1 and BA2 that is frequency-dependent, the first turning-on threshold is set to a gate bias voltage of −4.5 V, and the second one is set to −5.5 V. There are fine adjustments for different frequencies to ensure a LBO of 10-dB and a HBO of 5-dB could be obtained, where the CA load modulation is performed concurrently.

Figure 47A:
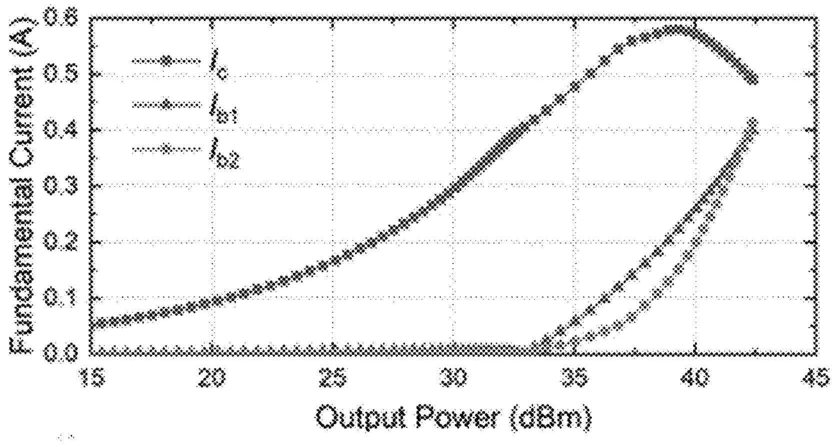
FIGS. 47A-47C illustrate simulation results of a H-ALMBA designed according to one implementation described herein, where
Figure 47B:
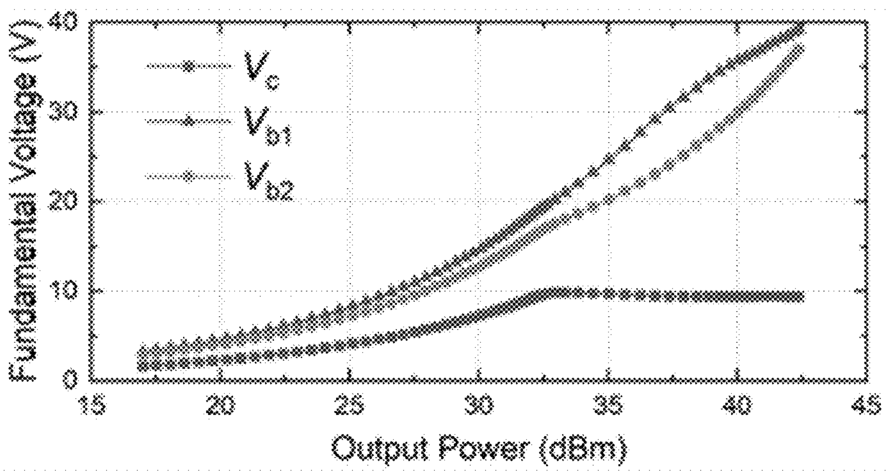
Figure 47C:
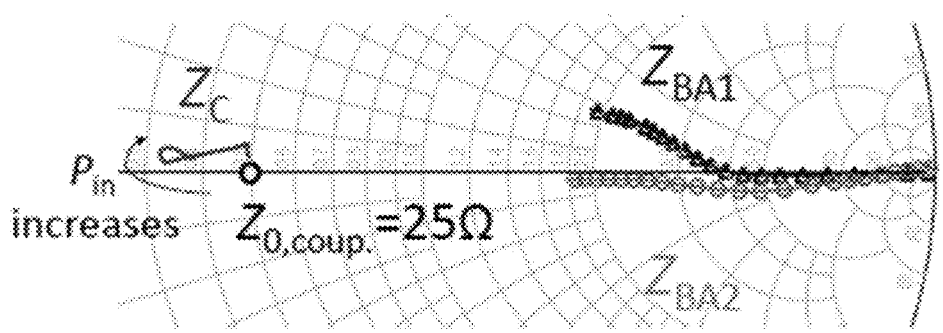
Figure 48A:
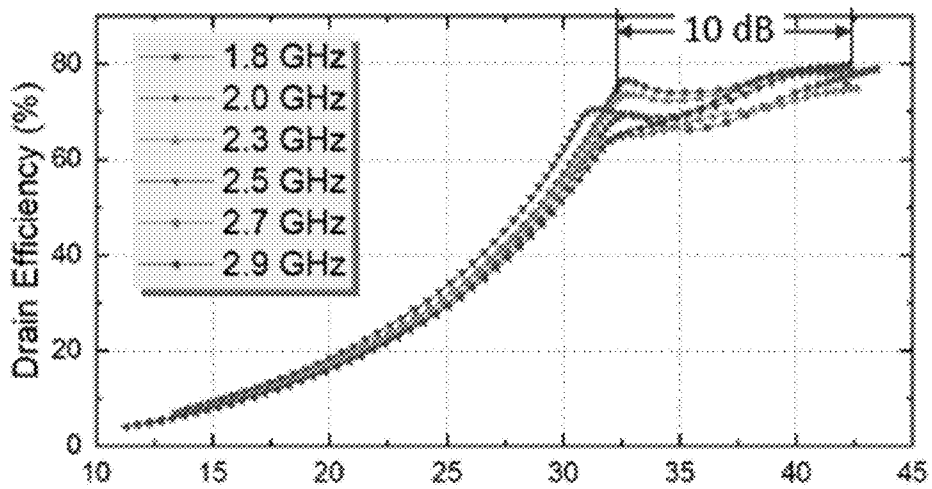
FIGS. 48A-48B illustrate power-swept CW simulation results of an implementation of the H-ALMBA described herein with a best BA-CA phase setting at different frequencies.
Figure 48B:
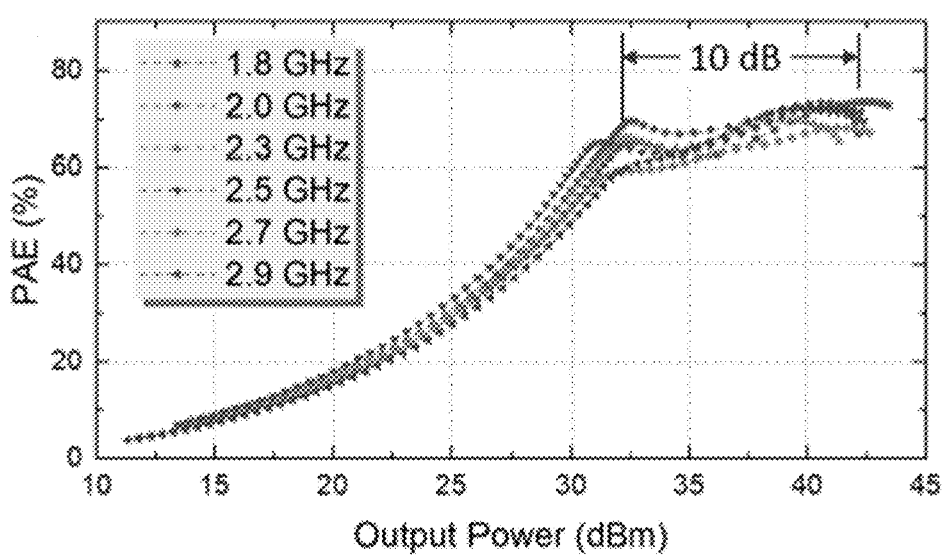

Through the design of the wideband BA1, BA2, CA, and phase shifter described in this example, the implementations described in example 4 have illustrated by the simulation results, which are plotted in FIGS. 47A-47C. FIG. 47A and FIG. 47B shows the simulated fundamental current and voltage at 2.2 GHz, respectively, and FIG. 47C depicts the load impedance trajectories of all three amplifiers at 2.2 GHz de-embedded to the intrinsic drain plane. The wideband drain efficiency and PAE of the designed H-ALMBA are simulated with swept input power, as shown in FIGS. 48A-48B. It is clearly seen that a high efficiency of >70% is maintained from peak down to 10-dB back-off nearly across the entire frequency range. This is mainly due to the continuous-mode design of CA that ensures a high first efficiency peak and the effectiveness of the proposed H-ALMBA architecture.

Example 6

Figure 49:
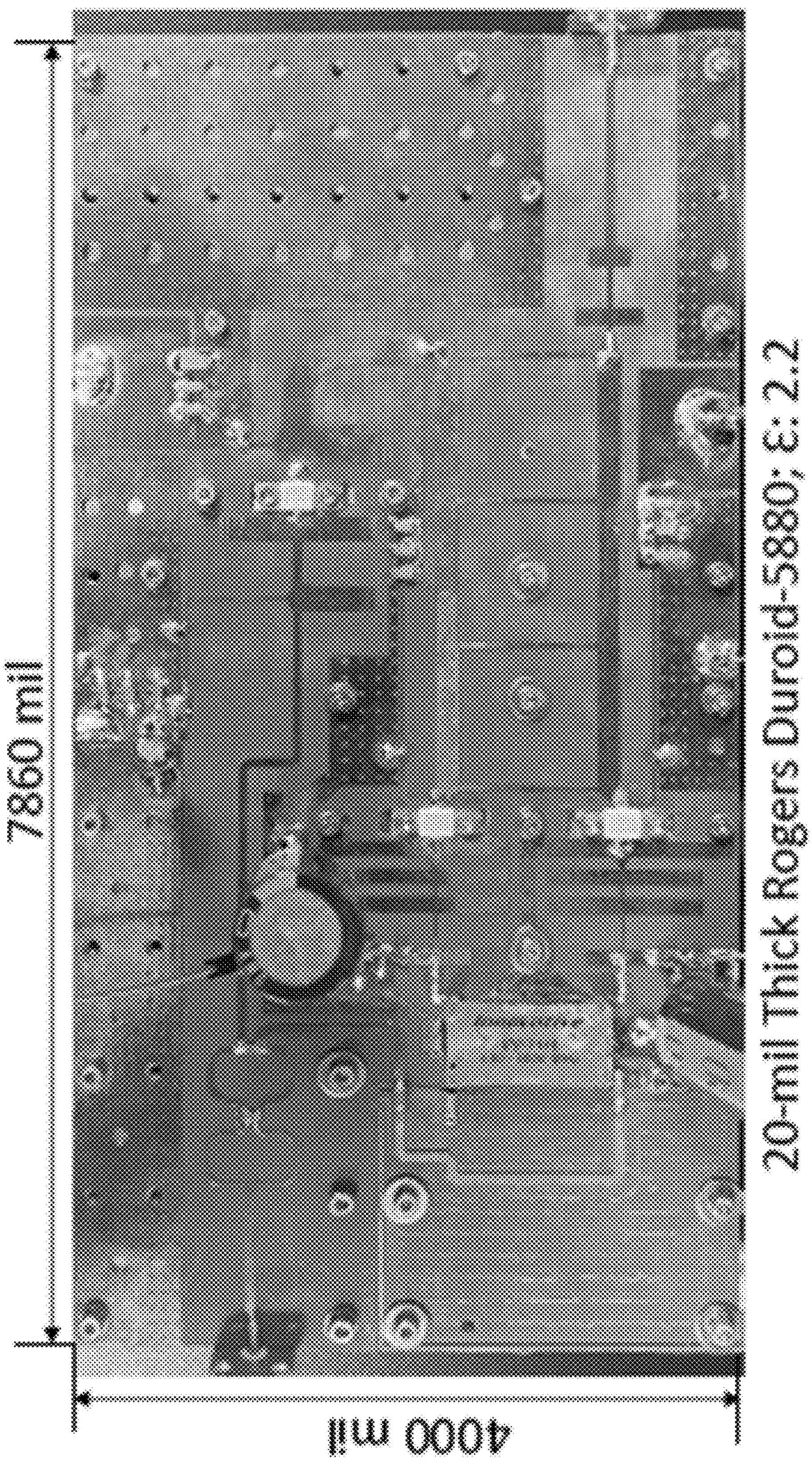
FIG. 49 illustrates a fabricated H-ALMBA prototype, according to one implementation described herein.

According to another example implementation of the present disclosure, the overall layout is generated from circuit schematic, and it is electromagnetically modeled using ADS Momentum simulator. The proposed H-ALMBA is implemented on a 20-mil Duroid-5880 PCB board with a dielectric constant of 2.2. A photograph of the fabricated H-ALMBA is shown in FIG. 49. The size of the entire circuit is 4 inch×7.86 inch. The fabricated H-ALMBA is measured using both continuous-wave (CW) and modulated LTE signals. In this implemented circuit according to an implementation disclosed herein, the BA1 and BA2 are biased in Class-C with same 28-V $V_{DD}$. Based on different frequency, CA is biased in Class-AB with a $V_{DD,CA}$ range from 10 V to 13 V, which can ensure CA saturation at 10-dB power back-off at all frequencies. The opening sequence of BA1 and BA2 is controlled by setting different $V_{GS}$ bias voltages. The first opened BA $V_{GS}$ is set at around −4.5 V, and the later opened BA $V_{GS}$ is set at about −5.5 V. The value of $V_{GS,BA1}$ and $V_{GS,BA2}$ can be adjusted to optimize the best PAE.

Figure 50:
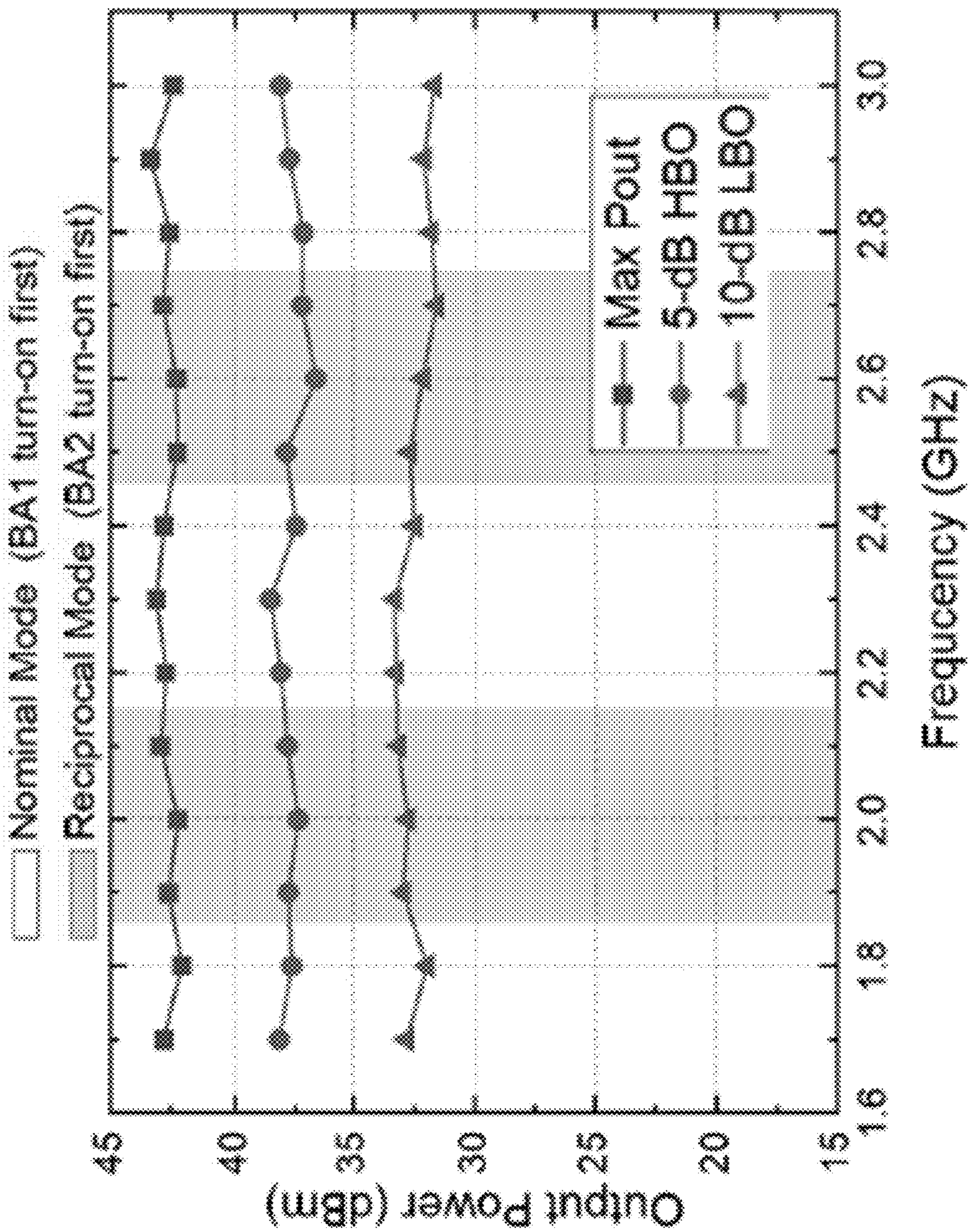
FIG. 50 illustrates the measured output power at various OBO levels from 1.7 to 3.0 GHz for one implementation described herein.
Figure 51A:
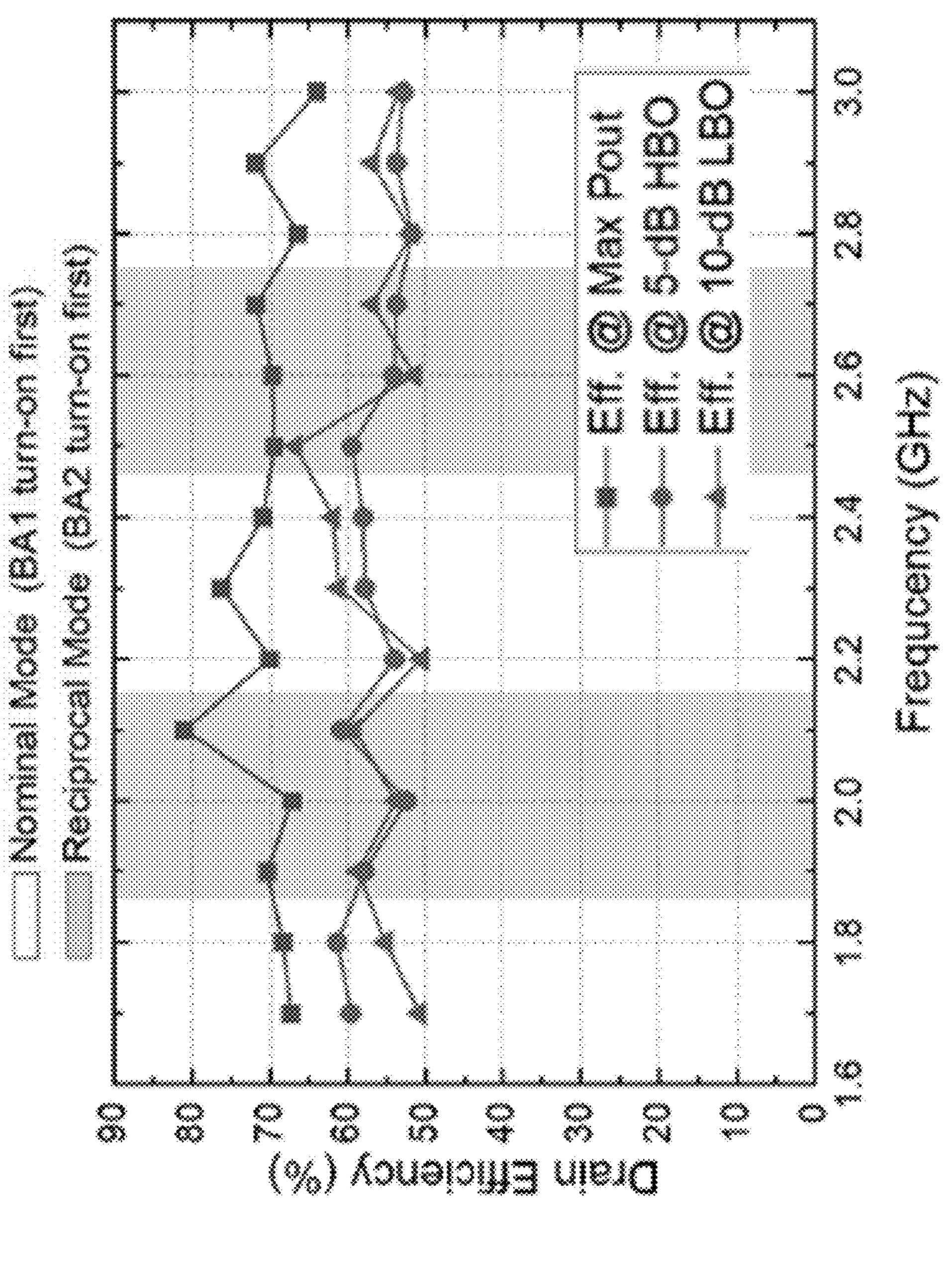
FIGS. 51A-51B illustrate performance at 1.7 to 3.0 GHz for implementations described herein, where
Figure 51B:
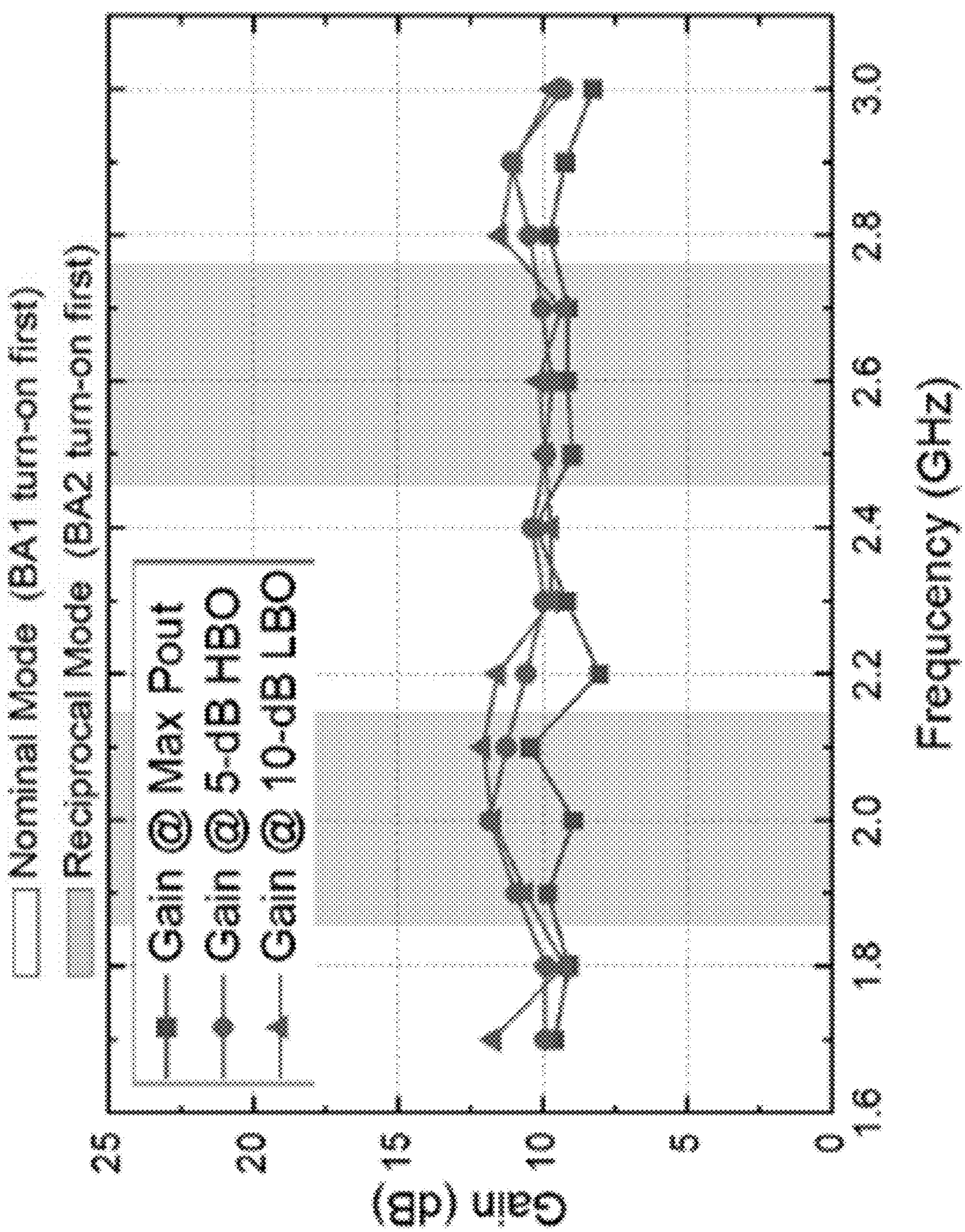
Figure 52A:
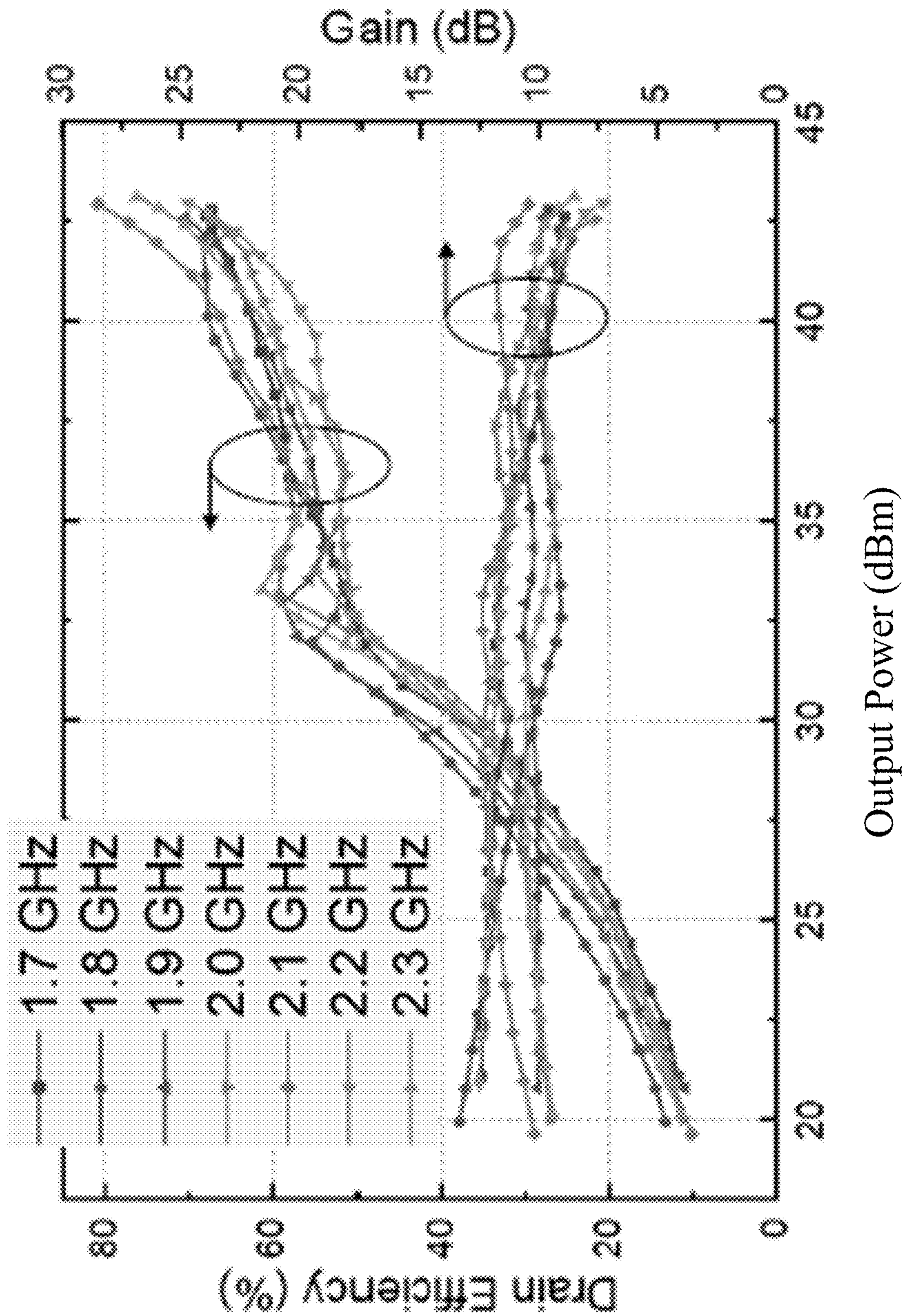
FIGS. 52A-52B illustrate measured DE and gain vs. output power from 1.7 to 3.0 GHz, where
Figure 52B:
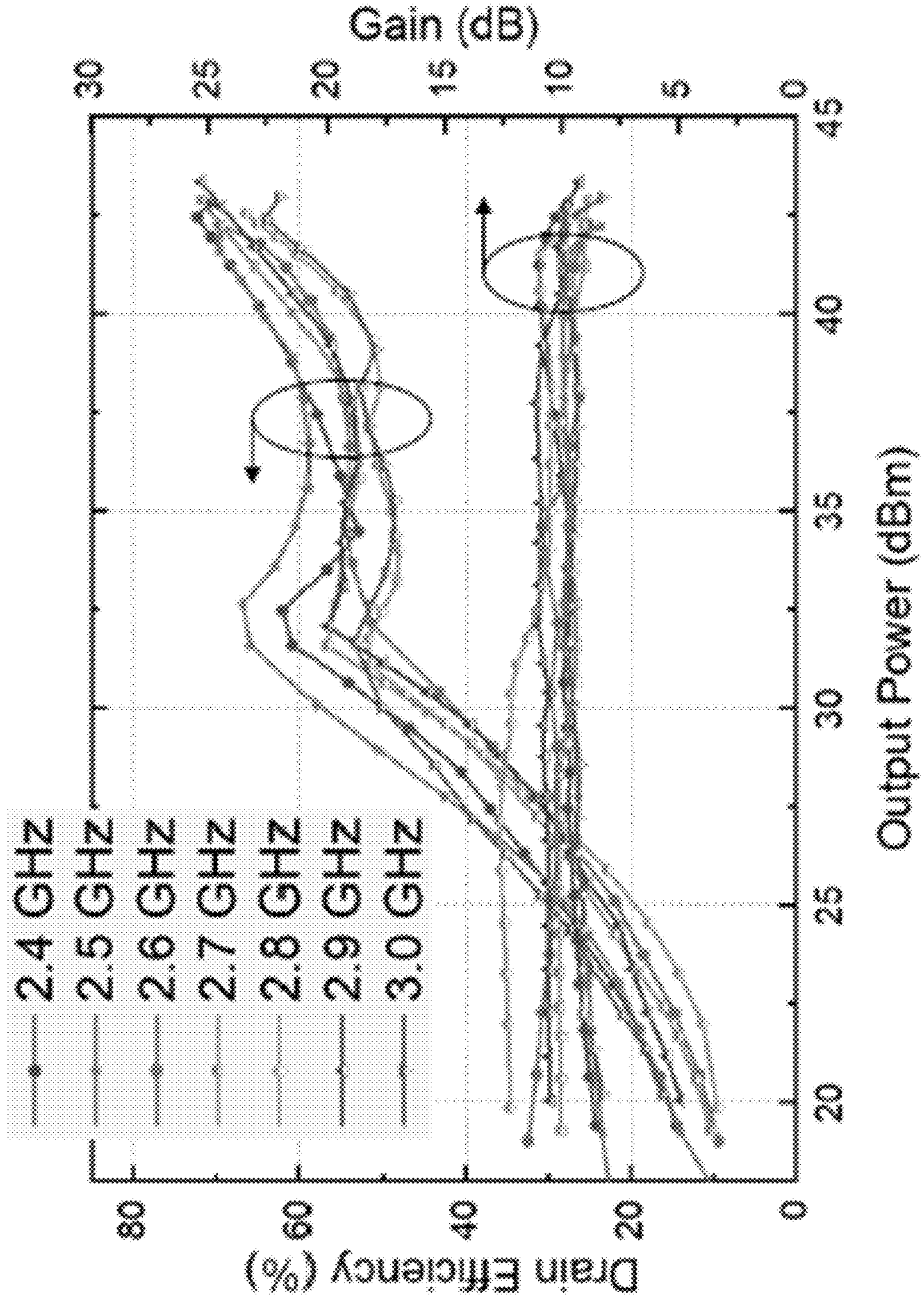

The continuous-wave measurement can be carried out with a CW power sweep inside the operating frequency band from 1.7 to 3.0 GHz. The CW signal can be generated by a vector signal generator, and then boosted by a broadband linear driver amplifier to a sufficiently high level for driving the device under test (DUT). The output power is measured using power sensor and spectrum analyzer. As shown in FIG. 50, 42-43 dBm peak output power is measured across the entire bandwidth. As shown in FIG. 51A, the maximum drain efficiencies at peak power are measured in the range of 63-81%, the drain efficiencies at 10-dB and 5-dB OBOs are in the range of 50-66% and 51-62%, respectively. It can be observed from FIG. 51B that the gain can be maintained around 8-13 dB at different OBO level. FIGS. 52A-52B shows the measured drain efficiency and gain performance versus the output power. Two difference bias modes, nominal mode and reverse mode, are used in CW measurement to ensure the optimal efficiency performance. As shown in FIGS. 50-51A, the white frequency interval is set to the nominal mode, where BA1 is turned-on first. And the shaded frequency interval is set to reverse mode, where BA2 is turned-on first.

Figure 53:
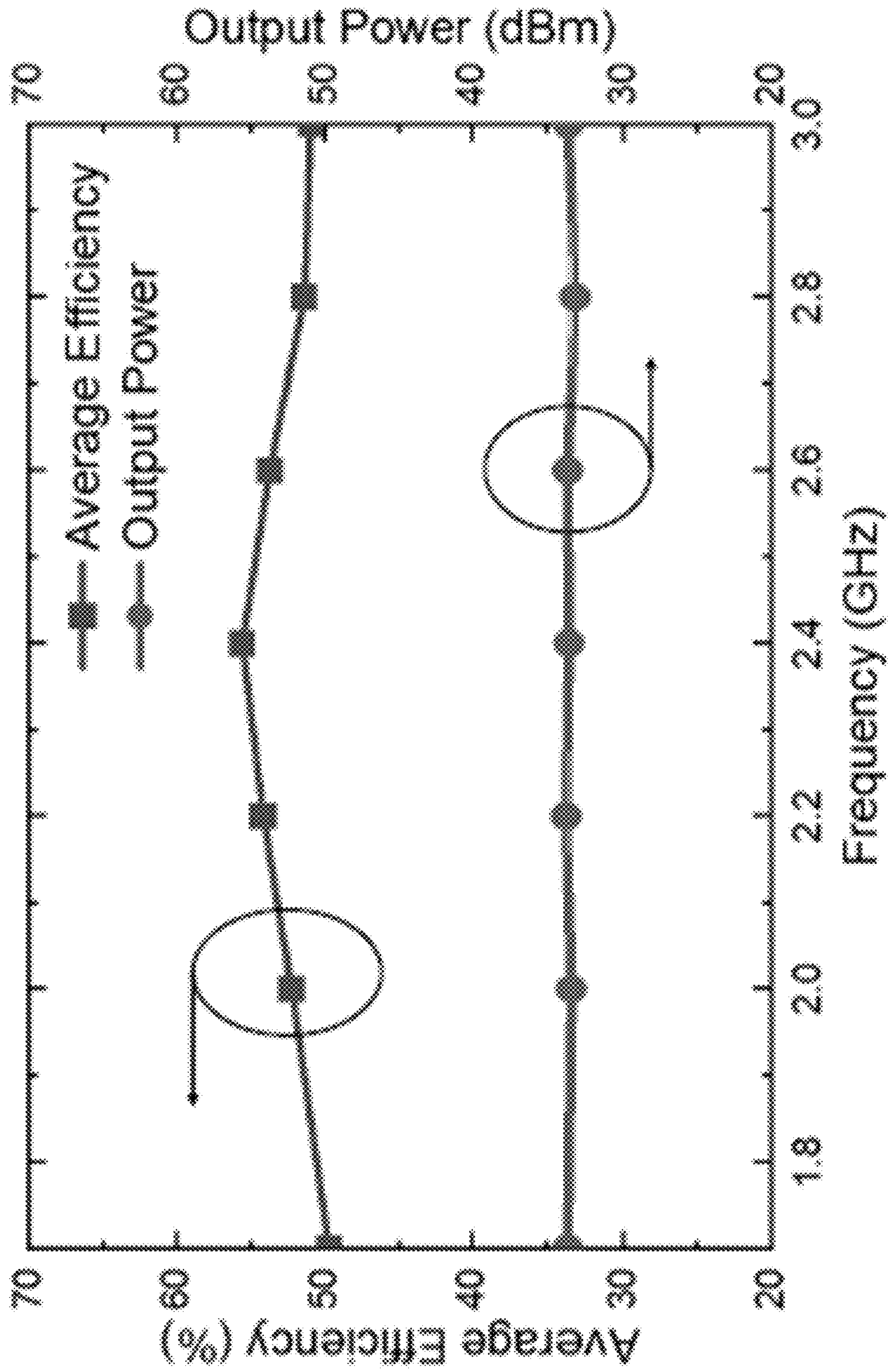
FIG. 53 illustrates measured average DE and output power with 9.5-dB-PAPR LTE signal at 1.7, 2.0, 2.2 2.4 2.6, 2.8 and 3.0 GHz according to one implementation described herein.
Figure 54:
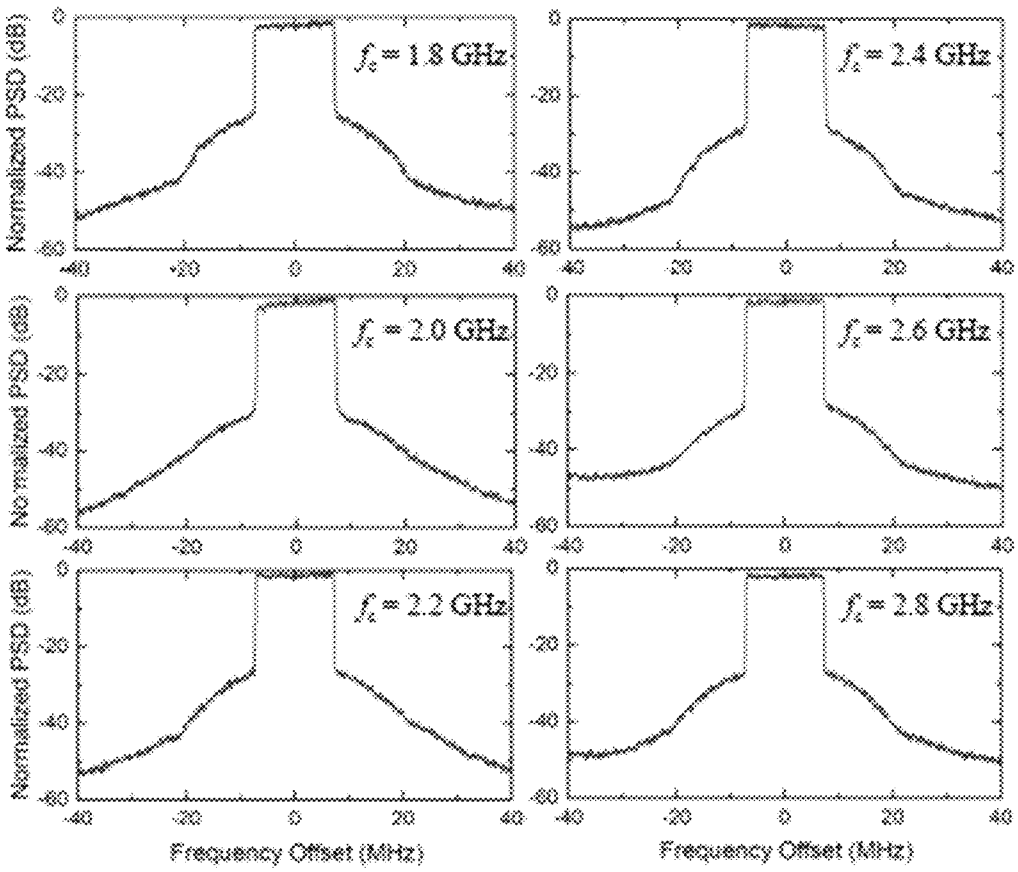
FIG. 54 illustrates output spectrum from modulated measurement using a 20-MHz 9.5-dB-PAPR LTE signal centered at 1.8, 2.0, 2.2, 2.4, 2.6 and 2.8 GHz according to implementations described herein.

To evaluate the linearity and efficiency performance of the proposed PA under modulated signal stimulation, 20-MHz LTE signals with 10-dB PAPR are used to test the proposed H-ALMBA at 1.7, 2.0, 2.2, 2.4, 2.6, 2.8 and 3.0 GHz. The modulated-signal is generated and analyzed by a Keysight PXIe vector transceiver (VXT M9421). The generated LTE signal is further boosted by a linear pre-amplifier (ZHL-5W-422+) to a sufficient level for driving the developed prototype. The measurement results at an average output power around 32 dBm are presented in FIG. 53. The H-ALMBA achieves a high average efficiency of 50%-56% over the target frequency band. The measured output power spectral density (PSD) are shown in FIG. 54. The performance of the prototype PA is summarized and compared with other published works in FIG. 55. This proposed H-ALMBA greatly enhances the entire back-off region efficiency down to 10-dB compared with the other LMBA architecture; while compared with the 3-way DPA, great advantage in ultra-bandwidth has been proved in the proposed H-ALMBA.

Implementations of the present disclosure include a high-order load modulation mode, as well as detailed design methods. Through rigorous analysis and derivation, the design space of the load-modulation PA based on the quadrature coupler can be further expanded with three-way modulation. In this new H-ALMBA mode, the asymmetry of the balanced amplifier is realized by setting different thresholds for BA1 and BA2, which leads to a hybrid load modulation combining a Doherty-like region (CA and BA1) and an ALMBA region (with all three amplifiers). A high-order load modulation can be formed like a three-way Doherty PA, resulting in an extended power back-off range and enhanced overall efficiency. Moreover, the H-ALMBA not only mitigates the CA over-driving issue in PD-LMBA but also can inherit its wideband nature through proper phase alignment. The proposed theory and design method are experimentally verified using a developed hardware prototype, which is able to efficiently amplify the signals with 10-dB PAPR within a fractional bandwidth of 55%. This design greatly expands the design space of original LMBA and can provide a solution for next generation multi-band and energy-efficient wireless transmitters.

Example 7

Developed from the reported pseudo-Doherty LMBA (PD-LMBA), implementations of an H-ALMBA are analyzed in this example. As described in FIG. 56, the H-ALMBA consists of a balanced amplifier and a control amplifier, the LM behaviors of BA1 118, BA2 120 and CA 106 can be expressed as:

$$Z_{b1} = Z_0\left(\frac{I_{b2}}{I_{b1}} + \frac{\sqrt{2}\,I_c e^{j\theta}}{I_{b1}}\right),$$
$$Z_{b2} = Z_0\left(2 - \frac{I_{b1}}{I_{b2}} + \frac{\sqrt{2}\,I_c e^{j\theta}}{I_{b2}}\right),$$
$$Z_c = Z_0\left(1 - \sqrt{2}\,\frac{I_{b1} - I_{b2}}{I_c e^{j\theta}}\right), \qquad (45)$$

where $I_{b1}$, $I_{b2}$, and $I_c$ are the magnitude of BA1, BA2, and CA currents, respectively, and $\vartheta$ is the phase of the control path. It can be seen from (22) that by offsetting the symmetry of $I_{b1}$ and $I_{b2}$, the LM of three individual amplifiers can be controlled concurrently. Further, if BA1 118 and BA2 120 are turned on sequentially at different power levels, a hybrid LM mode can be achieved.

Figure 56:
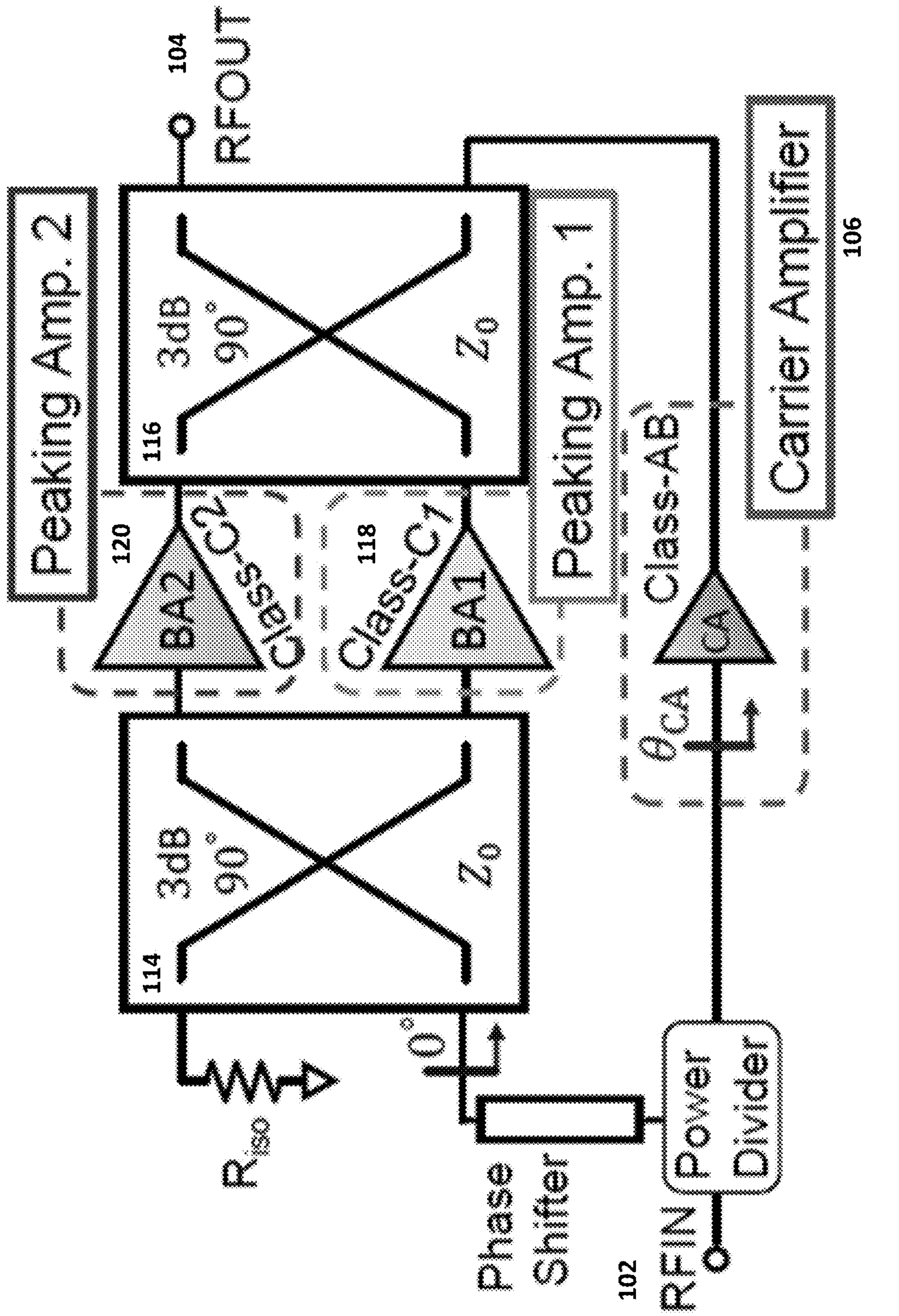
FIG. 56 illustrates a general schematic of a RF-input hybrid asymmetrical LMBA according to an implementation described herein.

As depicted in FIG. 56, the CA 106 can be set as the carrier amplifier, while BA1 118 and BA2 120 can be biased as peaking amplifiers with different thresholds. As the input power increases, the operation of some implementations of an H-ALMBA can be divided into the following three regions:

Low-Power Region ($P_{OUT}<P_{Max}/LBO$): In this region, the BA is turned off, i.e., $I_{b1,2}=0$. The impedances of BA1 118 and BA2 120 are thus equal to ∞, and the output power can be completely generated by the CA 106, so that the overall H-ALMBA efficiency is equal to the CA efficiency. The load impedance of CA is constantly equal to Zo within this region. When the output power reaches the target low-back-off (LBO) level, CA can be designed to reach saturation for maximum back-off efficiency.

Doherty Region ($P_{Max}/LBO \le P_{OUT} \le P_{Max}/HBO$): With output power higher than LBO level, the BA1 118 is turned on and $I_{b1}$ starts to increase, while BA2 120 remains off.

Figure 57:
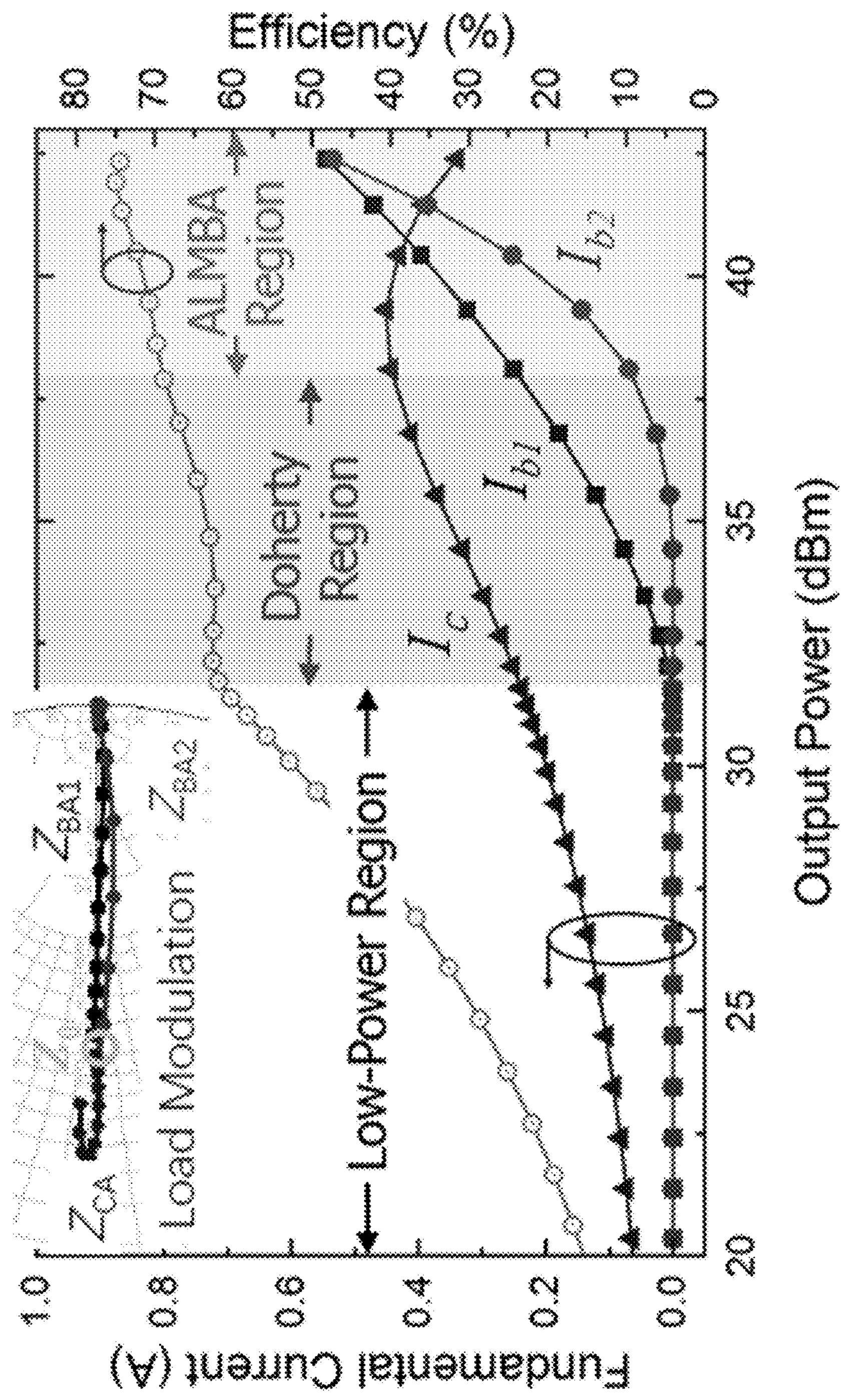
FIG. 57 illustrates simulated fundamental currents vs. output power of BA1, BA2 and CA, where the drain efficiency changes at three power regions and load-modulation trajectories, as shown in the Smith chart, according to an implementation described herein.

According to (22), the CA 106 is load modulated with the increase of $I_{bi}$ similar to the carrier amplifier of DPA, and $I_c$ continues to increase, shown in FIG. 57. Until the power reaches high-back-off (HBO) level, CA 106 and BA1 118 can be seen as a two-way Doherty-like amplifier.

ALMBA Region ($P_{Max}$/HBO≤$P_{OUT}$≤$P_{Max}$): As the power further increases, BA2 120 is turned on. $I_{b2}$ starts to increase sharply, while $I_{b1}$ continues to grow. It is noted that $Ib_2$ raises at a larger slope than $I_{b1}$ until they both reach the same maximum at $P_{Max}$. In this region, as shown in FIG. 57, the CA LM moves backward with slightly degraded $I_{CA}$ due to the steeper increase of $I_{b2}$. This effect does not affect the overall power and efficiency, as the power generation is dominated by BA is region.

To achieve maximized efficiency at power back-off, CA needs to be saturated at target HBO which can be achieved properly setting $V_{DD,CA}$ and $R_{OPT,CA}$. At the same time, BA1 and need to be turned on at the target LBO and HBO, respectively, which can be achieved by setting the power dividing ratio between BA and CA and properly choosing threshold voltages of BA1 and BA2. It can be calculated from (22) that the LM trajectories of CA, BA1, and BA2 are primarily determined by the phase of the CA ($\vartheta_{ca}$). Ideally, in some implementations of the present disclosure, this phase offset can be to be 0° in order to route the desired LM trajectories on real axis. In realistic design, the phase control can be conducted by properly setting the length of delay lines at the input of BA and CA.

Figure 58:
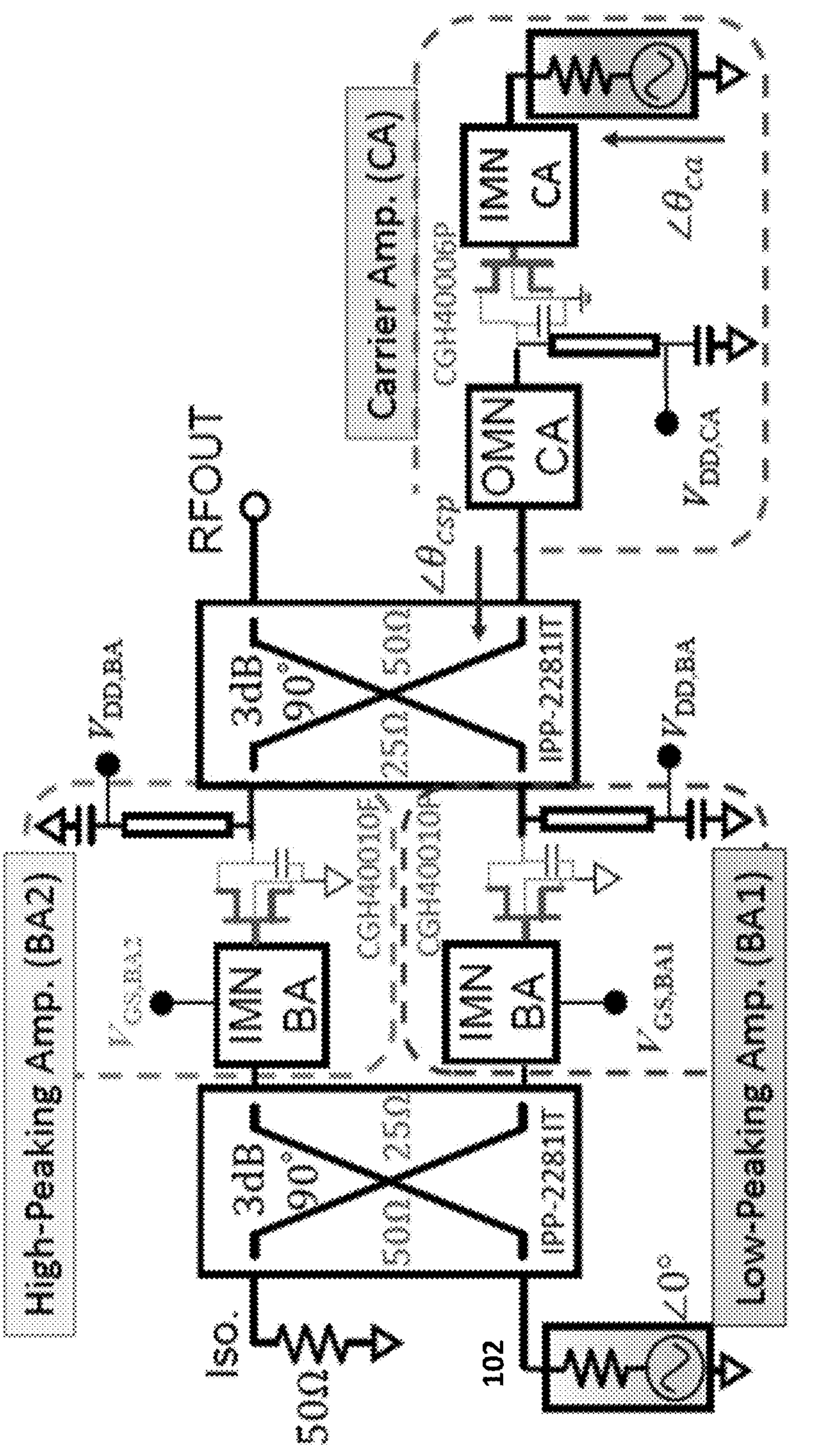
FIG. 58 illustrates a realistic design of an H-ALMBA using wideband impedance-transformer coupler and GaN transistors, according to on implementation described herein.

Following the proposed H-ALMBA theory and the ideal schematic in FIG. 56, the physical circuits of the CA and BA are built using 6-W GaN device (a non-limiting example of which is the CGH40006P sold under the trademark Wolfspeed) and 10-W GaN devices (a non-limiting example of which is the CGH40010F sold under the trademark Wolfspeed), respectively. The CGH40006P and CGH40010F, are intended only as non-limiting examples of suitable devices, and the use of other devices is contemplated by the present disclosure. The realized circuit schematic is shown in FIG. 58. The target LBO and HBO levels are set to 10 dB and 5 dB, respectively, and the frequency range is targeted from 0:55 to 2:2 GHz.

In some implementations, two impedance transformers (e.g. 2:1) couplers (e.g. IPP-22811T) can be used to combine BA1 and BA2 in quadrature phase. Again, the IPP-22811T is intended only as a non-limiting example. The output impedance matching of BA1 and BA2 can be realized using the impedance transformer coupler and the bias lines, leading to reduce the broadband phase dispersion that normally occurs in complex matching network and eased phase equalization of BA and CA. The broadband impedance design of CA can take into account both the stand-alone efficiency at low-power region and the phase equalization with BA and BA2 in the LM regions. Therefore, the output matching of CA finally adopts the multi-segment transmission-line matching method, which can lead to linear phase-frequency dependence and eases the phase control as compared to the low-pass network. The transformer ratios and couplers described herein are intended only as non-limiting examples.

Figure 59:
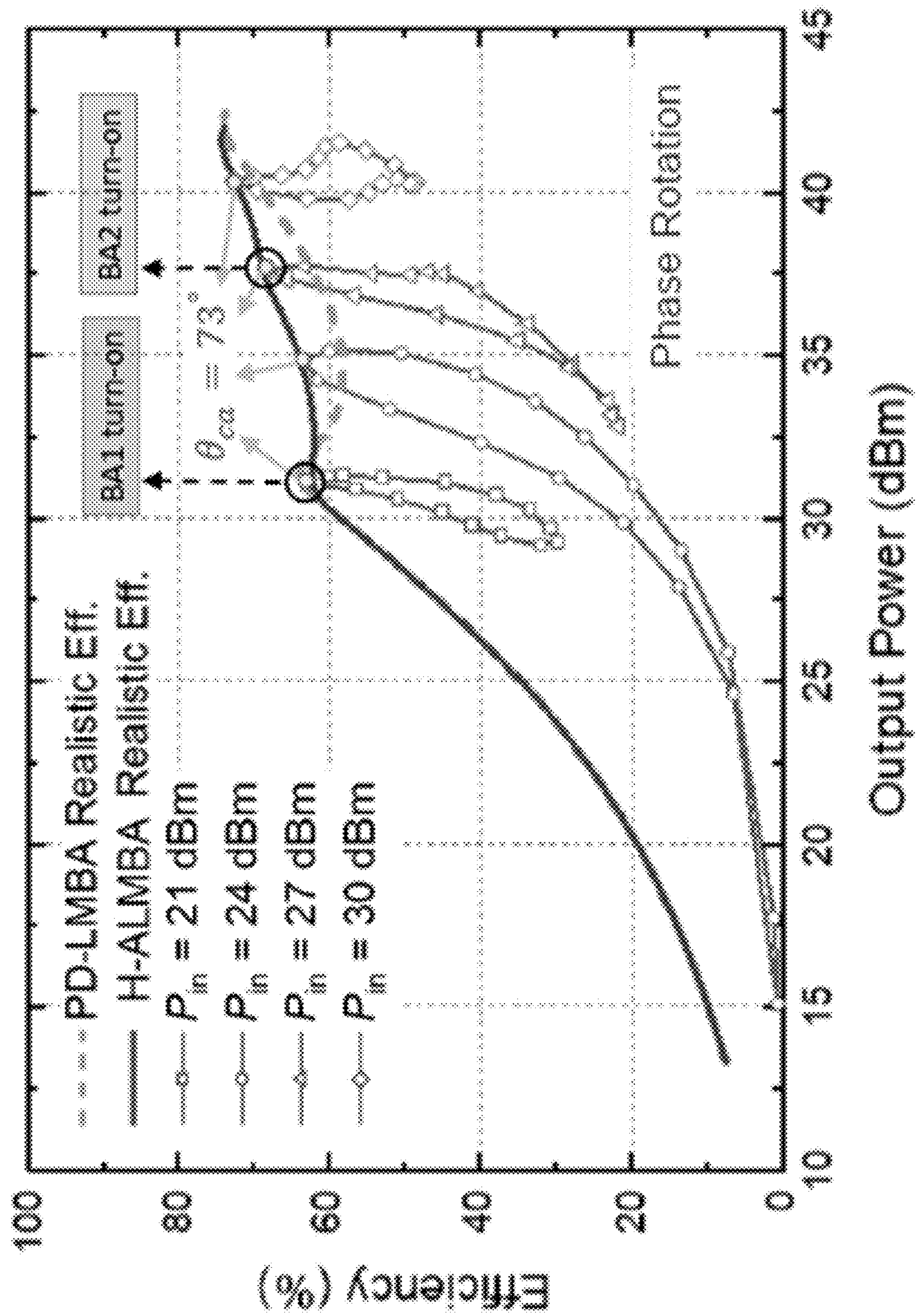
FIG. 59 illustrates phase and amplitude control of an H-ALMBA 1.0 GHz according to one implementation described herein.

In some implementations described herein, the phase shifter design of H-ALMBA can be same as the symmetrical LMBA. FIG. 59 shows a simulated efficiency profile of the realistic H-ALMBA at 1 GHz, in which an optimal control phase of CA can be determined by sweeping the input phase. Repeating this process at different frequencies illustrates that the optimal phase offset can be linearly proportional to frequency, and thus, a transmission line can be placed at CA input to provide the wideband phase control. For ideal H-ALMBA operation, BA1 turns on earlier than BA2, which is valid only for ideal quadrature coupler. To overcome the frequency-dependent imperfections of realistic coupler, the turning-on sequence of BA1 and BA2 can be interchanged at different frequencies, leading to a wideband H-ALMBA.

Figure 60:
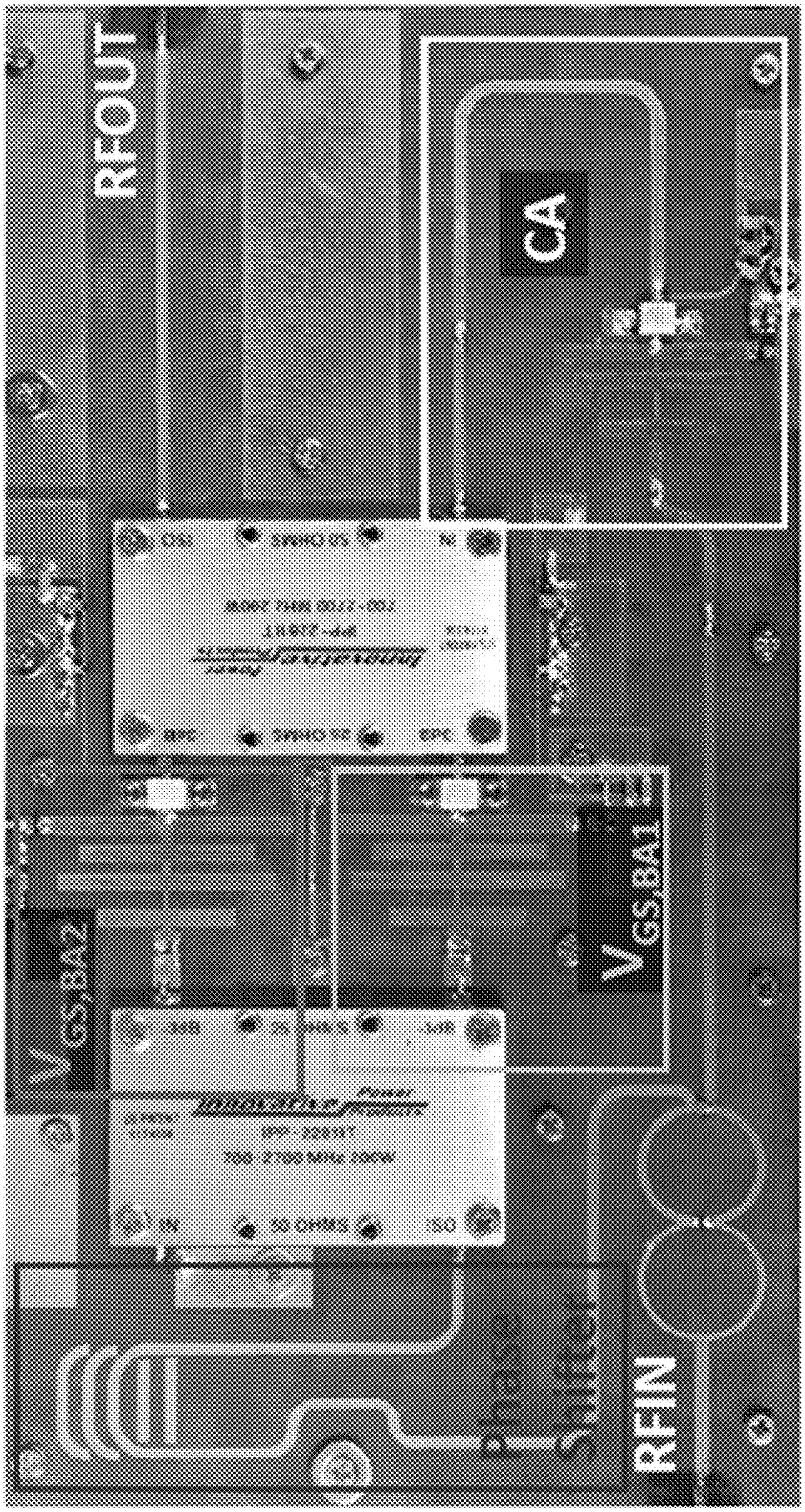
FIG. 60 illustrates a fabricated H-ALMBA prototype, according to one implementation described herein.

A prototype implementation of the present disclosure was developed and fabricated on Rogers 5880 substrate, as shown in FIG. 60. The BA is implemented using two CGH40010 devices sold under the trademark Wolfspeed and biased in Class-C mode with a $V_{DD}$ of 28 V, and the output matching is provided by the transformer (50/25-Ω) coupler. The CA is implemented using CGH40006, and it is biased in Class-AB with a $V_{DD,CA}$ of 11 V, which ensures its saturation at 10-dB power back-off.

Figure 61:
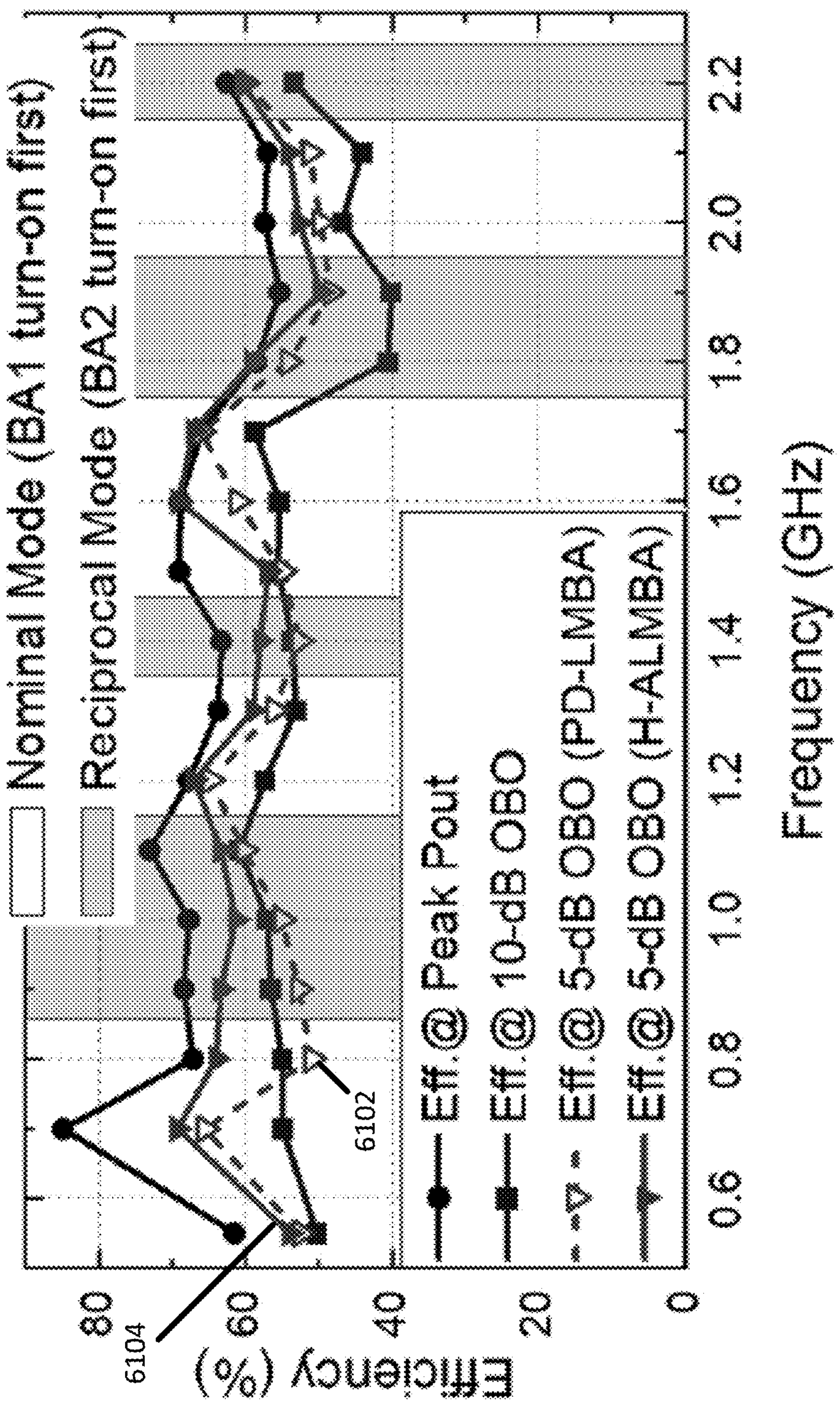
FIG. 61 illustrates measured efficiency of various OBO levels from 0.55 to 2.2 GHz according to on implementation described herein.

The prototype can measured with a continuous-wave (CW) stimulus signal. As shown in FIG. 61, a dual-octave bandwidth of load modulation can be achieved from 0.55 to 2.2 GHz. An efficiency of 55-82% is measured at peak power, 51 69% at 5-dB OBO, 40-61% at 10-dB OBO. Compared to the symmetrical PD-LMBA (dashed line 6102), the efficiency within the target OBO is significantly enhanced (solid line 6104). The measured performance can compare favorably with other designs, as illustrated in FIG. 62.

Implementations of the present disclosure include an active-LM PA architecture, the hybrid asymmetrical LMBA. By properly setting different turning-on thresholds of BA1 and BA2 together with desired phase and amplitude controls from CA, a hybrid LM behavior can be achieved close to a three-way Doherty PA. Implementations of the present disclosure can include cooperation of CA and BA, and implementations of the H-ALMBA can offer enhanced efficiency across extended dynamic power range but implementations of the present disclosure can also fully inherit the wideband feature from the conventional symmetrical LMBA. Implementations of the present disclosure include a wideband H-ALMBA prototype as designed and implemented. Measurement results from implementations of the present disclosure show that the developed H-ALMBA can exhibit highly efficient performance over a 4:1 bandwidth. Across this frequency span, specifically, implementations of the present disclosure can deliver >60% of efficiency at peak power while achieving >40% efficiency at all back-off levels down to 10-dB 0130. The H-ALMBA significantly expands the design space of quadrature-coupler-based LM platform, and can be applied in multi-band wireless communication systems.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. An asymmetrical load-modulated balanced amplifier, comprising:

a radio frequency (RF) input port;

a RF output port;

a peaking amplifier circuit operably coupled between the RF input and RF output ports, wherein the peaking amplifier circuit is a balanced amplifier that comprises a pair of asymmetrical power amplifiers, wherein each of the pair of asymmetrical power amplifiers of the peaking amplifier circuit has a different bias voltage, and wherein an asymmetry of the different bias voltages is swapped in dependence on a frequency of a signal received at the RF input port; and a carrier amplifier circuit operably coupled to the RF input port.

2. The asymmetrical load-modulated balanced amplifier of claim 1, wherein the pair of asymmetrical power amplifiers have asymmetric current and/or power scaling characteristics.

3. The asymmetrical load-modulated balanced amplifier of claim 1, wherein each of the pair of asymmetrical power amplifiers of the peaking amplifier circuit has a different physical size.

4. The asymmetrical load-modulated balanced amplifier of claim 1, wherein the carrier amplifier circuit is configured to provide gain at any power level of an input RF signal.

5. The asymmetrical load-modulated balanced amplifier of claim 1, wherein the peaking amplifier circuit is configured to provide gain only at power levels beyond a predetermined level of an input RF signal.

6. The asymmetrical load-modulated balanced amplifier of claim 1, wherein the asymmetrical load-modulated balanced amplifier is configured for load modulation from peak power to a predefined output power back-off.

7. The asymmetrical load-modulated balanced amplifier of claim 1, wherein the pair of asymmetrical power amplifiers of the peaking amplifier circuit are coupled through first and second quadrature couplers.

8. The asymmetrical load-modulated balanced amplifier of claim 7, wherein each of the first and second quadrature couplers is a branch-line coupler, a coupled-line coupler, a Lange coupler, a transformer-based coupler, or a lumped coupler comprising inductors and capacitors.

9. The asymmetrical load-modulated balanced amplifier of claim 1, further comprising a phase shifter, wherein the peaking amplifier circuit is operably coupled to the RF input through the phase shifter.

10. The asymmetrical load-modulated balanced amplifier of claim 9, wherein the phase shifter is a fixed or tunable phase shifter.

11. The asymmetrical load-modulated balanced amplifier of claim 10, the phase shifter comprises at least one of a transmission line, a bandpass filter, a low-pass filter, a high-pass filter, or a network comprising inductors, capacitors, and/or resistors.

12. The asymmetrical load-modulated balanced amplifier of claim 9, wherein the phase shifter is a transmission line that is configured to provide an optimal frequency-dependent phase offset between the carrier and peaking amplifier circuits over an operational frequency range.

13. The asymmetrical load-modulated balanced amplifier of claim 12, wherein a relative phase difference between the carrier and peaking amplifier circuits is offset by a given length of the transmission line.

14. The asymmetrical load-modulated balanced amplifier of claim 1, further comprising a power divider, wherein the power divider is configured to split an input RF signal between the carrier and peaking amplifier circuits.

15. An asymmetrical load-modulated balanced amplifier system, comprising:

the asymmetrical load-modulated balanced amplifier of claim 1; and a controller, wherein the controller is configured to apply a first biasing scheme to the pair of asymmetrical power amplifiers for a first frequency range of a signal received at the RF input port, and apply a second biasing scheme to the pair of asymmetrical power amplifiers for a second frequency range of the signal received at the RF input port.

16. The asymmetrical load-modulated balanced amplifier system of claim 15, wherein the first and second biasing schemes swap an asymmetry of respective drain or collector bias voltages of the pair of asymmetrical power amplifiers, or wherein the first and second biasing schemes swap an asymmetry of respective gate or base bias voltages of the pair of asymmetrical power amplifiers.

17. The asymmetrical load-modulated balanced amplifier of claim 1, wherein the different bias voltage is a voltage at a gate of a transistor.

18. The asymmetrical load-modulated balanced amplifier of claim 1, wherein the different bias voltage is a voltage of at a base of a transistor.

19. An asymmetrical load-modulated balanced amplifier, comprising:

a radio frequency (RF) input port;

a RF output port;

a peaking amplifier circuit operably coupled between the RF input and RF output ports, wherein the peaking amplifier circuit is a balanced amplifier that comprises a pair of asymmetrical power amplifiers, wherein each of the pair of asymmetrical power amplifiers of the peaking amplifier circuit has a different supply voltage, and wherein an asymmetry of the different supply voltages is swapped in dependence on a frequency of a signal received at the RF input port; and a carrier amplifier circuit operably coupled to the RF input port.

20. The asymmetrical load-modulated balanced amplifier of claim 19, wherein the different supply voltage is a voltage of a drain of a transistor or a voltage at a collector of a transistor.

* * * * *